United States Patent
Lee

(10) Patent No.: US 9,722,185 B2
(45) Date of Patent: Aug. 1, 2017

(54) HETEROCYCLIC COMPOUND AND ORGANIC LIGHT-EMITTING DEVICE INCLUDING THE SAME

(71) Applicant: SAMSUNG DISPLAY CO., LTD., Yongin, Gyeonggi-Do (KR)

(72) Inventor: Jung-Sub Lee, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 556 days.

(21) Appl. No.: 14/221,940

(22) Filed: Mar. 21, 2014

(65) Prior Publication Data
US 2015/0041770 A1 Feb. 12, 2015

(30) Foreign Application Priority Data
Aug. 12, 2013 (KR) .......... 10-2013-0095605

(51) Int. Cl.
*H01L 51/54* (2006.01)
*H01L 51/00* (2006.01)
*H01L 51/50* (2006.01)

(52) U.S. Cl.
CPC ...... *H01L 51/0067* (2013.01); *H01L 51/0072* (2013.01); *H01L 51/0073* (2013.01); *H01L 51/0074* (2013.01); *H01L 51/0094* (2013.01); *H01L 51/006* (2013.01); *H01L 51/0051* (2013.01); *H01L 51/0085* (2013.01); *H01L 51/5016* (2013.01)

(58) Field of Classification Search
CPC .. C07D 209/82; C07D 491/00; C07D 493/00; C09K 11/06; C09K 2211/10; C09K 2211/1018; C09K 2211/1022; C09K 2211/1029; C09K 2211/1088; C09K 2211/1092; H01L 51/0032; H01L 51/005; H01L 51/0051; H01L 51/006; H01L 51/0062; H01L 51/0067; H01L 51/0068; H01L 51/0071; H01L 51/0072; H01L 51/0073; H01L 51/0074; H01L 51/0085; H01L 51/0094; H01L 51/50; H01L 51/5012; H01L 51/5016

USPC ....... 428/690, 691, 917, 411.4, 336; 427/58, 427/66; 313/500–512; 257/40, 88–104, 257/E51.001–E51.052; 252/301.16–301.35; 544/331, 229, 216; 548/418; 546/281.1
See application file for complete search history.

(56) References Cited

FOREIGN PATENT DOCUMENTS

| KR | 10-2010-0108924 A | 10/2010 |
|---|---|---|
| KR | 10-2012-0034140 A | 4/2012 |
| KR | 10-2012-0042633 A | 5/2012 |
| KR | 2012-0044517 A | 5/2012 |
| KR | 20140034711 A * | 3/2014 |
| WO | WO-2010-114264 A2 | 10/2010 |
| WO | WO-2012-026780 A1 | 3/2012 |

OTHER PUBLICATIONS

Gabbutt et al. Chem. Commun. 1999, 541-542. Year of publication: 1999.*
Lotter et al. Tetrahedron 2007, 63, 2263-2274. Date of publication: Dec. 27, 2006.*
Machine translation of KR2014-0034711. Date of publiation: Mar. 20, 2014.*
Watanabe et al. Journal of Chemical Research 2005, 564-571. Year of publication: 2005.*

* cited by examiner

Primary Examiner — Andrew K Bohaty
(74) Attorney, Agent, or Firm — Lee & Morse, P.C.

(57) ABSTRACT

A heterocyclic compound and an organic light-emitting device including the heterocyclic compound, the heterocyclic compound being represented by Formula 1 below:

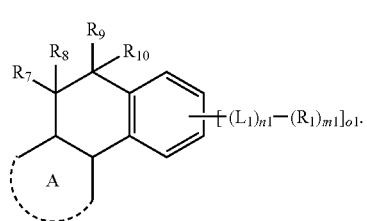

<Formula 1>

20 Claims, 1 Drawing Sheet

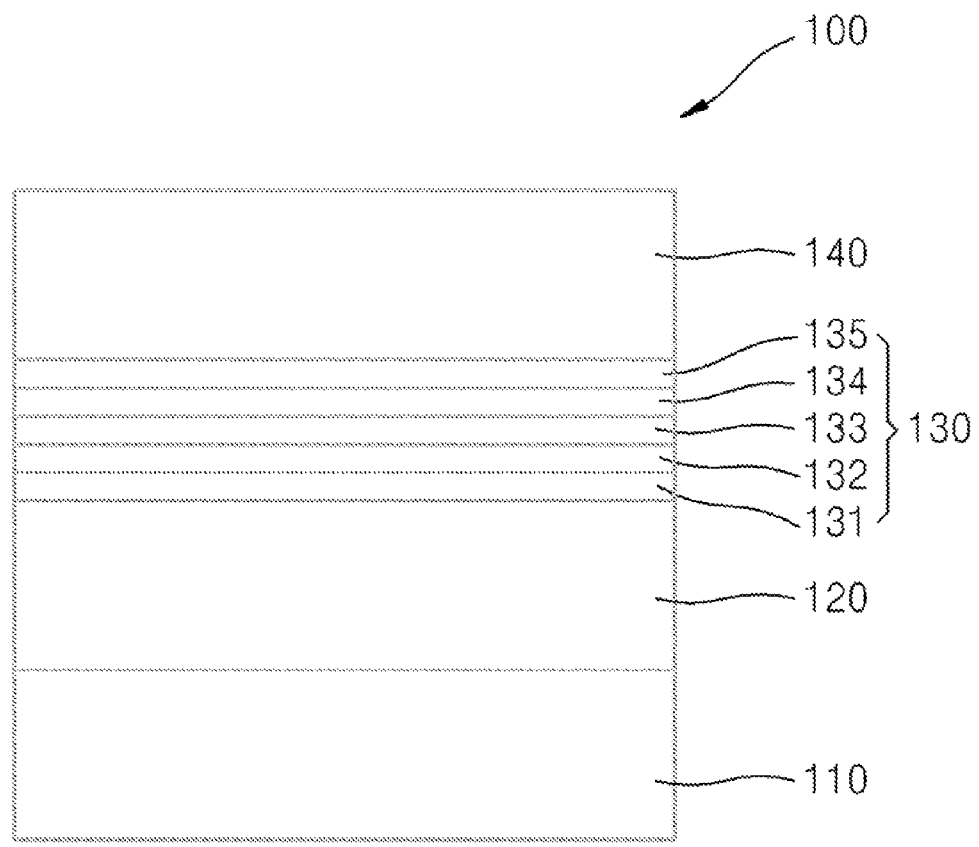

HETEROCYCLIC COMPOUND AND ORGANIC LIGHT-EMITTING DEVICE INCLUDING THE SAME

CROSS-REFERENCE TO RELATED APPLICATION

Korean Patent Application No. 10-2013-0095605, filed on Aug. 12, 2013, in the Korean Intellectual Property Office, and entitled: "Heterocyclic Compound and Organic Light-Emitting Device Including The Same," is incorporated by reference herein in its entirety.

BACKGROUND

1. Field

Embodiments relate to a heterocyclic compound and an organic light-emitting device including the heterocyclic compound.

2. Description of the Related Art

Organic light-emitting devices (OLEDs), which are self-emitting devices, have advantages such as wide viewing angles, excellent contrast, quick response, high brightness, excellent driving voltage characteristics, and can provide multicolored images.

An OLED may have a structure including a substrate, and an anode, a hole transport layer (HTL), an emission layer (EML), an electron transport layer (ETL), and a cathode which are sequentially stacked on the substrate. In this regard, the HTL, the EML, and the ETL are organic thin films formed of organic compounds.

An operating principle of an OLED having the above-described structure may be as follows.

When a voltage is applied between the anode and the cathode, holes injected from the anode may move to the EML via the HTL, and electrons injected from the cathode may move to the EML via the ETL. The holes and electrons may recombine in the EML to generate excitons. When the excitons drop from an excited state to a ground state, light is emitted.

SUMMARY

Embodiments are directed to a heterocyclic compound and an organic light-emitting device including the heterocyclic compound.

According to one or more embodiments, there is provided a heterocyclic compound represented by Formula 1 below:

<Formula 1> wherein, in Formula 1,
a moiety represented by is one selected from moieties represented by Formulae a to f below;

<Formula a>

<Formula b>

<Formula c>

<Formula d>

<Formula e>

<Formula f> wherein, in Formulae a to f,
X is O, S—,

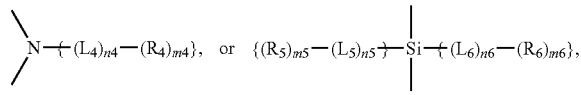

and
in Formula 1 and Formulae a to f,
$L_1$ to $L_6$ are each independently selected from a substituted or unsubstituted $C_3$-$C_{10}$ cycloalkylene group, a substituted or unsubstituted $C_3$-$C_{10}$ cycloalkenylene group, a substituted or unsubstituted $C_6$-$C_{60}$ arylene group, a substituted or unsubstituted $C_2$-$C_{10}$ heterocycloalkylene group, a substituted or unsubstituted $C_2$-$C_{10}$ heterocycloalkenylene group, and a substituted or unsubstituted $C_2$-$C_{60}$ heteroarylene group;
n1 to n6 are each independently an integer of 0 to 3;
$R_1$ to $R_{10}$ are each independently selected from a hydrogen atom, a deuterium atom, a halogen atom, a hydroxyl group, a cyano group, a nitro group, an amino group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_2$-$C_{30}$ heteroaryl group, —N($Q_1$)($Q_2$), and —Si($Q_3$)($Q_4$)($Q_5$), where $Q_1$ to $Q_5$ are each independently selected from a hydrogen atom, a deuterium atom, a halogen atom, a hydroxyl group, a cyano group, an amino group, a nitro group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, and a substituted or unsubstituted $C_2$-$C_{30}$ heteroaryl group;
m1 to m4 are each independently an integer of 0 to 5; and
o1 to o3 are each independently an integer of 0 to 2.

According to one or more embodiments, an organic light-emitting device includes: a first electrode; a second electrode disposed opposite to the first electrode; and an organic layer disposed between the first electrode and the second electrode and including an emission layer, wherein the organic layer includes at least one of the heterocyclic compounds of Formula 1 above.

BRIEF DESCRIPTION OF THE DRAWING

Features will be apparent to those of skill in the art by describing in detail exemplary embodiments with reference to the attached drawing in which:
The FIGURE illustrates a schematic cross-sectional view of an organic light-emitting device according to an embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

According to an embodiment, there is provided a heterocyclic compound represented by Formula 1 below:

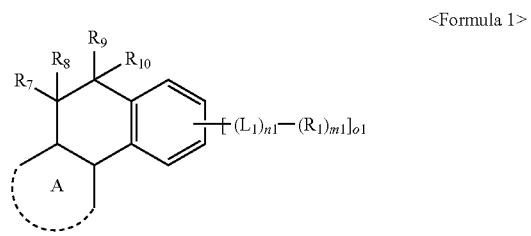

<Formula 1>

In Formula 1 above, a moiety represented by

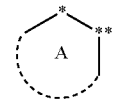

may be selected from heteroaryl rings including a hetero atom selected from O, S, N, and Si.

For example, in Formula 1, the moiety represented by

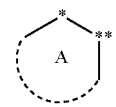

may be selected from a substituted or unsubstituted dibenzofuran, a substituted or unsubstituted dibenzothiophene, a substituted or unsubstituted carbazole, and a substituted or unsubstituted dibenzosilol.

In an implementation, in Formula 1, the moiety represented by

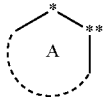

may be one selected from the moieties represented by Formulae a to f below.

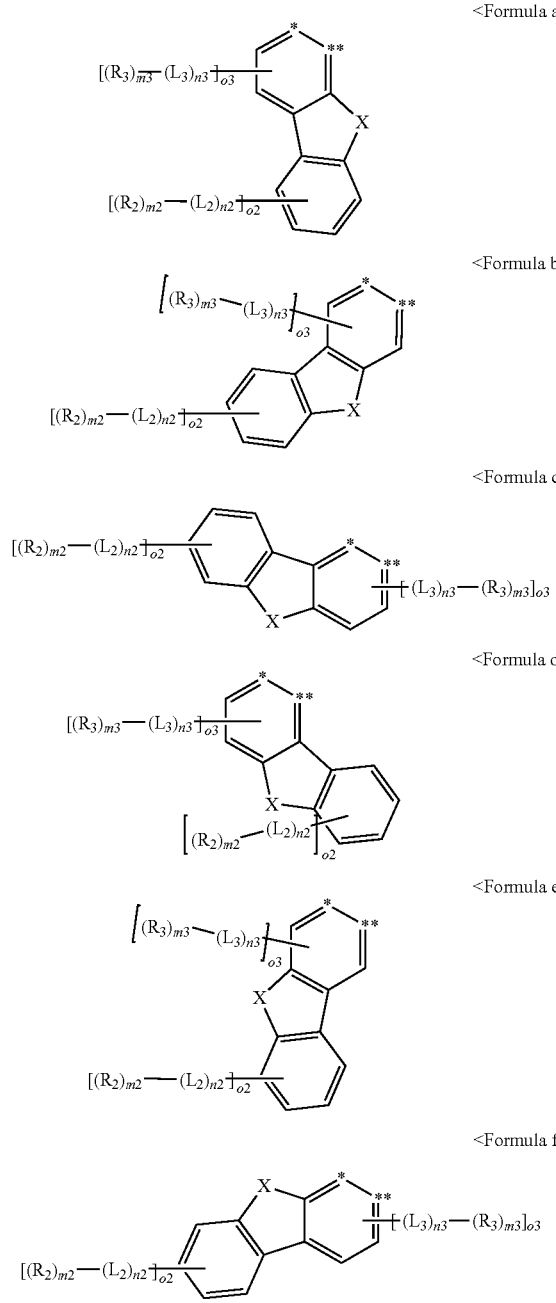

In Formulae a to f above, X may be —O—, —S—,

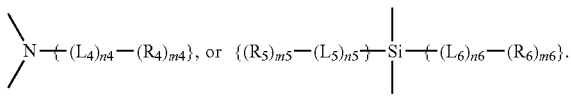

In Formula 1 and Formulae a to f above, $L_1$ to $L_6$ may be each independently selected from a substituted or unsubstituted $C_3$-$C_{10}$ cycloalkylene group, a substituted or unsubstituted $C_3$-$C_{10}$ cycloalkenylene group, a substituted or unsubstituted $C_6$-$C_{60}$ arylene group, a substituted or unsubstituted $C_2$-$C_{10}$ heterocycloalkylene group, a substituted or unsubstituted $C_2$-$C_{10}$ heterocycloalkenylene group, and a substituted or unsubstituted $C_2$-$C_{60}$ heteroarylene group.

For example, in Formula 1 and Formulae a to f above, $L_1$ to $L_6$ may be each independently selected from a substituted or unsubstituted phenylene group, a substituted or unsubstituted pentalenylene group, a substituted or unsubstituted indenylene group, a substituted or unsubstituted a naphthylene group, a substituted or unsubstituted azulenylene group, a substituted or unsubstituted indacenylene group, a substituted or unsubstituted acenaphthylene group, a substituted or unsubstituted fluorenylene group, a substituted or unsubstituted spiro-fluorenylene group, a substituted or unsubstituted phenalenylene group, a substituted or unsubstituted phenanthrenylene group, a substituted or unsubstituted anthracenylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group. a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted imidazolylene group, a substituted or unsubstituted pyrazolylene group, a substituted or unsubstituted pyridinylene group, a substituted or unsubstituted pyrazinylene group, a substituted or unsubstituted a pyrimidinylene group, a substituted or unsubstituted pyridazinylene group, a substituted or unsubstituted isoindolylene group, a substituted or unsubstituted indolylene group, a substituted or unsubstituted indazolylene group, a substituted or unsubstituted purinylene group, a substituted or unsubstituted quinolinylene group, a substituted or unsubstituted benzoquinolinylene group, a substituted or unsubstituted phthalazinylene group, a substituted or unsubstituted naphthyridinylene group, a substituted or unsubstituted quinoxalinylene group, a substituted or unsubstituted quinazolinylene group, a substituted or unsubstituted cinnolinylene group, a substituted or unsubstituted carbazolylene group, a substituted or unsubstituted phenanthridinylene group, a substituted or unsubstituted acridinylene group, a substituted or unsubstituted phenanthrolinylene group, a substituted or unsubstituted phenazinylene group, a substituted or unsubstituted benzooxazolylene group, a substituted or unsubstituted benzoimidazolylene group, a substituted or unsubstituted furanylene group, a substituted or unsubstituted benzofuranylene group, a substituted or unsubstituted thiophenylene group, a substituted or unsubstituted benzothiophenylene group, a substituted or unsubstituted thiazolylene group, a substituted or unsubstituted isothiazolylene group, a substituted or unsubstituted benzothiazolylene group, a substituted or unsubstituted isoxazolylene group, a substituted or unsubstituted oxazolylene group, a substituted or unsubstituted triazolylene group, a substituted or unsubstituted tetrazolylene group, a substituted or unsubstituted oxadiazolylene group, a substituted or unsubstituted triazinylene group, a substituted or unsubstituted benzooxazolylene group, a substituted or unsubstituted dibenzopuranylene group, a substituted or unsubstituted dibenzothiophenylene group, and a substituted or unsubstituted benzocarbazolylene group.

In an implementation, in Formula 1 and Formulae a to f above, $L_1$ to $L_6$ may be each independently selected from:

i) a phenylene group, a naphthylene group, an anthracenyl group, a pyrimidinylene group, a triazinylene group, and a pyridyl group; and ii) a phenylene group, a naphthylene group, an anthracenyl group, a pyrimidinylene group, a triazinylene group, and a pyridyl group, each substituted with at least one selected from:

a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof and a $C_1$-$C_{10}$ alkyl group;

a $C_1$-$C_{10}$ alkyl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a $C_6$-$C_{16}$ aryl group, and a $C_2$-$C_{16}$ heteroaryl group; and a $C_6$-$C_{16}$ aryl group, and a $C_2$-$C_{16}$ heteroaryl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_6$-$C_{16}$ aryl group, and a $C_2$-$C_{16}$ heteroaryl group.

In an implementation, in Formula 1 and Formulae a to f above, $L_1$ to $L_6$ may be each independently selected from:

i) a phenylene group, a pyrimidinylene group, a triazinylene group, and a pyridyl group; and ii) a phenylene group, a pyrimidinylene group, a triazinylene group, and a pyridyl group, each substituted with at least one selected from:

a deuterium atom, a halogen atom, a hydroxyl group, a cyano group, a nitro group, a methyl group, an ethyl group, an n-propyl group, an iso-propyl group, an n-butyl group, a sec-butyl group, an iso-butyl group, and a tert-butyl group;

a methyl group, an ethyl group, an n-propyl group, an iso-propyl group, an n-butyl group, a sec-butyl group, an iso-butyl group, and a tert-butyl group, each substituted with at least one of a deuterium atom, a halogen atom, a hydroxyl group, a cyano group, and a nitro group;

a phenyl group, a naphthyl group, and an anthracenyl group; and a phenyl group, a naphthyl group, and an anthracenyl group, each substituted with at least one of a deuterium atom, a halogen atom, a hydroxyl group, a cyano group, and a nitro group.

In an implementation, in Formula 1 and Formulae a to f above, $L_1$ to $L_6$ may be each independently selected from:

i) a phenylene group, a pyrimidinylene group, a triazinylene group, and a pyridyl group; and ii) a phenylene group, a pyrimidinylene group, a triazinylene group, and a pyridyl group, each substituted with at least one selected from a deuterium atom, a halogen atom, a hydroxyl group, a cyano group, a nitro group, a methyl group, an ethyl group, a phenyl group, a naphthyl group, and an anthracenyl group.

In Formula 1 and Formulae a to f above, n1 indicates the number of $L_1$s, n2 indicates the number of $L_2$s, n3 indicates the number of $L_3$s, n4 indicates the number of $L_4$s, n5 indicates the number of $L_5$s, and n6 indicates the number of $L_6$s.

In Formula 1 and Formulae a to f above, n1 to n6 may be each independently an integer of 0 to 3.

For example, in Formula 1 and Formulae a to f above, n1 to n6 may be each independently an integer of 1 or 2.

In Formula 1 and Formulae a to f above, moieties represented by $(L_1)_{n1}$, $(L_2)_{n2}$, $(L_3)_{n3}$, $(L_4)_{n4}$, $(L_5)_{n5}$, and $(L_6)_{n6}$, may be are each independently selected from the moieties represented by Formulae 4-1 to 4-14 below.

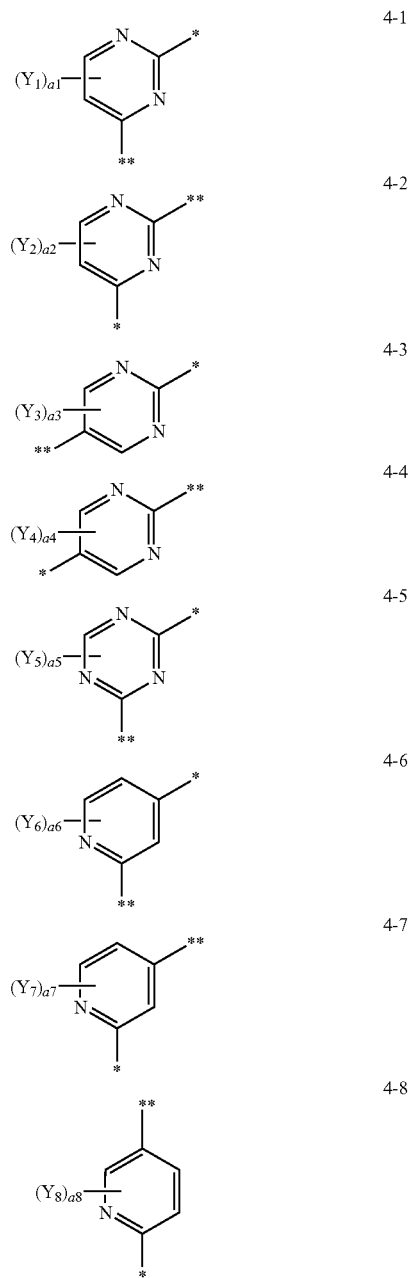

-continued

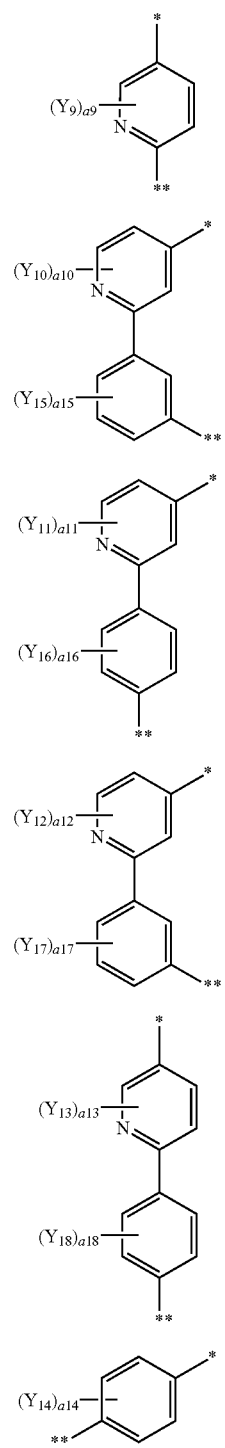

4-9

4-10

4-11

4-12

4-13

4-14

In Formulae 4-1 to 4-14, $Y_1$ to $Y_{18}$ may be each independently selected from:

a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof and a $C_1$-$C_{10}$ alkyl group;

a $C_1$-$C_{10}$ alkyl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a $C_6$-$C_{16}$ aryl group and a $C_2$-$C_{16}$ heteroaryl group; and a $C_6$-$C_{16}$ aryl group and a $C_2$-$C_{16}$ heteroaryl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_6$-$C_{16}$ aryl group, and a $C_2$-$C_{16}$ heteroaryl group.

a1 to a18 may be each independently an integer of 0 to 2.
* may indicate a binding site to a ring or a heterocycle, and
** may indicate a binding site to one of $R_1$ to $R_6$.

In an implementation, in Formula 1 and Formulae a to f above, the moieties represented by $(L_1)_{n1}$, $(L_2)_{n2}$, $(L_3)_{n3}$, $(L_4)_{n4}$, $(L_5)_{n5}$, and $(L_6)_{n6}$ may be each independently selected from the moieties represented by Formulae 5-1 to 5-14 below.

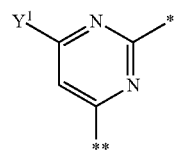

5-1

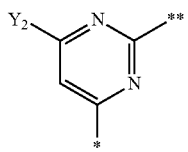

5-2

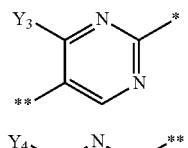

5-3

5-4

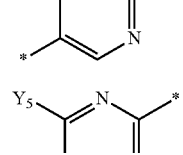

5-5

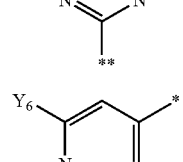

5-6

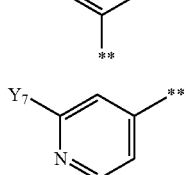

5-7

5-8 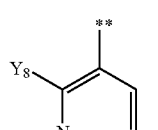

5-9 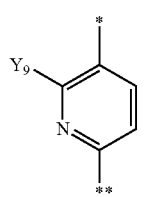

5-10 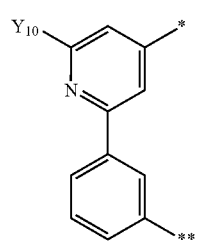

5-11 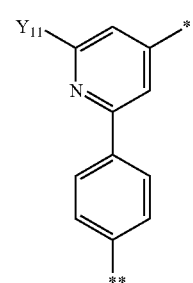

5-12 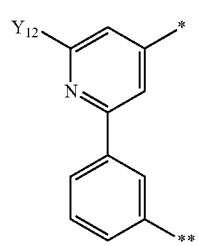

5-13 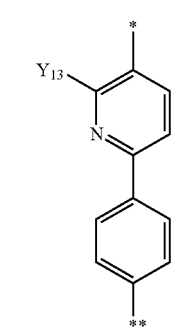

5-14 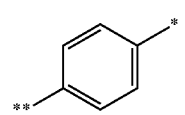

In Formulae 5-1 to 5-14, $Y_1$ to $Y_{13}$ may be each independently selected from a deuterium atom, a halogen atom, a hydroxyl group, a cyano group, a nitro group, a methyl group, an ethyl group, a phenyl group, a naphthyl group, and an anthracenyl group. * may indicate a binding site to a ring or a heterocycle, and ** may indicate a binding site to one of $R_1$ to $R_6$.

In Formula 1 and Formulae a to f above, $R_1$ to $R_{10}$ may be each independently selected from a hydrogen atom, a deuterium atom, a halogen atom, a hydroxyl group, a cyano group, a nitro group, an amino group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_2$-$C_{30}$ heteroaryl group, —$N(Q_1)(Q_2)$, and —$Si(Q_3)(Q_4)(Q_5)$, where $Q_1$ to $Q_5$ may be each independently selected from a hydrogen atom, a deuterium atom, a halogen atom, a hydroxyl group, a cyano group, an amino group, a nitro group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, and a substituted or unsubstituted $C_2$-$C_{30}$ heteroaryl group.

For example, in Formula 1 and Formulae a to f above, $R_1$ to $R_6$ may be each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{10}$ alkyl group, a substituted or unsubstituted $C_1$-$C_{10}$ alkoxy group, and groups represented by Formulae 6-1 to 6-13 below.

6-1 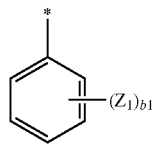

6-2 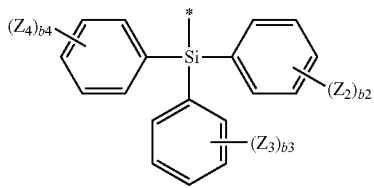

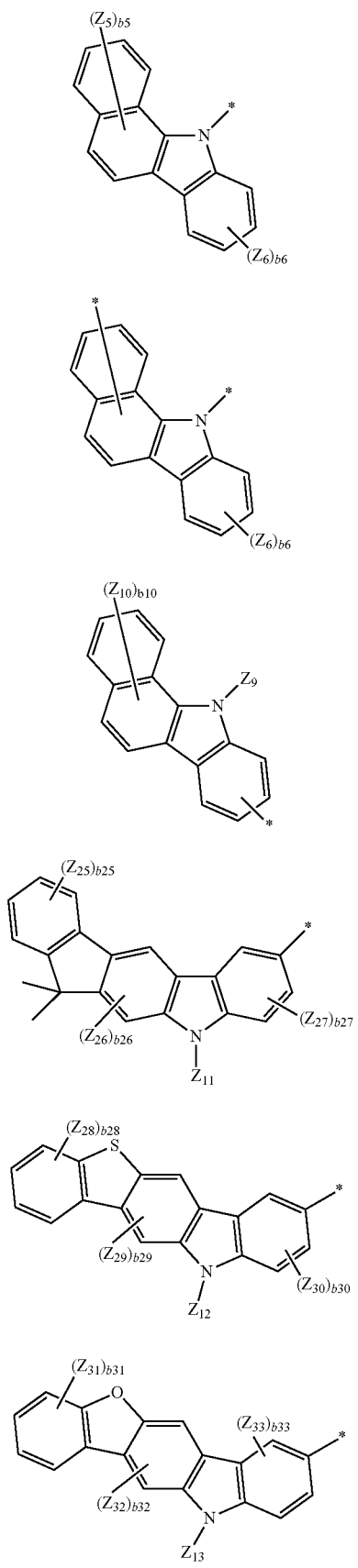
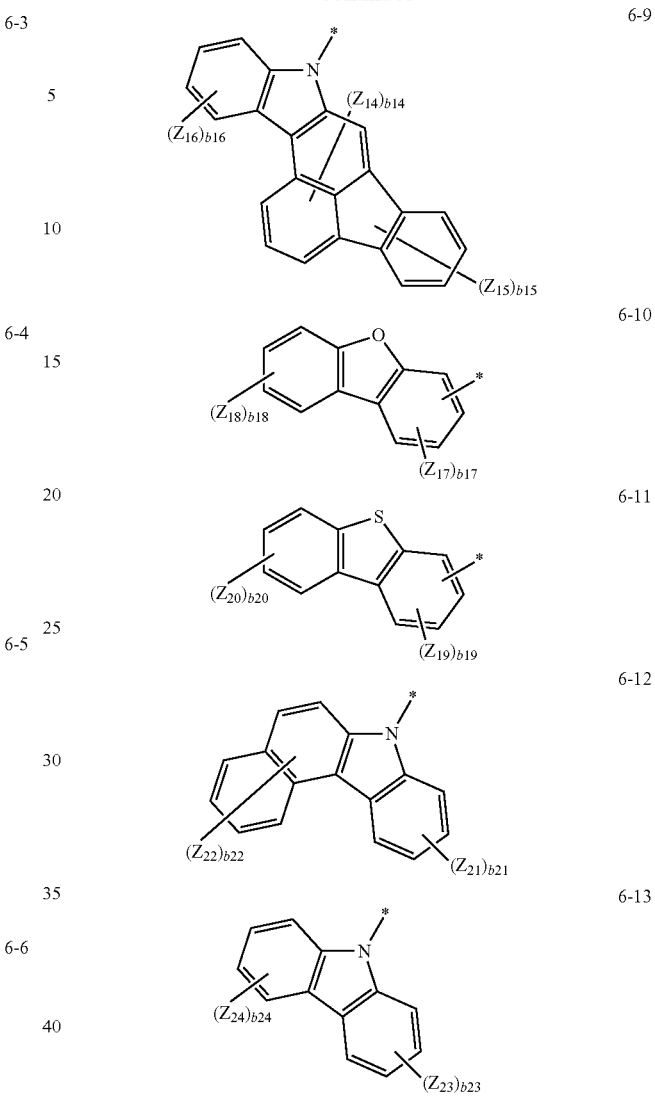

In Formulae 6-1 to 6-13, $Z_1$ to $Z_{33}$ may be each independently selected from:

a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, and a $C_1$-$C_{10}$ alkyl group;

a $C_1$-$C_{10}$ alkyl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a $C_6$-$C_{16}$ aryl group, and a $C_2$-$C_{16}$ heteroaryl group; and a $C_6$-$C_{16}$ aryl group and a $C_2$-$C_{16}$ heteroaryl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_6$-$C_{16}$ aryl group, and a $C_2$-$C_{16}$ heteroaryl group.

b1 to b6, b8, b10, and b14 to b33 may be each independently an integer of 0 to 2, and * may indicate a binding site to one of $L_1$ to $L_6$.

In an implementation, in Formula 1 and Formulae a to f above, $R_1$ to $R_6$ may be each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a methyl group, an ethyl group, an n-propyl group, an iso-propyl group, an n-butyl group, a sec-butyl group, an iso-butyl group, a tert-butyl group, and groups represented by Formulae 7-1 to 7-15 below.

7-1
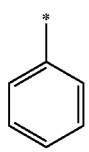

7-2
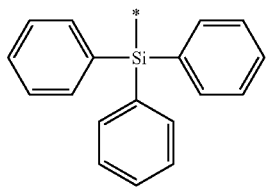

7-3
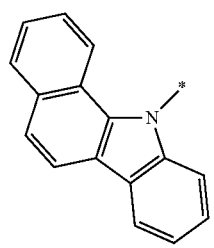

7-4
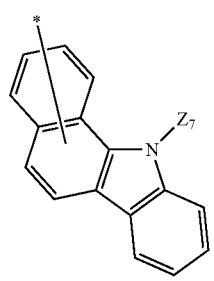

7-5
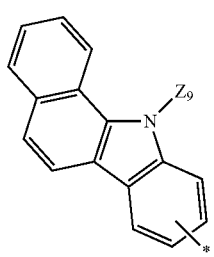

7-6
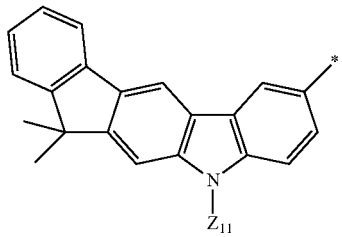

7-7
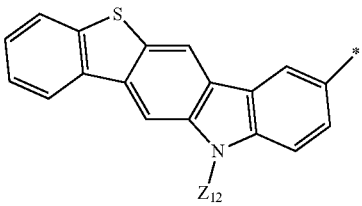

7-8
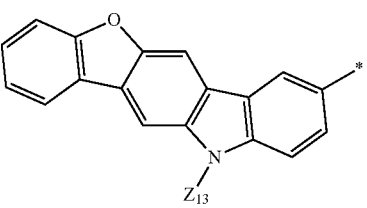

7-9
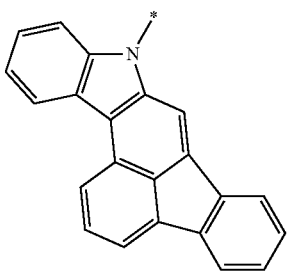

7-10
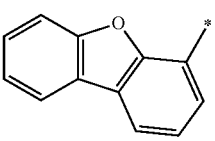

7-11
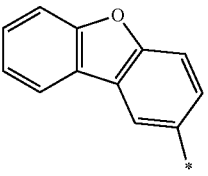

7-12
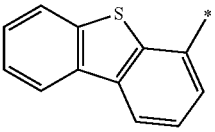

7-13
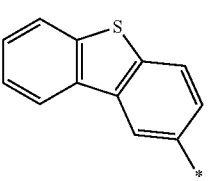

-continued 7-14
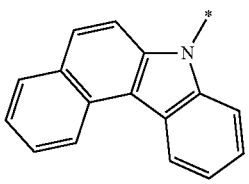

7-15
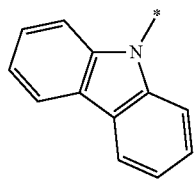

In Formulae 7-1 to 7-15 above, $Z_7$, $Z_9$, and $Z_{11}$ to $Z_{13}$ may be each independently selected from a deuterium atom, a halogen atom, a hydroxyl group, a cyano group, a nitro group, a methyl group, an ethyl group, a phenyl group, a naphthyl group, and an anthracenyl group, and

* may indicate a binding site to one of $L_1$ to $L_6$.

In Formula 1 above, $R_7$ to $R_{10}$ may be each independently a hydrogen atom, a deuterium atom, a halogen atom, a hydroxyl group, a cyano group, a nitro group, an amino group, an amidino group, hydrazine, hydrazone, a carboxylic group or a salt thereof, a sulfonic acid group or a salt thereof, a phosphoric acid group or a salt thereof, a C1-C20 alkyl group, a C1-C20 alkoxy group, a phenyl group, a naphthyl group, an anthryl group, a dimethyl-fluorenyl group, a phenyl-carbazolyl group, a pyrenyl group, or a crysenyl group.

For example, in Formula 1 above, $R_7$ to $R_{10}$ may be hydrogen atoms.

In Formula 1 and Formulae a to f above, m1 indicates the number of $R_1$s, m2 indicates the number of $R_2$s, m3 indicates the number of $R_3$s, m4 indicates the number of $R_4$s, m5 indicates the number of $R_5$s, and m6 indicates the number of $R_6$s.

In Formula 1 and Formulae a to f above, m1 to m6 may be each independently an integer of 0 to 5.

For example, in Formula 1 and Formulae a to f above, m1 to m6 may be 1.

In Formula 1 above, o1 to o3 may be each independently an integer of 0 to 2.

For example, o1 to o3 in Formula 1 above may be each independently an integer of 0 or 1.

For example, in Formulae a to f above, a case where

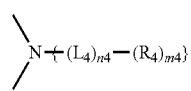

is NH may be excluded. If

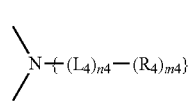

were to be NH, the heterocyclic compound of Formula 1 above may be highly reactive, and thus may be undesirably prone to denaturate during vacuum deposition processes in manufacturing an organic light-emitting device.

In an implementation, the heterocyclic compound of Formula 1 above may be a compound represented by one of Formulae A to C below.

<Formula A>

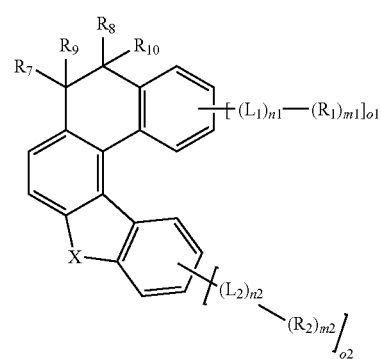

<Formula B>

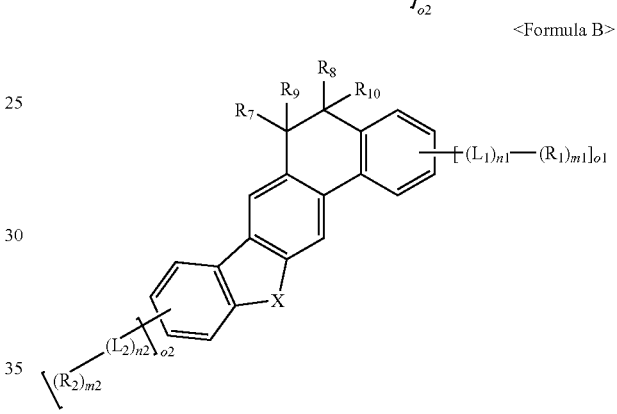

<Formula C>

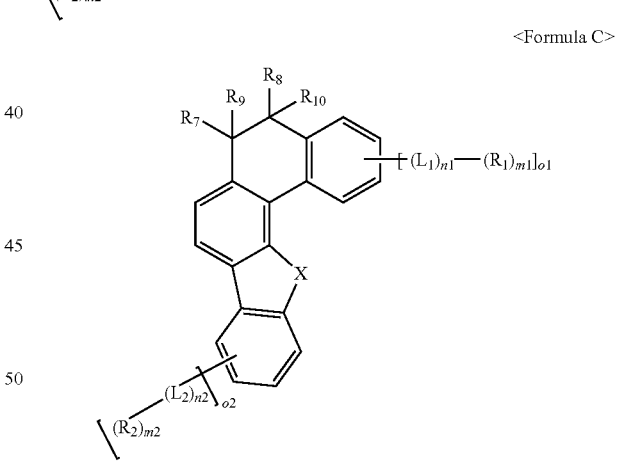

In Formulae A to C,

X may be —O—, —S—,

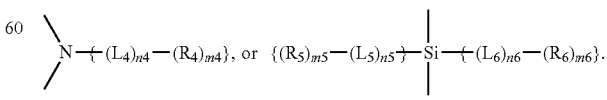

moieties represented by $(L_1)_{n1}$, $(L_2)_{n2}$, and $(L_4)_{n4}$ to $(L_6)_{n6}$ may be each independently selected from the moieties represented by Formulae 4-1 to 4-14 below.

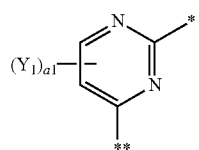 4-1

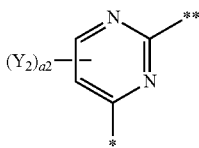 4-2

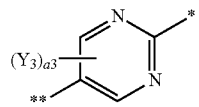 4-3

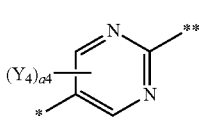 4-4

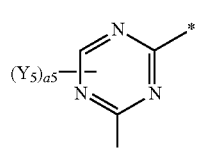 4-5

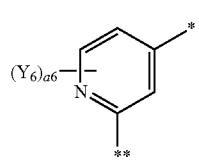 4-6

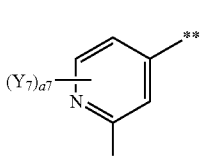 4-7

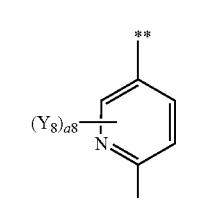 4-8

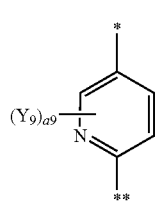 4-9

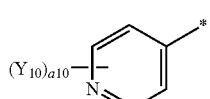 4-10

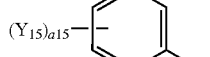 4-11

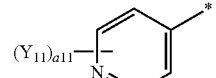 4-12

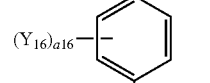 4-13

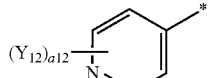 4-14

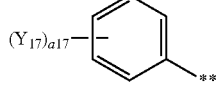

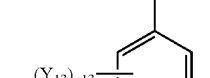

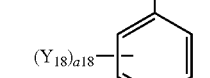

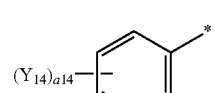

In Formulae 4-1 to 4-14, $Y_1$ to $Y_{18}$ may be each independently selected from:

a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, and a $C_1$-$C_{10}$ alkyl group;

a $C_1$-$C_{10}$ alkyl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a $C_6$-$C_{16}$ aryl group and a $C_2$-$C_{16}$ heteroaryl group; and a $C_6$-$C_{16}$ aryl group and a $C_2$-$C_{16}$ heteroaryl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_6$-$C_{16}$ aryl group, and a $C_2$-$C_{16}$ heteroaryl group.

a1 to a18 may be each independently an integer of 0 to 2,

* may indicate a binding site to a ring or a heterocycle, and

** may indicate a binding site to one of $R_1$, $R_2$, and $R_4$ to $R_6$.

$R_1$, $R_2$, and $R_4$ to $R_6$ in Formulae A to C may be each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{10}$ alkyl group, a substituted or unsubstituted $C_1$-$C_{10}$ alkoxy group, and groups represented by Formulae 6-1 to 6-13 below.

6-1
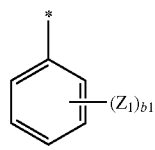

6-2
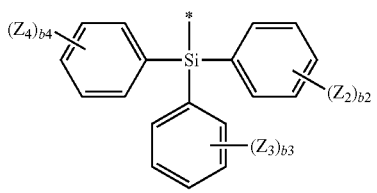

6-3
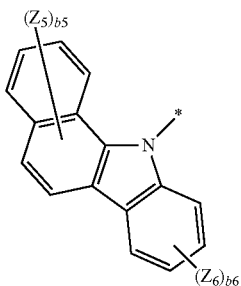

6-4
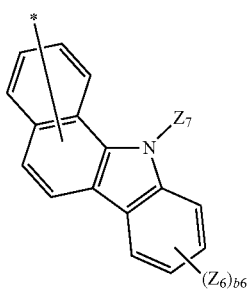

6-5
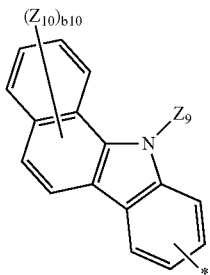

6-6
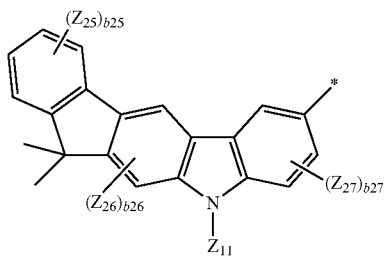

6-7
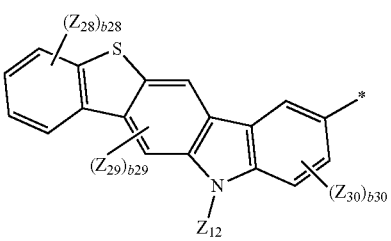

6-8
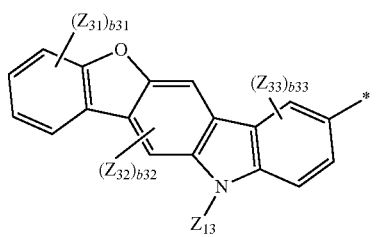

6-9
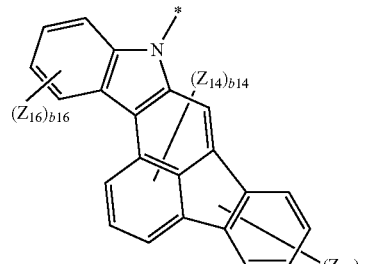

6-10
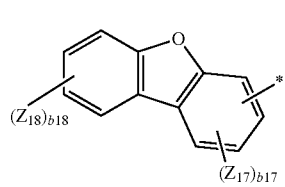

23

-continued

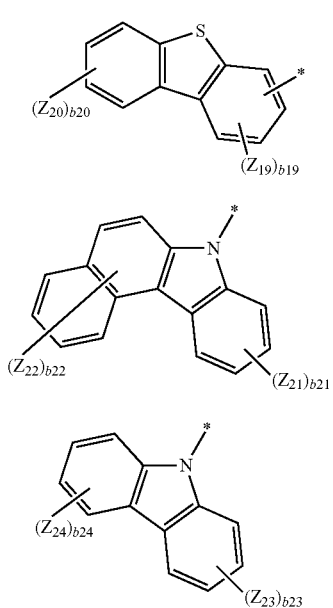

6-11

6-12

6-13

In Formulae 6-1 to 6-13, $Z_1$ to $Z_{33}$ may be each independently selected from:

a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, and a $C_1$-$C_{10}$ alkyl group;

a $C_1$-$C_{10}$ alkyl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a $C_6$-$C_{16}$ aryl group and a $C_2$-$C_{16}$ heteroaryl group; and a $C_6$-$C_{16}$ aryl group and a $C_2$-$C_{16}$ heteroaryl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_6$-$C_{16}$ aryl group, and a $C_2$-$C_{16}$ heteroaryl group, b1 to b6, b8, b10, and b14 to b33 may be each independently an integer of 0 to 2,

* may indicate a binding site to one of $L_1$, $L_2$, and $L_4$ to $L_6$, and m1, m2, and m4 to m6 may be each 1.

$R_7$ to $R_{10}$ in Formulae A to C may be each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a methyl group, an ethyl group, an n-propyl group, an iso-propyl group, an n-butyl group, a sec-butyl group, an iso-butyl group, and a tert-butyl group; and o1 and o2 in Formulae A to C may be each independently an integer of 0 or 1.

24

In an implementation, the heterocyclic compound of Formula 1 may be a compound represented by one of Formulae A to C below.

<Formula A>

<Formula B>

<Formula C>

In Formulae A to C above,

X may be —O—, —S—, $\diagdown$N—(($L_4$)$_{n4}$—($R_4$)$_{m4}$), or {($R_5$)$_{m5}$—($L_5$)$_{n5}$}—Si—(($L_6$)$_{n6}$—($R_6$)$_{m6}$).

moieties represented by $(L_1)_{n1}$, $(L_2)_{n2}$, $(L_4)$, $(L_5)_5$, and $(L_6)_{n6}$ may be each independently selected from moieties represented by Formulae 5-1 to 5-14 below.

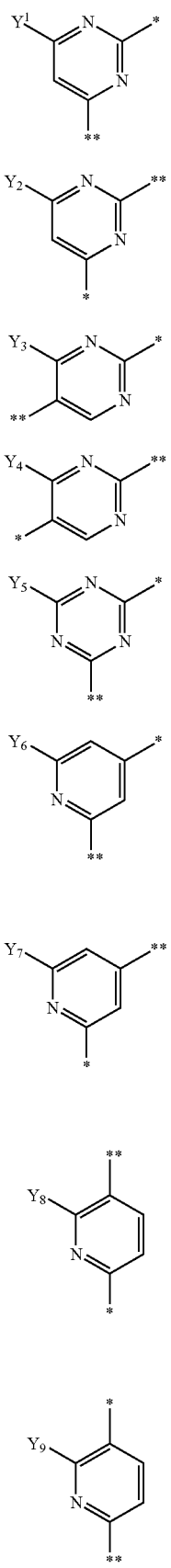

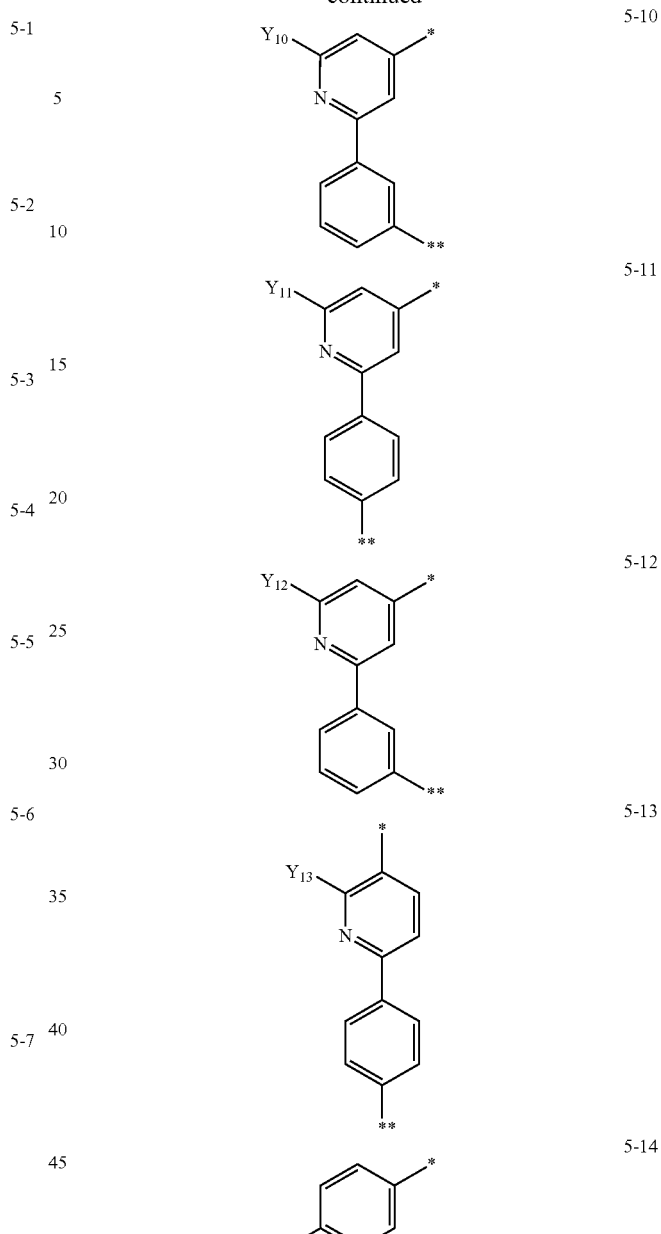

-continued

In Formulae 5-1 to 5-14, $Y_1$ to $Y_{13}$ may be each independently selected from a deuterium atom, a halogen atom, a hydroxyl group, a cyano group, a nitro group, a methyl group, an ethyl group, a phenyl group, a naphthyl group, and an anthracenyl group,

* may indicate a binding site to a ring or a heterocycle, and

** may indicate a binding site to one of $R_1$, $R_2$, and $R_4$ to $R_6$;

$R_1$, $R_2$, and $R_4$ to $R_6$ in Formulae A to C may be each independently selected From a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a methyl group, an ethyl group, an n-propyl group, an iso-propyl group, an n-butyl group, a sec-butyl group, an iso-butyl group, a tert-butyl group, and groups represented by Formulae 7-1 to 7-15 below.
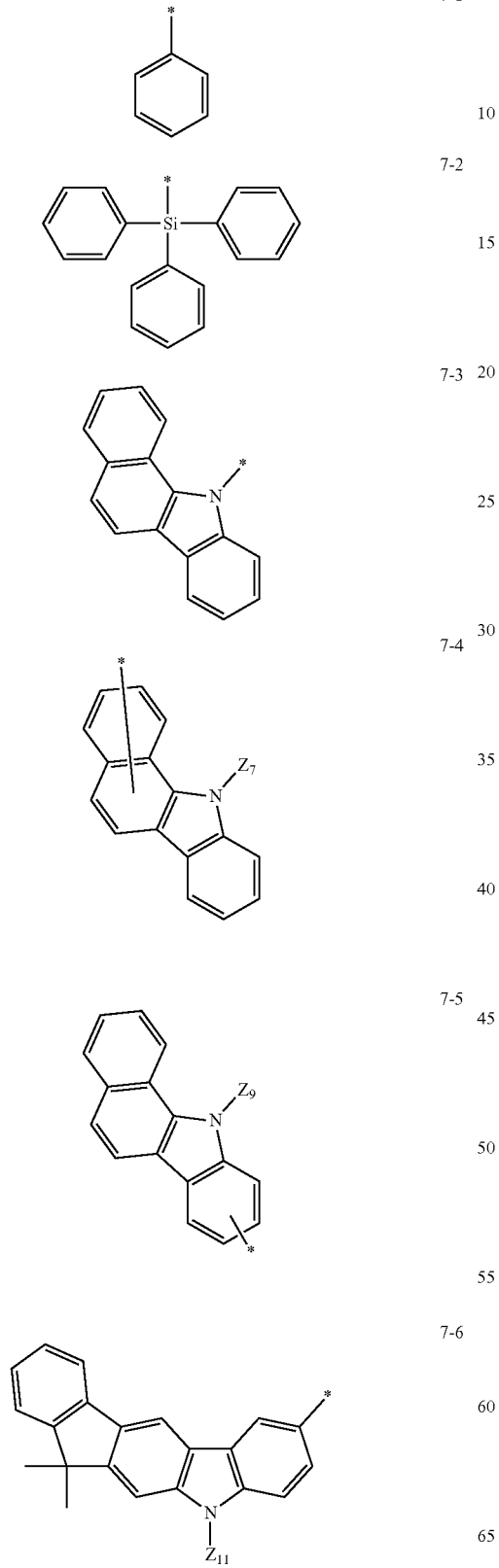
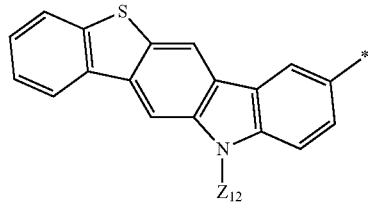
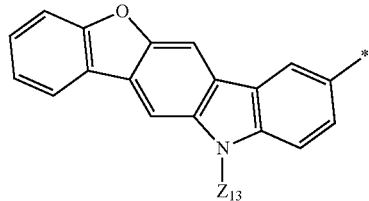
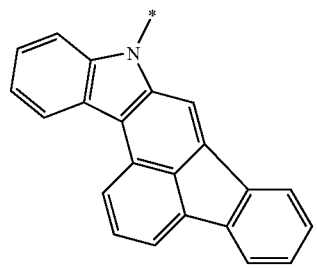
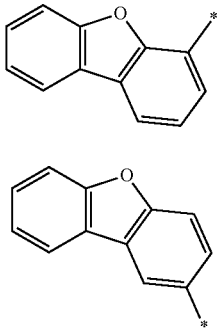
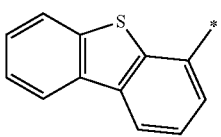
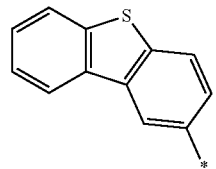
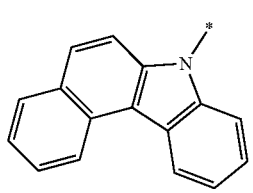

-continued

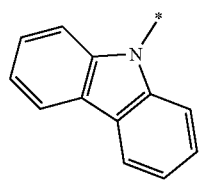

7-15

In Formulae 7-1 to 7-15, $Z_7$, $Z_9$, and $Z_{11}$ to $Z_{13}$ may be each independently selected from a deuterium atom, a halogen atom, a hydroxyl group, a cyano group, a nitro group, a methyl group, an ethyl group, a phenyl group, a naphthyl group, and an anthracenyl group, and \* may indicate a binding site to one of $L_1$, $L_2$, and $L_4$ to $L_6$;

m1, m2, and m4 to m6 in Formulae A to C may be 1;

$R_7$ to $R_{10}$ in Formulae A to C may be hydrogen atoms; and o1 and o2 may be each independently an integer of 0 or 1.

In an implementation, the heterocyclic compound of Formula 1 above may be a compound represented by one of Formulae 1a to 1c, 2a to 2c, and 3a to 3c below.

<Formula 1a>

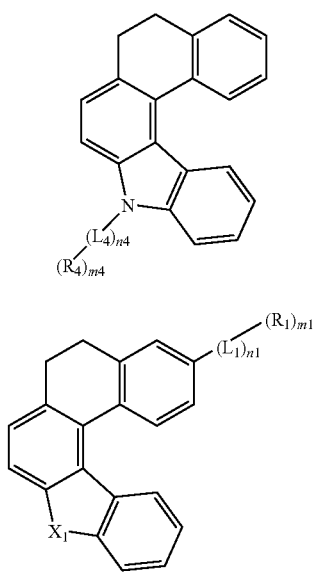

<Formula 1b>

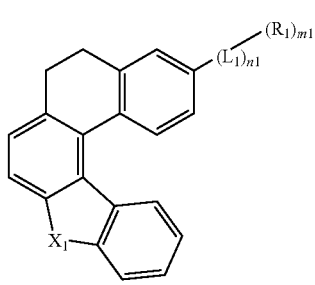

<Formula 1c>

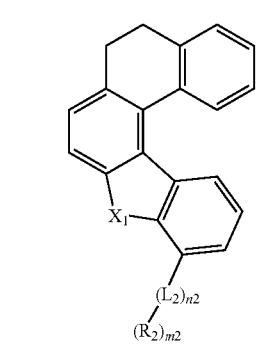

<Formula 2a>

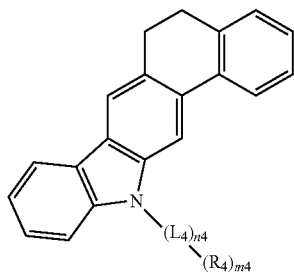

<Formula 2b>

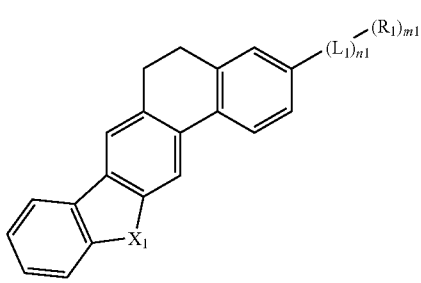

<Formula 2c>

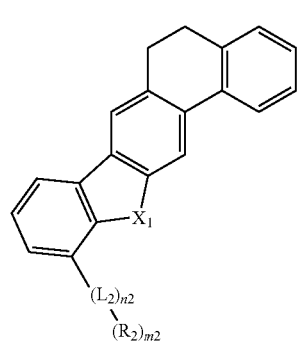

<Formula 3a>

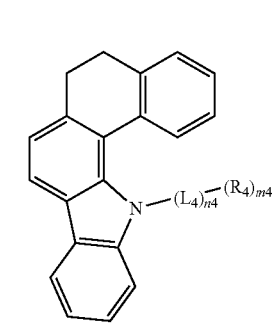

<Formula 3b>

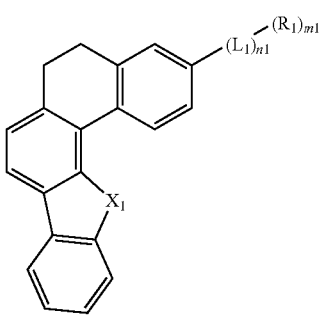

-continued
<Formula 3c>
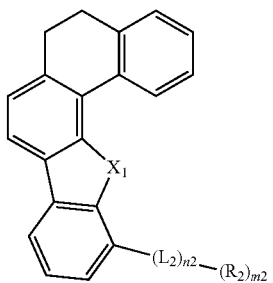
In Formulae 1a to 1c, 2a to 2c, and 3a to 3c,
$X_1$ and $X_2$ may be each independently —O— or —S—;
moieties represented by $(L_1)_{n1}$, $(L_2)_{n2}$, and $(L_4)_{n4}$ may be each independently selected from moieties represented by Formulae 4-1 to 4-14 below:
4-1
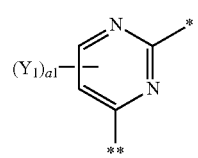
4-2
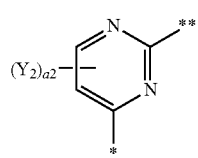
4-3
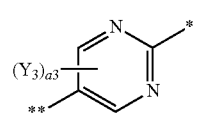
4-4
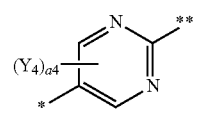
4-5
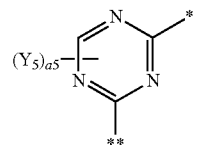
4-6
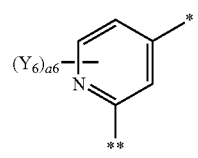
4-7
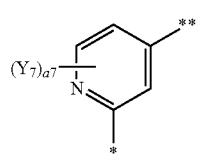
4-8
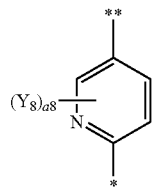
4-9
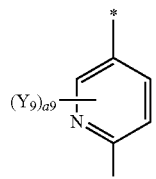
4-10
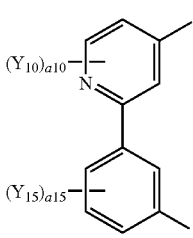
4-11
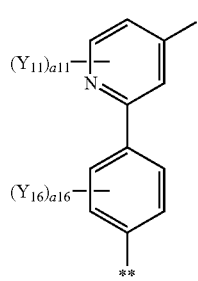
4-12
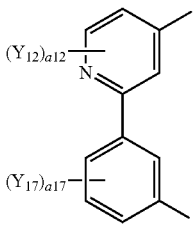
4-13
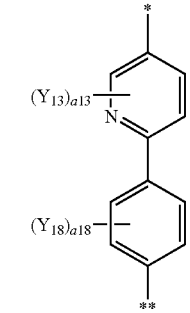
4-14
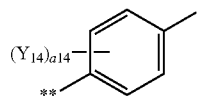

wherein, in Formulae 4-1 to 4-14, $Y_1$ to $Y_{18}$ may be each independently selected from:

a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, and a $C_1$-$C_{10}$ alkyl group;

a $C_1$-$C_{10}$ alkyl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a $C_6$-$C_{16}$ aryl group and a $C_2$-$C_{16}$ heteroaryl group; and a $C_6$-$C_{16}$ aryl group and a $C_2$-$C_{16}$ heteroaryl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_6$-$C_{16}$ aryl group, and a $C_2$-$C_{16}$ heteroaryl group, a1 to a18 may be each independently an integer of 0 to 2, \* may indicate a binding site to a ring or a heterocycle, and \*\* may indicate a binding site to one of $R_1$, $R_2$, and $R_4$.

$R_1$, $R_2$, and $R_4$ in Formulae 1a to 1c, 2a to 2c, and 3a to 3c may be each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{10}$ alkyl group, a substituted or unsubstituted $C_1$-$C_{10}$ alkoxy group, and groups represented by Formulae 6-1 to 6-13 below.

6-1

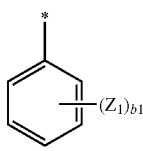

6-2

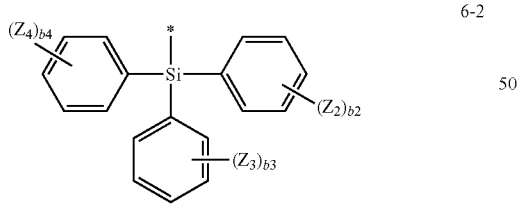

6-3

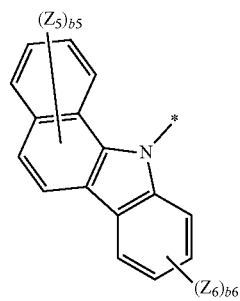

6-4

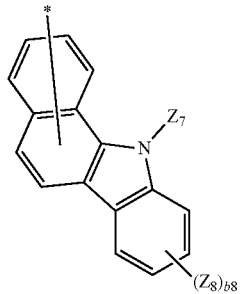

6-5

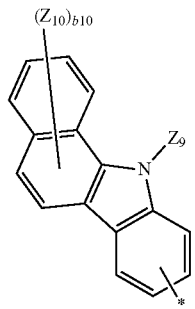

6-6

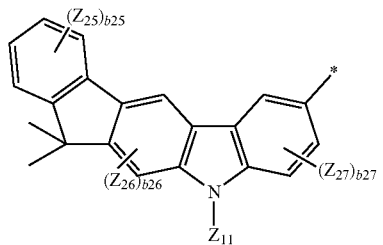

6-7

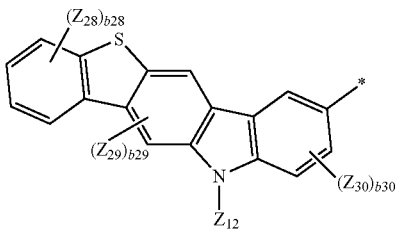

6-8

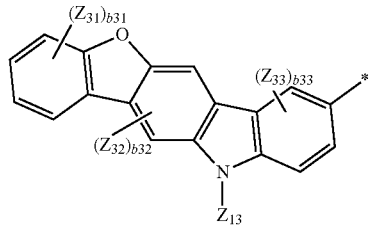

6-9

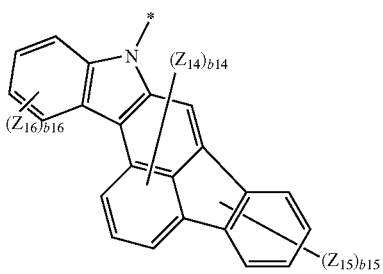

-continued

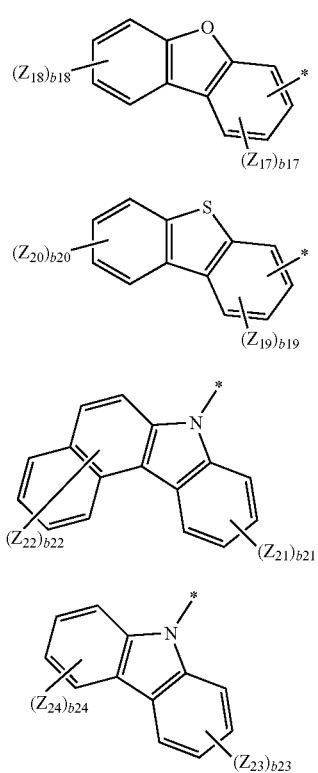

In Formulae 6-1 to 6-13, $Z_1$ to $Z_{33}$ may be each independently selected from:

a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, and a $C_1$-$C_{10}$ alkyl group;

a $C_1$-$C_{10}$ alkyl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a $C_6$-$C_{16}$ aryl group and a $C_2$-$C_{16}$ heteroaryl group; and a $C_6$-$C_{16}$ aryl group and a $C_2$-$C_{16}$ heteroaryl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_6$-$C_{16}$ aryl group, and a $C_2$-$C_{16}$ heteroaryl group, b1 to b6, b8, b10, and b14 to b33 may be each independently an integer of 0 to 2,

* may indicate a binding site to one of $L_1$, $L_2$, and $L_4$; and m1, m2, and m4 in Formulae 1a to 1c, 2a to 2c, and 3a to 3c may be each 1.

In an implementation, the heterocyclic compound of Formula 1 above may be a compound represented by one of Formulae 1a to 1c, 2a to 2c, and 3a to 3c below.

<Formula 1a>

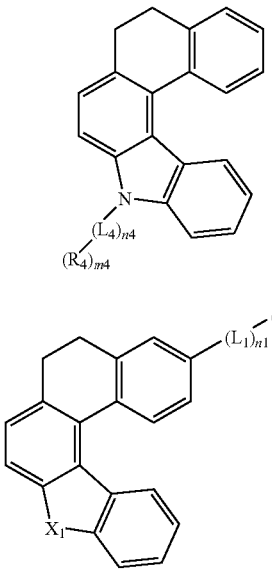

<Formula 1b>

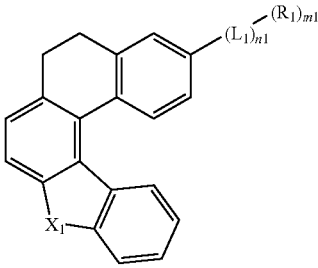

<Formula 1c>

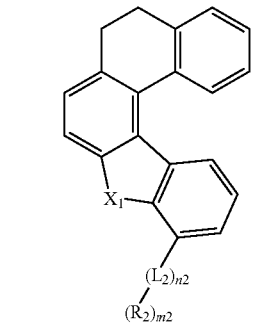

<Formula 2a>

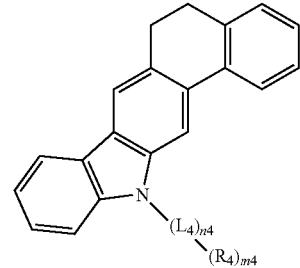

<Formula 2b>

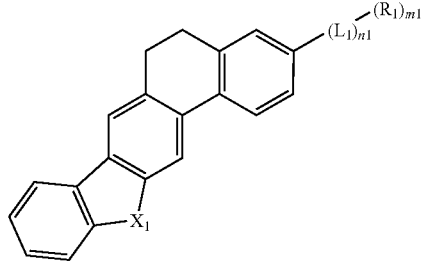

-continued
<Formula 2c>
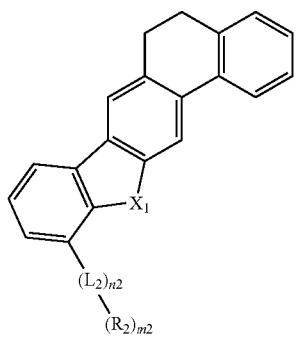
<Formula 3a>
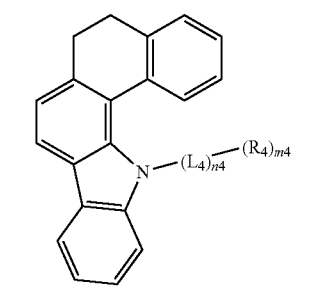
<Formula 3b>
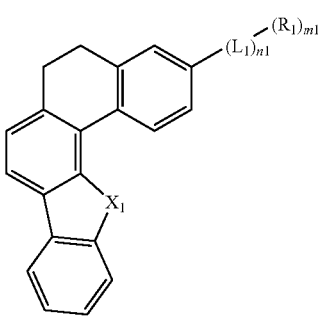
<Formula 3c>
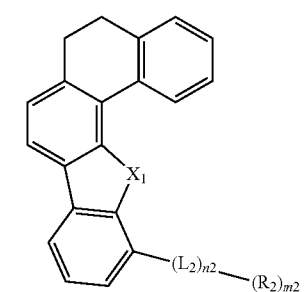
In Formulae 1a to 1c, 2a to 2c, and 3a to 3c,
$X_1$ and $X_2$ may be each independently —O— or —S—;
moieties represented by $(L_1)_{n1}$, $(L_2)_{n2}$, and $(L_4)_{n4}$ may be each independently selected from moieties represented by Formulae 5-1 to 5-14.
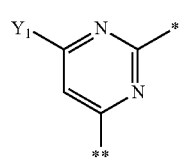
5-1
-continued
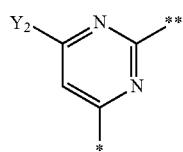
5-2
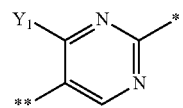
5-3
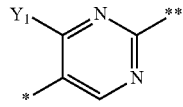
5-4
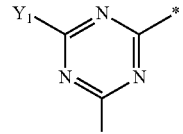
5-5
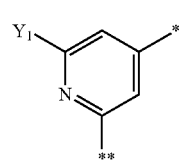
5-6
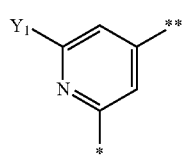
5-7
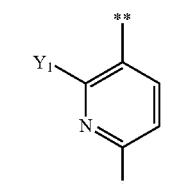
5-8
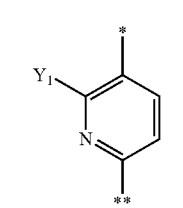
5-9
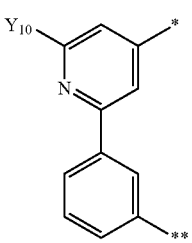
5-10

-continued

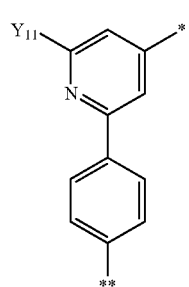

5-11

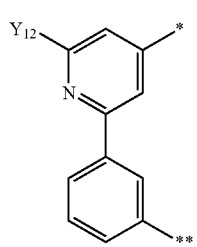

5-12

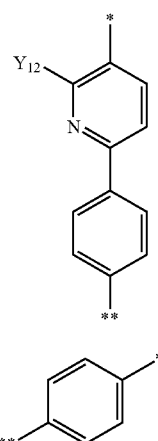

5-13

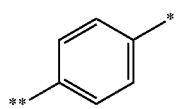

5-14

In Formulae 5-1 to 5-14, $Y_1$ to $Y_{13}$ may be each independently selected from a deuterium atom, a halogen atom, a hydroxyl group, a cyano group, a nitro group, a methyl group, an ethyl group, a phenyl group, a naphthyl group, and an anthracenyl group,

* may indicate a binding site to heterocycle,

** may indicate a binding site to one of $R_1$, $R_2$, and $R_4$; and $R_1$, $R_2$, and $R_4$ in Formulae 1a to 1c, 2a to 2c, and 3a to 3c may be each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a methyl group, an ethyl group, an n-propyl group, an iso-propyl group, an n-butyl group, a sec-butyl group, an iso-butyl group, a tert-butyl group, and groups represented by Formulae 7-1 to 7-15.

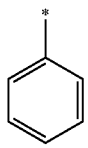

7-1

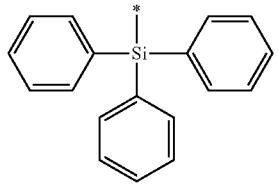

7-2

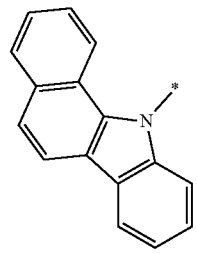

7-3

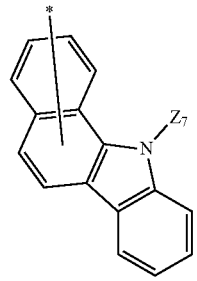

7-4

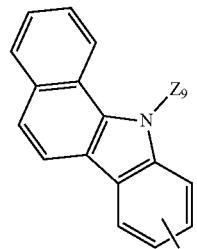

7-5

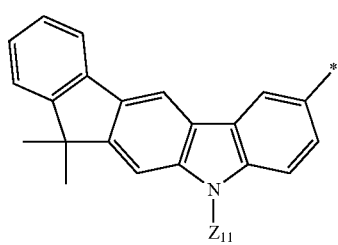

7-6

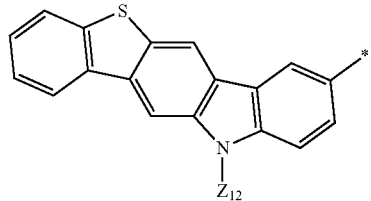

7-7

7-8
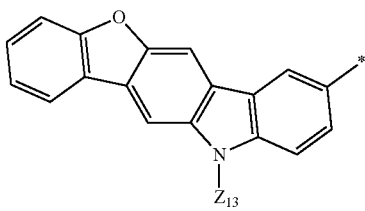

7-9
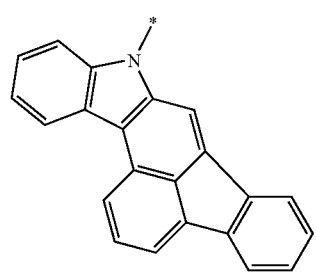

7-10
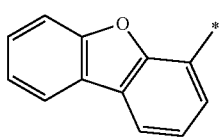

7-11
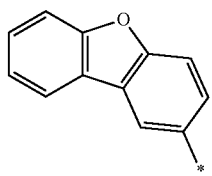

7-12
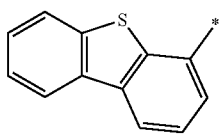

7-13
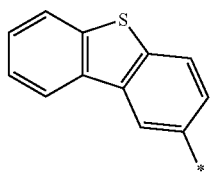

7-14
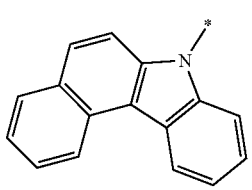

7-15
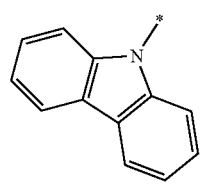

In Formulae 7-1 to 7-15, $Z_7$, $Z_9$, and $Z_{11}$ to $Z_{13}$ may be each independently selected from a deuterium atom, a halogen atom, a hydroxyl group, a cyano group, a nitro group, a methyl group, an ethyl group, a phenyl group, a naphthyl group, and an anthracenyl group, and

* may indicate a binding site to one of $L_1$, $L_2$, and $L_4$.

In an implementation, the heterocyclic compound of Formula 1 above may be one selected from Compounds 1 to 68 below.

1
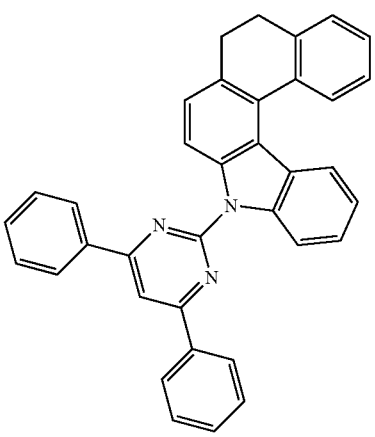

2
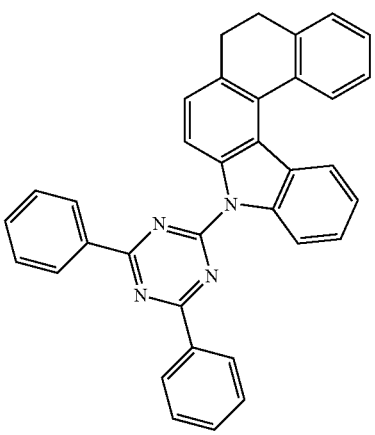

3
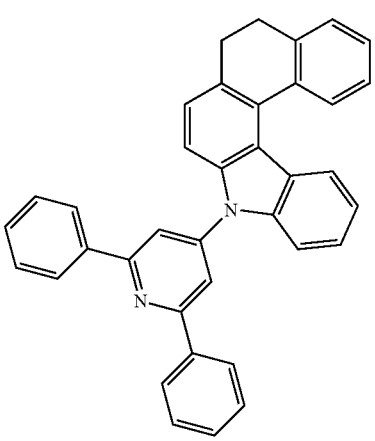

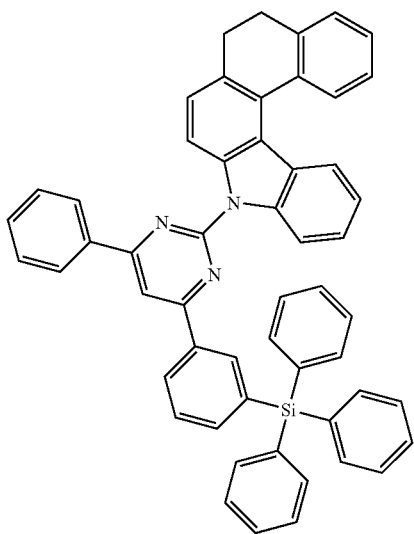
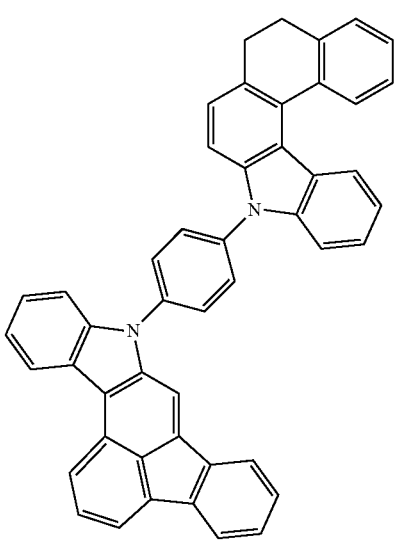
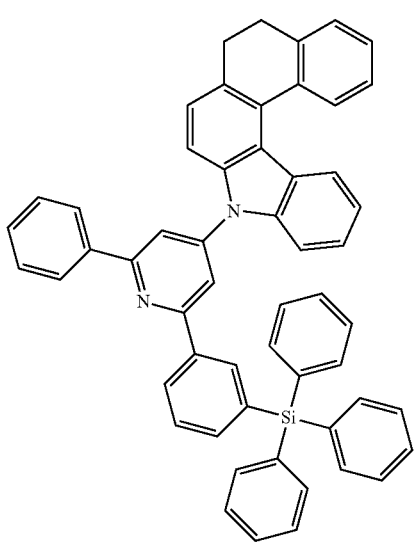
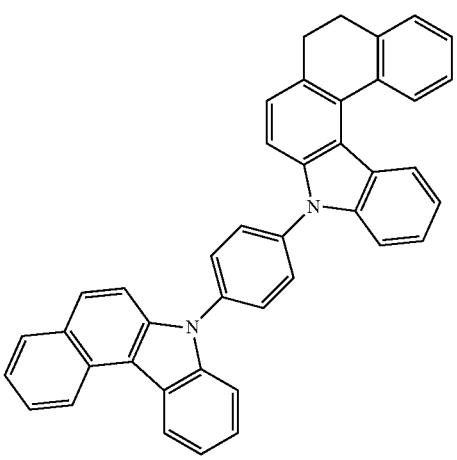
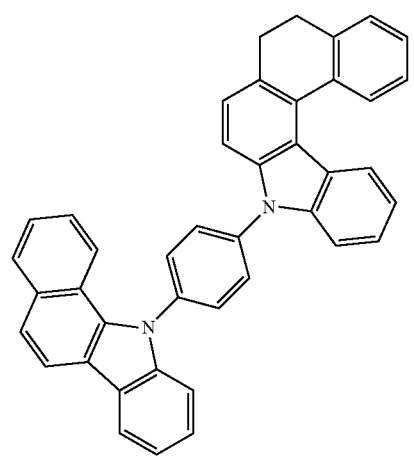
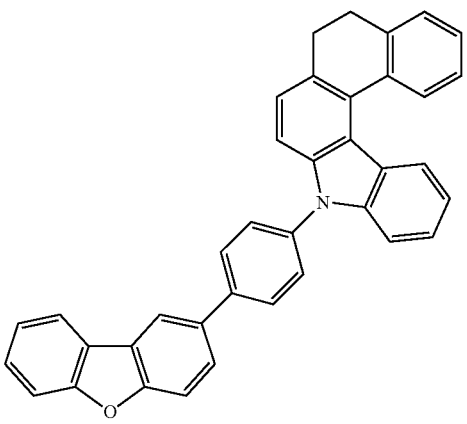

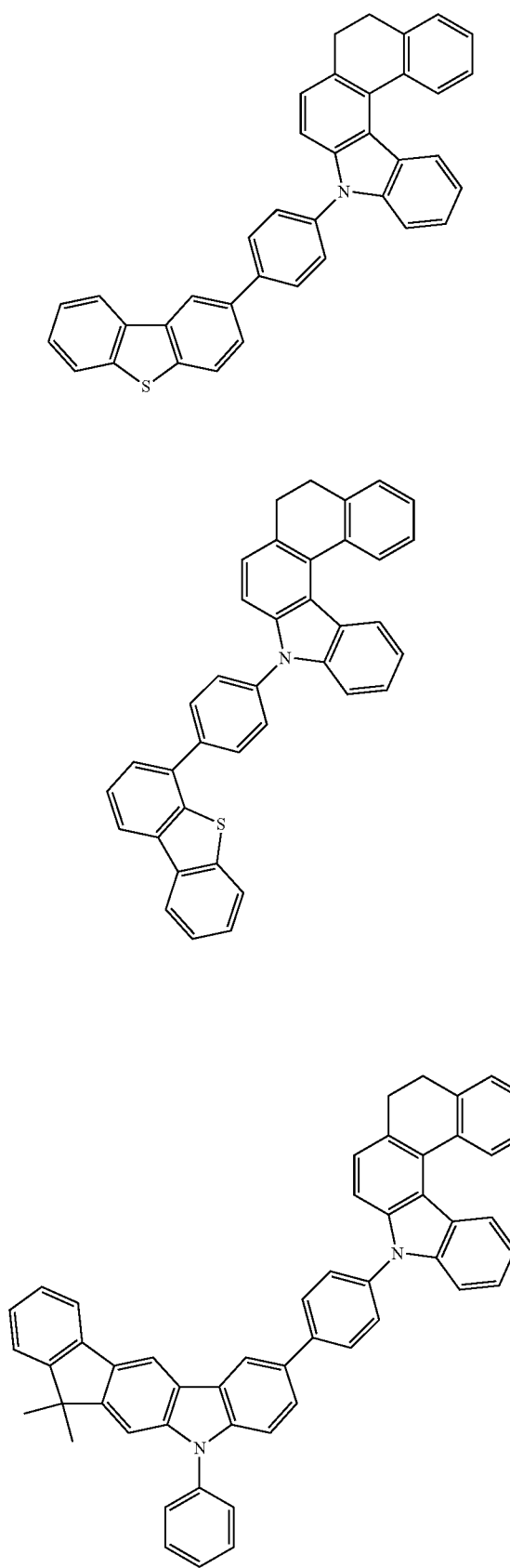
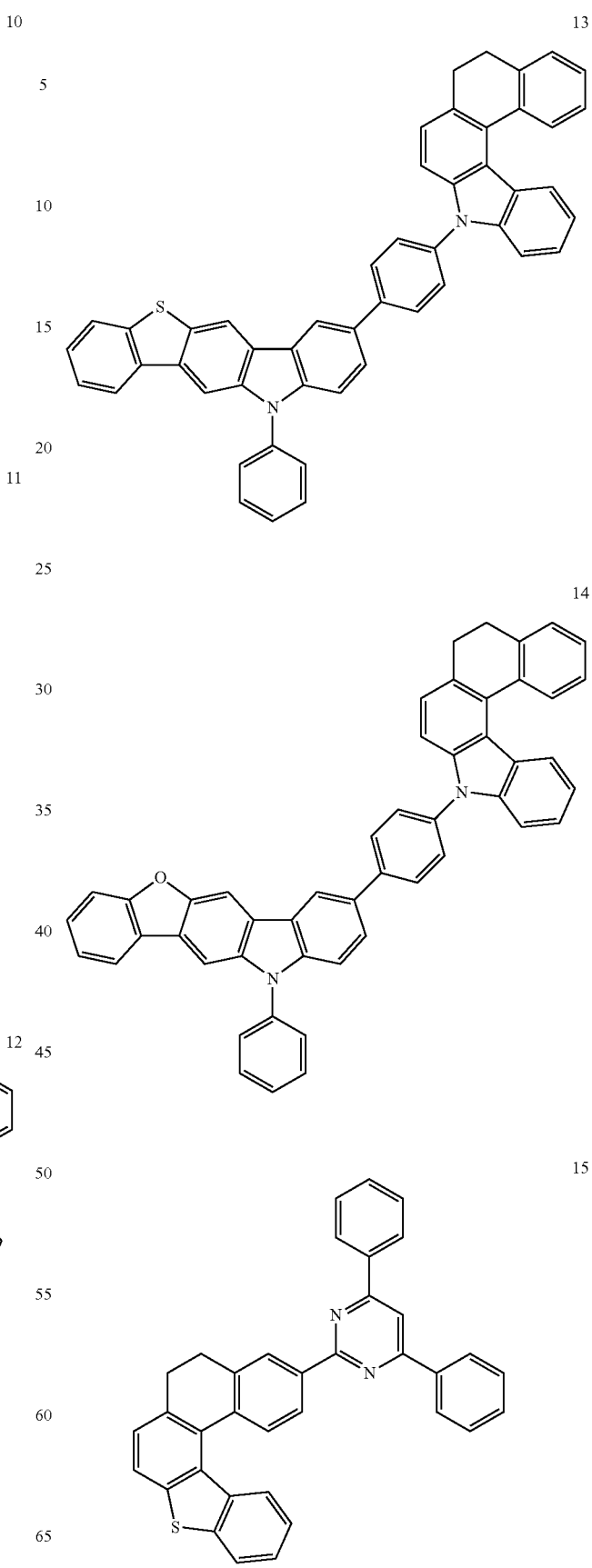

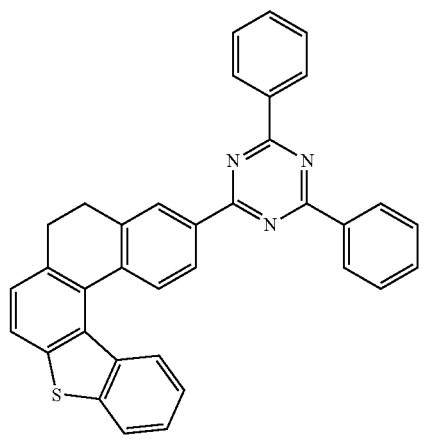
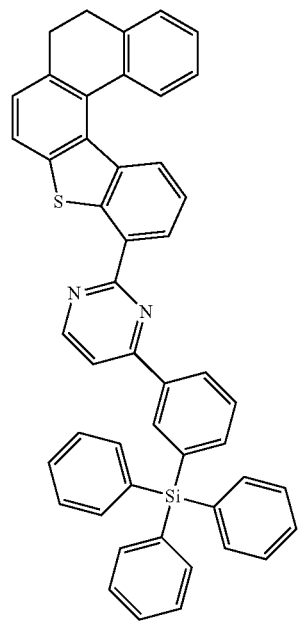
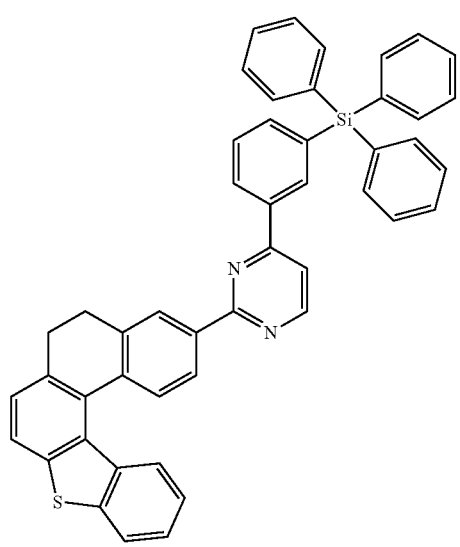
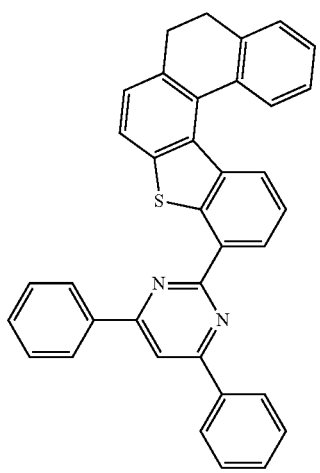

22
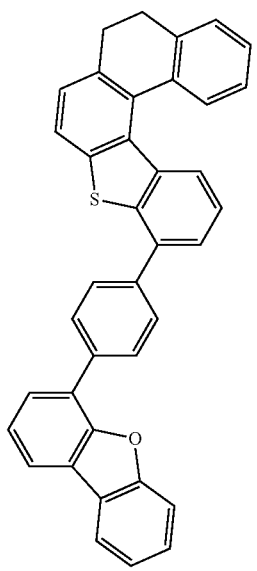
23
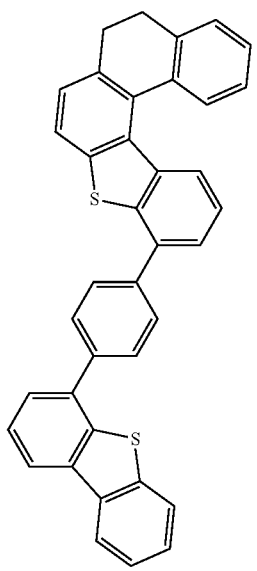
24
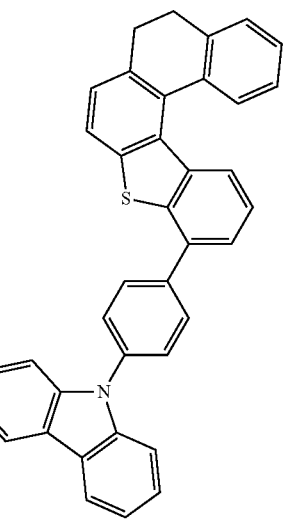
25
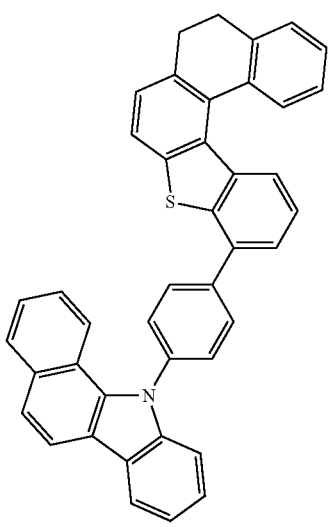
26
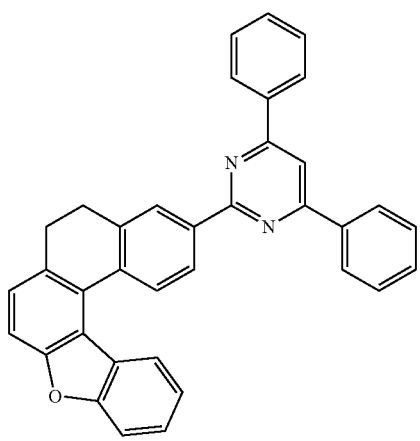
27
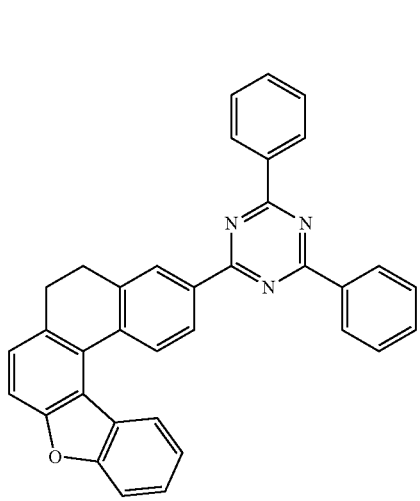

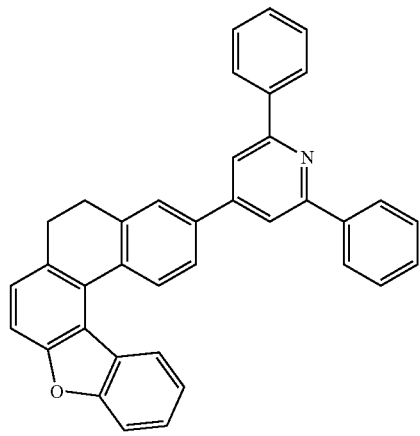
28
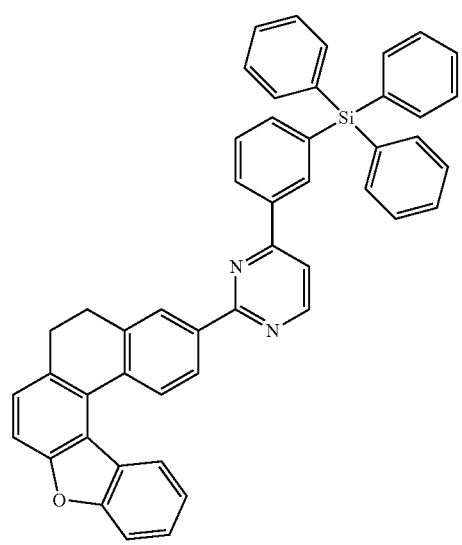
29
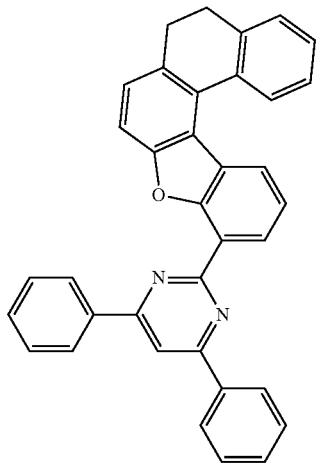
31
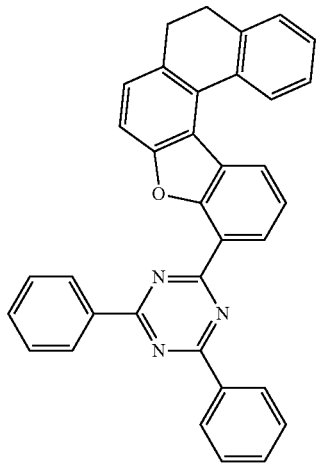
32
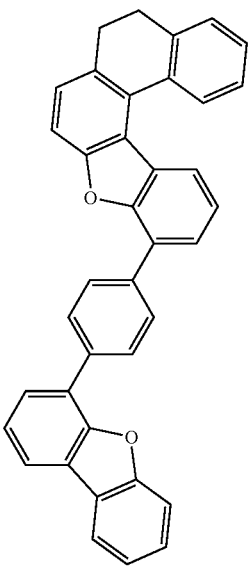
33
30

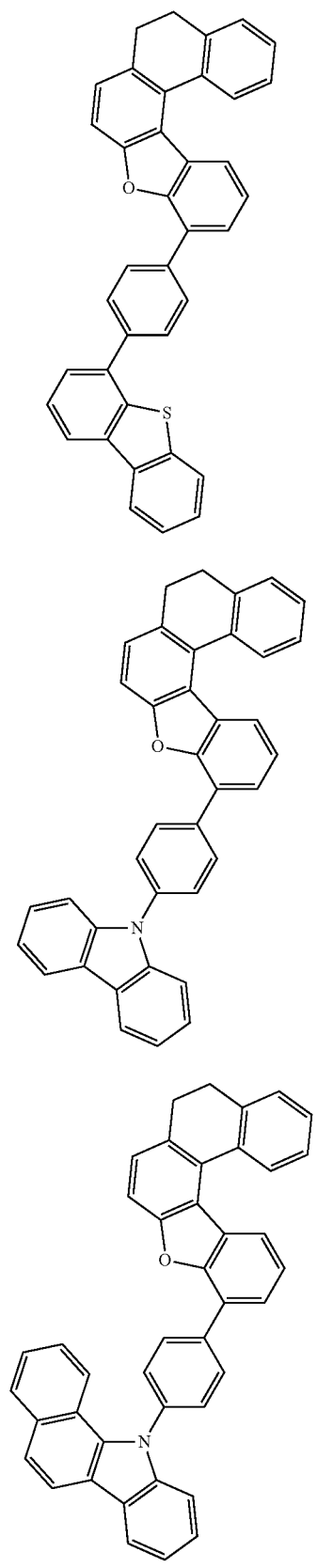
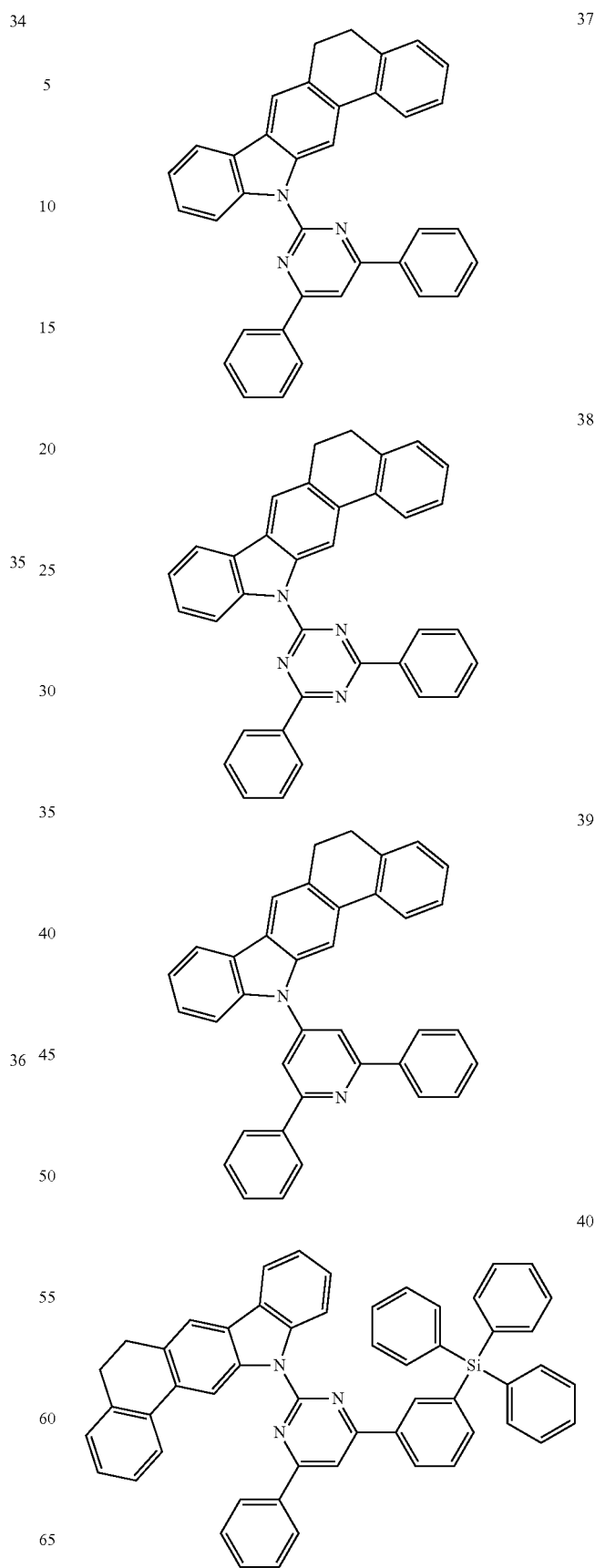

41
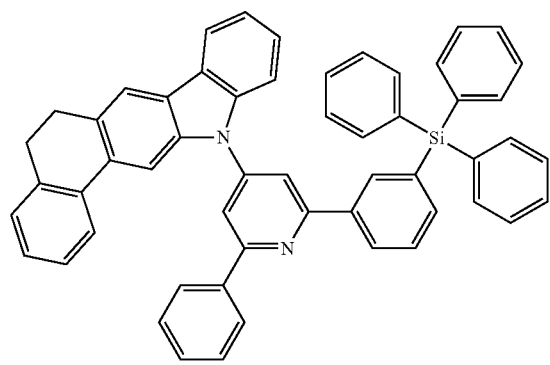
42
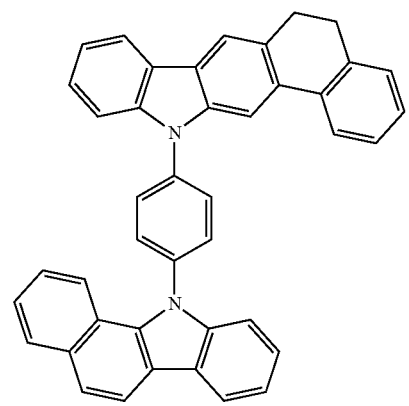
43
44
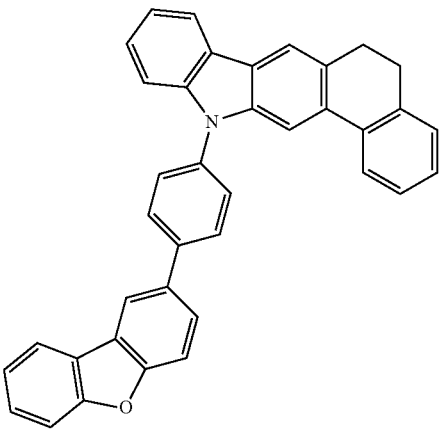
45
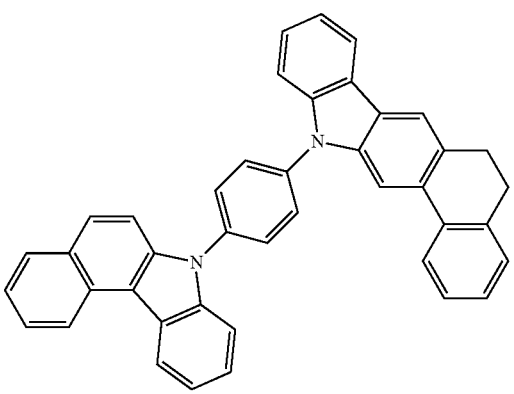
46
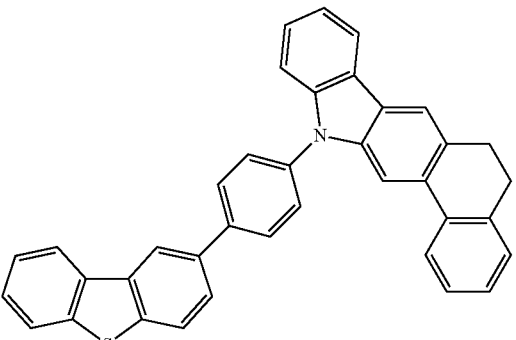
47
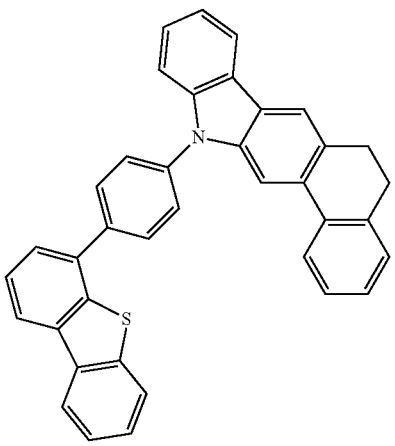

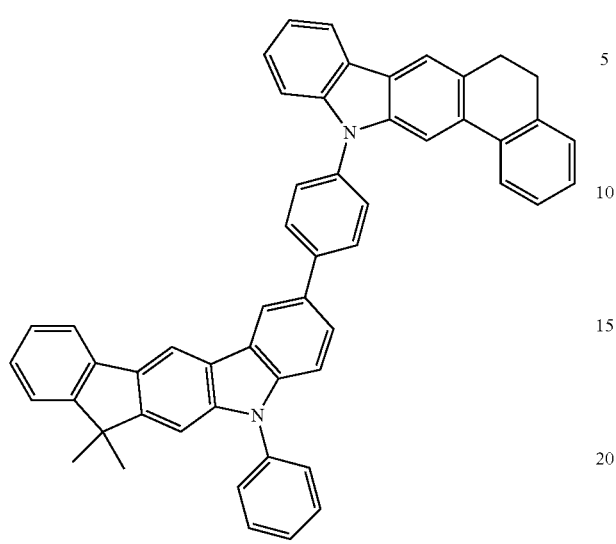
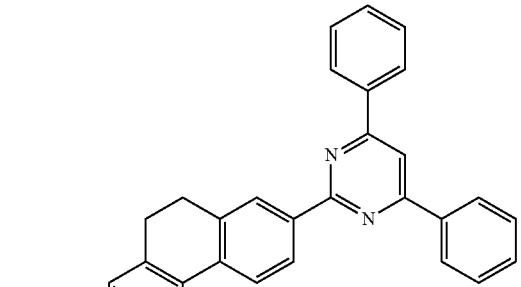

-continued
54
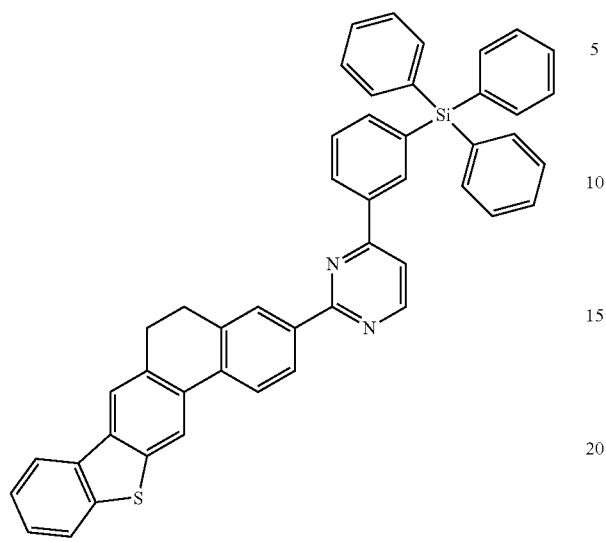
57
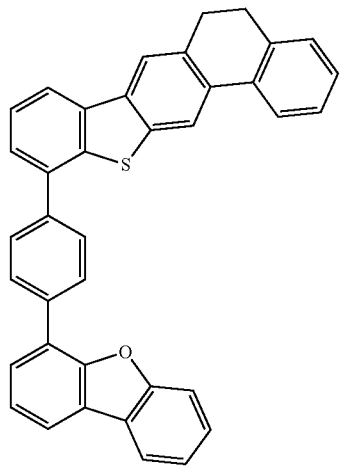
55
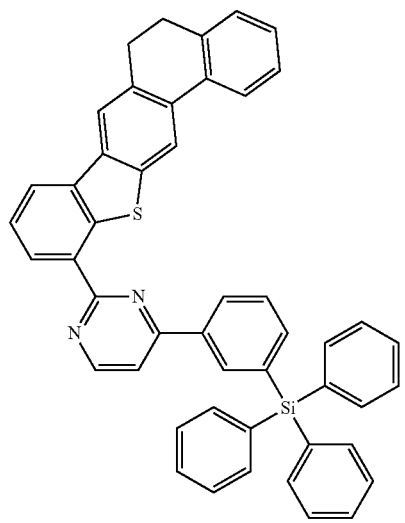
58
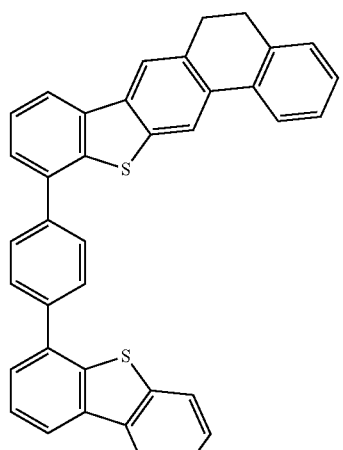
56
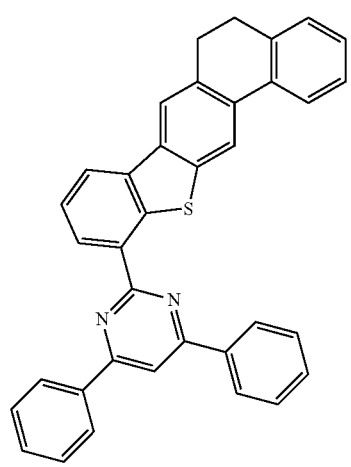
59
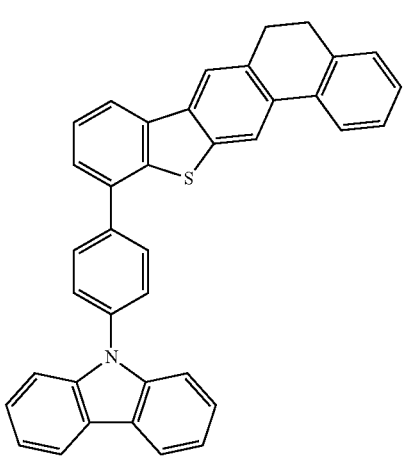

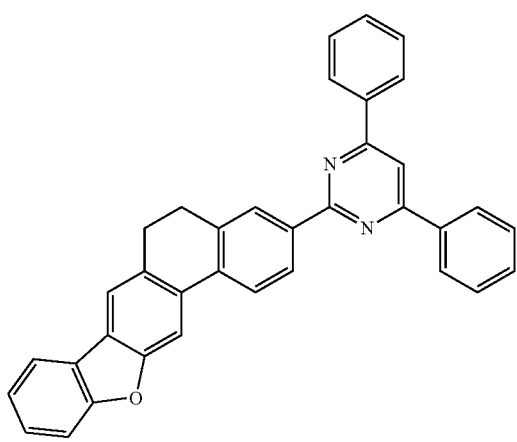
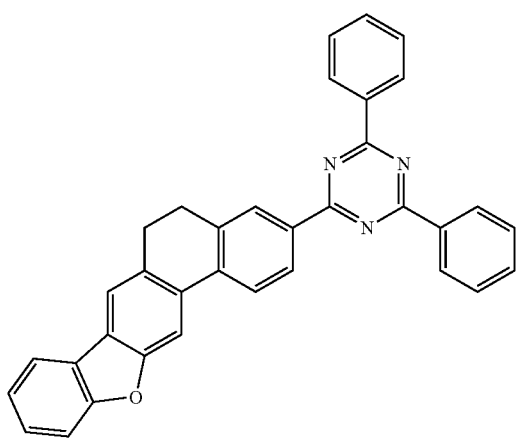
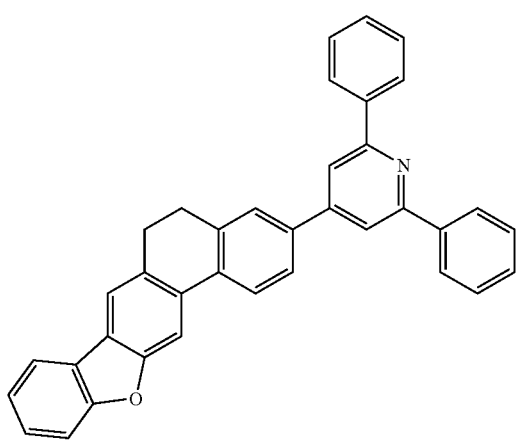
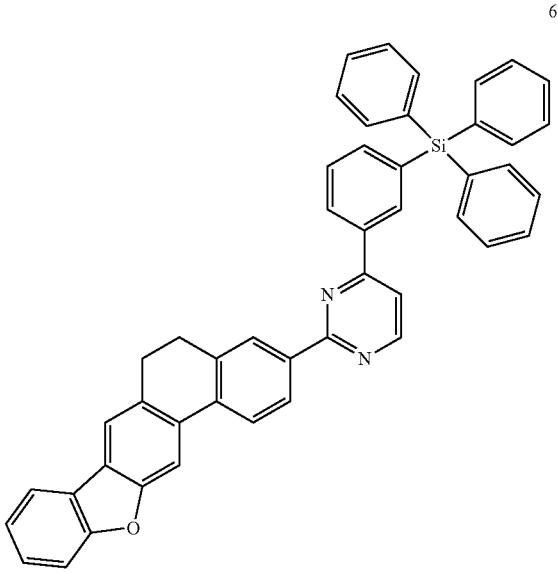
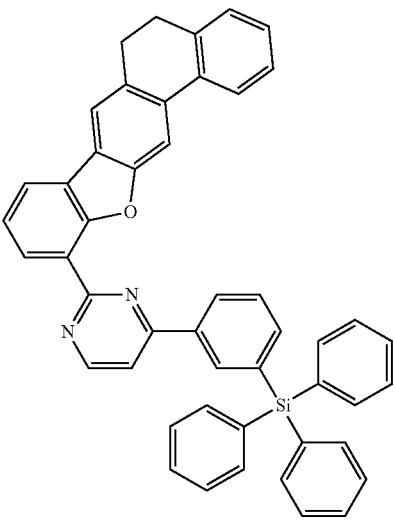
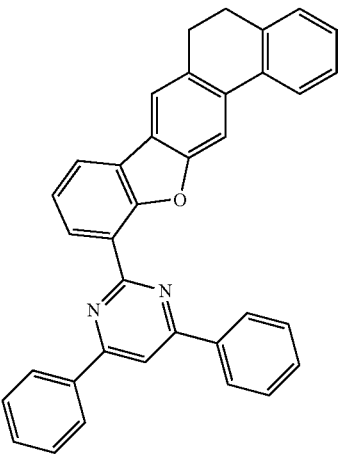

-continued

66

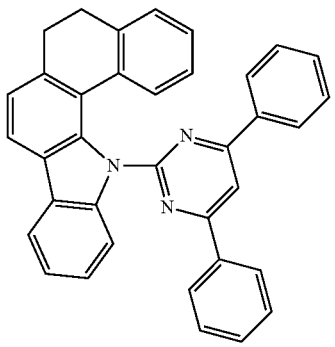

67

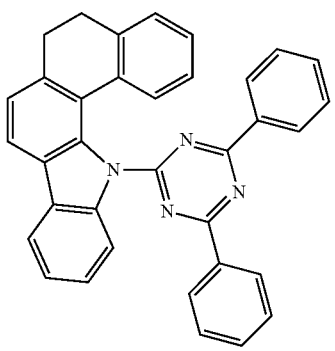

68

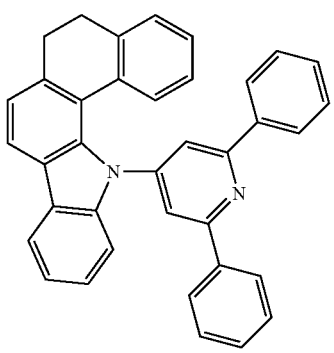

The heterocyclic compound of Formula 1 above may be thermally stable and may have a high triplet state energy level. Thus, an OLED including the heterocyclic compound of Formula 1 may have improved lifetime characteristics and improved efficiency.

As illustrated in Formula 1' below, some carbon atoms may not be involved in a conjugate structure, so that the heterocyclic compound of Formula 1 above may have a high triplet state energy level. Accordingly, an organic light-emitting device including the heterocyclic compound of Formula 1 may have an increased efficiency and injection of electrons into an emission layer may be facilitated.

<Formula 1'>

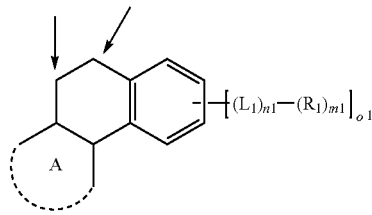

At least one of the heterocyclic compounds of Formula 1 above may be used between a pair of electrodes in an organic light-emitting device. In an implementation, at least one of the heterocyclic compounds of Formula 1 above may be used in an emission layer. For example, at least one of the heterocyclic compounds of Formula 1 above may be used as a host in the emission layer.

According to another embodiment, an organic light-emitting device may include a first electrode, a second electrode disposed opposite to the first electrode, and an organic layer between the first electrode and the second electrode. The organic layer may include at least one of the heterocyclic compounds of Formula 1 described above.

As used herein, "(for example, the organic layer) including at least one heterocyclic compound means that "(the organic layer) including one of the heterocyclic compounds of Formula 1 above, or at least two different heterocyclic compounds of Formula 1 above".

In an implementation, the organic layer may include only Compound 1 above as the heterocyclic compound of Formula 1 above. In this regard, Compound 1 above may be present in a hole transport layer of the organic light-emitting device. In an implementation, the organic layer may include Compounds 1 and 2 as the heterocyclic compound of Formula 1. In this regard, Compound 1 and Compound 2 may be in the same layer, e.g., in the emission layer, or in first and second emission layers of the organic light-emitting device.

The organic layer may include a hole transport region between the first electrode and the emission layer, and an electron transport region between the emission layer and the second electrode. The hole transport region may include at least one of a hole injection layer, a hole transport layer, a functional layer (hereinafter, a "H-functional layer") having both hole injection and hole transport capabilities, a buffer layer, and an electron blocking layer. The electron transport region may include at least one of a hole blocking layer, an electron transport layer, and an electron injection layer.

For example, the heterocyclic compound of Formula 1 above may be present in the emission layer. In an implementation, the emission layer may further include a dopant, and the heterocyclic compound in the emission layer may serve as a host.

The term "organic layer" as used herein may refer to a single layer and/or a plurality of layers disposed between the first and second electrodes of the organic light-emitting device.

The FIGURE illustrates a schematic sectional view of an organic light-emitting device 100 according to an embodiment. Hereinafter, a structure of an organic light-emitting device according to an embodiment and a method of manufacturing the same will now be described with reference the FIGURE.

Referring to the FIGURE, the organic light-emitting device 100 may include a substrate 110, a first electrode 120, an organic layer 130, and a second electrode 140.

The substrate 110 may be a suitable substrate for organic light-emitting devices. In an implementation, the substrate 11 may be a glass substrate or a transparent plastic substrate with strong mechanical strength, thermal stability, transparency, surface smoothness, ease of handling, and water resistance.

The first electrode 120 may be formed by depositing or sputtering a first electrode-forming material on the substrate 11. When the first electrode 120 constitutes an anode, a material having a high work function may be used as the first electrode-forming material to facilitate hole injection. The first electrode 120 may be a reflective electrode or a transmission electrode. Transparent and conductive materials such as ITO, IZO, $SnO_2$, and ZnO may be used to form the first electrode. The first electrode 120 may be formed as a reflective electrode using magnesium (Mg), aluminum (Al), aluminum-lithium (Al—Li), calcium (Ca), magnesium-indium (Mg—In), magnesium-silver (Mg—Ag), or the like.

The first electrode 120 may have a single-layer structure or a multi-layer structure including at least two layers. For example, the first electrode 120 may have a three-layered structure of ITO/Ag/ITO.

The organic layer 130 may be disposed on the first electrode 120.

The organic layer 130 may include a hole injection layer (HIL) 131, a hole transport layer (HTL) 132, a functional layer (not shown, also referred to as a H-functional layer) having both hole injection and transport capabilities, a buffer layer (not shown), an emission layer (EML) 133, an electron transport layer (ETL) 134, and/or an electron injection layer (EIL) 135.

The HIL 131 may be formed on the first electrode 120 by any of a variety of methods, e.g., including vacuum deposition, spin coating, casting, Langmuir-Blodgett (LB) deposition, or the like.

When the HIL 131 is formed using vacuum deposition, vacuum deposition conditions may vary depending on the compound that is used to form the HIL, and the desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec.

When the HIL 131 is formed using spin coating, the coating conditions may vary depending on the compound that is used to form the HIL, and the desired structure and thermal properties of the HIL to be formed. For example, the coating rate may be in the range of about 2,000 rpm to about 5,000 rpm, and a temperature at which heat treatment is performed to remove a solvent after coating may be in the range of about 80° C. to about 200° C.

A material for forming the HIL 131 may be a suitable hole injection material. Examples of the suitable hole injection material may include N,N'-diphenyl-N,N'-bis-[4-(phenyl-m-tolyl-amino)-phenyl]-biphenyl-4,4'-diamine (DNTPD), a phthalocyanine compound such as copper phthalocyanine, 4,4',4"-tris(3-methylphenylphenylamino)triphenylamine (m-MTDATA), N,N'-di(1-naphthyl)-N,N'-diphenylbenzidine (NPB), 4,4',4"-tris(N,N-diphenylamino)triphenylamine (TDATA), 4,4',4"-tris[2-naphthyl(phenyl)amino]triphenylamine) (2-TNATA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), and polyaniline)/poly(4-styrenesulfonate (PANI/PSS).

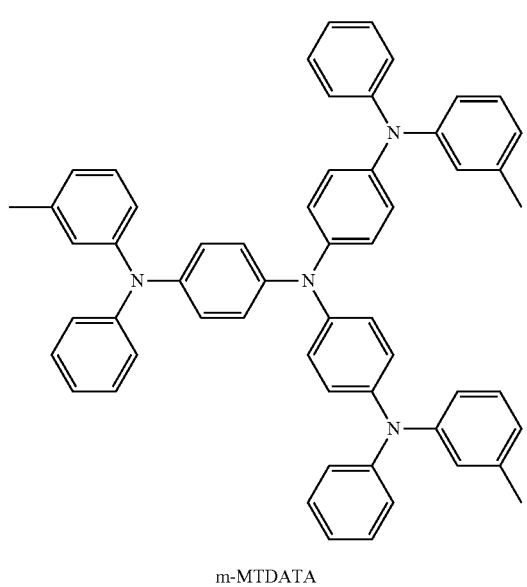

m-MTDATA

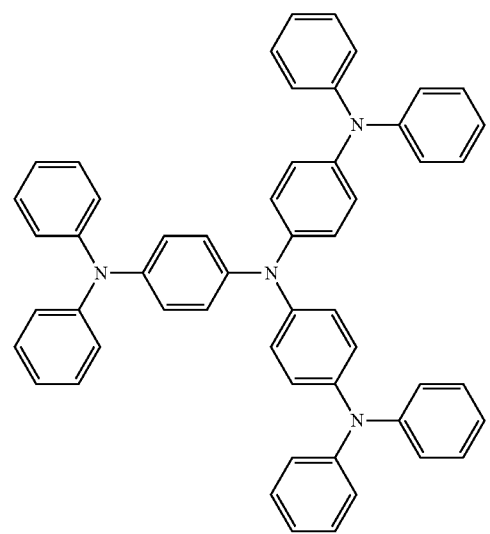

TDATA

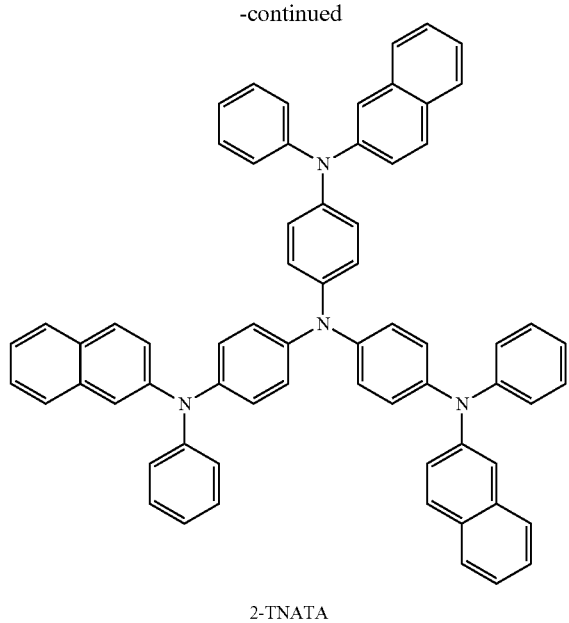

2-TNATA

The thickness of the HIL 131 may be about 100 Å to about 10,000 Å, e.g., about 100 Å to about 1,000 Å. When the thickness of the HIL 131 is within these ranges, the HIL 131 may have good hole injecting ability without a substantial increase in driving voltage.

The H-functional layer (having both hole inject and hole transport capabilities) may contain at least one material from each group of the hole injection layer materials and hole transport layer materials. The thickness of the H-functional layer may be from about 500 Å to about 10,000 Å, e.g., about 100 Å to about 1,000 Å. When the thickness of the H-functional layer is within these ranges, the H-functional layer may have good hole injection and transport capabilities without a substantial increase in driving voltage.

In an implementation, at least one of the HIL, HTL, and H-functional layer may include at least one of a compound of Formula 300 below and a compound of Formula 350 below:

<Formula 300>

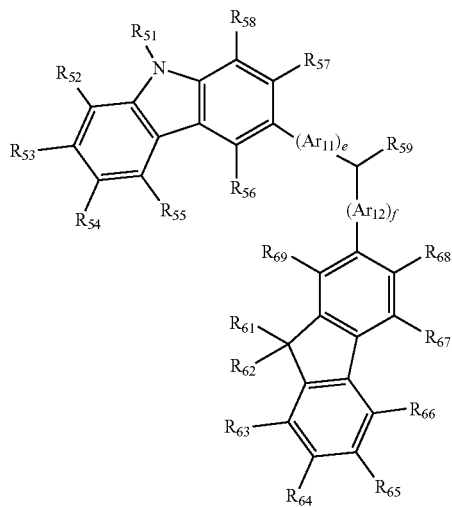

<Formula 350>

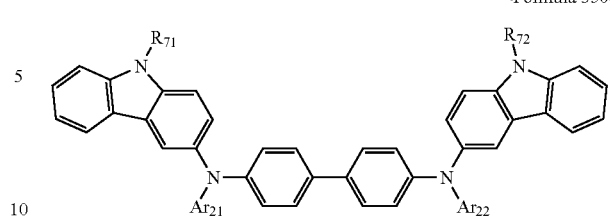

In Formulae 300 and 350 above, $Ar_{11}$, $Ar_{12}$, $Ar_2$, and $Ar_{22}$ may be each independently a substituted or unsubstituted $C_6$-$C_{60}$ arylene group.

In Formula 300, e and f may be each independently an integer of 0 to 5, e.g., 0, 1, or 2. For example, e may be 1, and f may be 0.

In Formulae 300 and 350 above, $R_{51}$ to $R_{58}$, $R_{61}$ to $R_{69}$, and $R_{71}$ and $R_{72}$ may be each independently a hydrogen atom, a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, or a substituted or unsubstituted $C_5$-$C_{60}$ arylthio group. In an implementation, $R_{51}$ to $R_{58}$, $R_{61}$ to $R_{69}$, $R_{71}$, and $R_{72}$ may be each independently one of a hydrogen atom; a deuterium atom; a halogen atom; a hydroxyl group; a cyano group; a nitro group; an amino group; an amidino group; a hydrazine; a hydrazone; a carboxyl group or a salt thereof; a sulfonic acid group or a salt thereof; a phosphoric acid group or a salt thereof; a $C_1$-$C_{10}$ alkyl group (for example, a methyl group, an ethyl group, a propyl group, a butyl group, a pentyl group, a hexyl group, or the like); a $C_1$-$C_{10}$ alkoxy group (for example, a methoxy group, an ethoxy group, a propoxy group, a butoxy group, a pentoxy group, or the like); a $C_1$-$C_{10}$ alkyl group and a $C_1$-$C_{10}$ alkoxy group that are substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof; a phenyl group; a naphthyl group; an anthryl group; a fluorenyl group; a pyrenyl group; and a phenyl group, a naphthyl group, an anthryl group, a fluorenyl group, and a pyrenyl group that are substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{10}$ alkyl group, and a $C_1$-$C_{10}$ alkoxy group.

In Formula 300, $R_{59}$ may be one of a phenyl group, a naphthyl group, an anthryl group, a biphenyl group, a pyridyl group; and a phenyl group, a naphthyl group, an anthryl group, a biphenyl group, and a pyridyl group that are substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{20}$ alkyl group, and a substituted or unsubstituted $C_1$-$C_{20}$ alkoxy group.

In an implementation, the compound of Formula 300 may be a compound represented by Formula 300A below.

<Formula 300A>

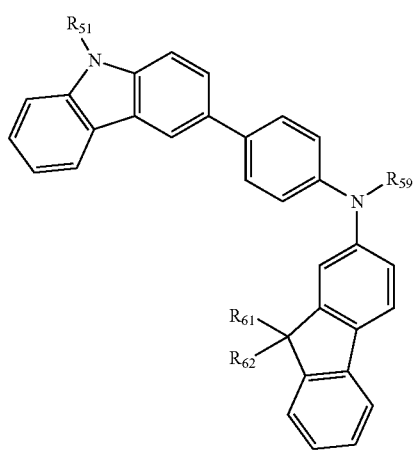

In Formula 300A above, $R_{51}$, $R_{60}$, $R_{61}$, and $R_{59}$ may be as defined above.

In an implementation, at least one of the HIL, HTL, and H-functional layer may include at least one of compounds represented by Formulae 301 to 320 below.

301

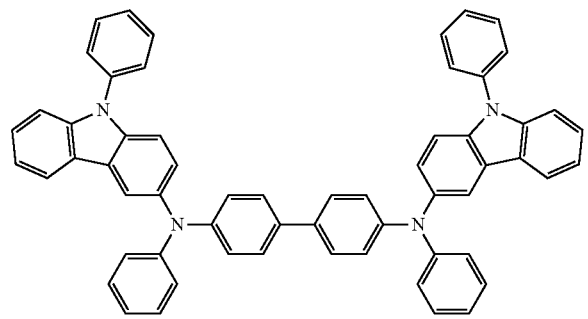

302

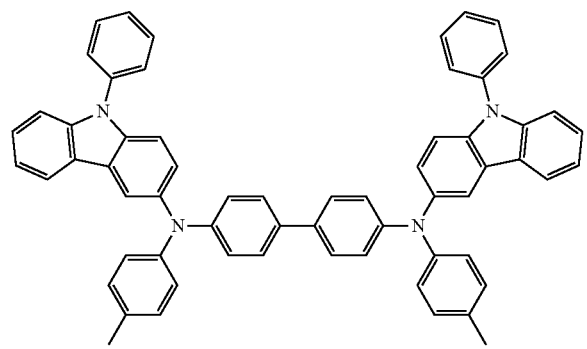

303

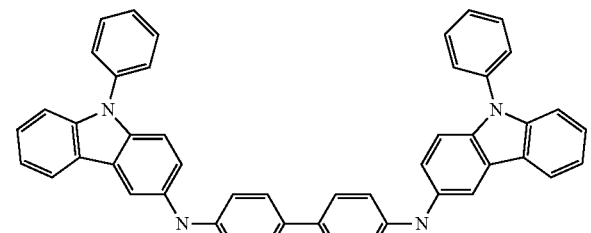

304

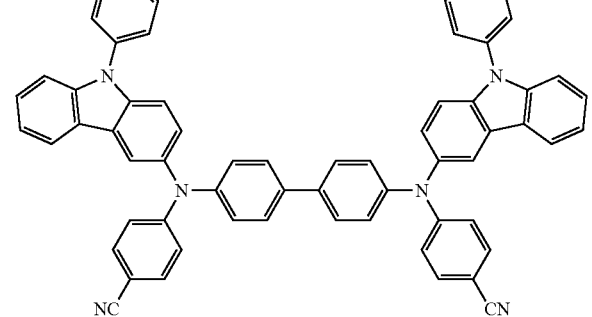

305

306

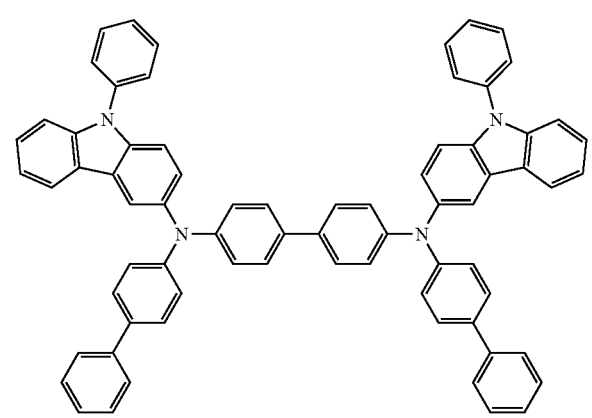

307
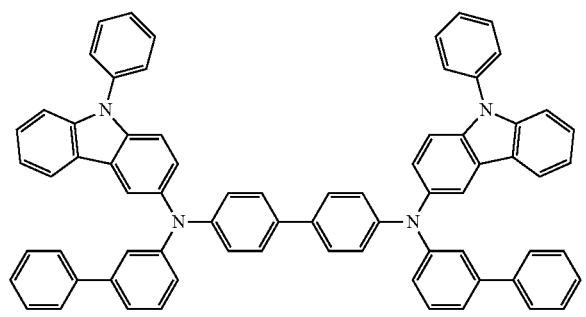
308
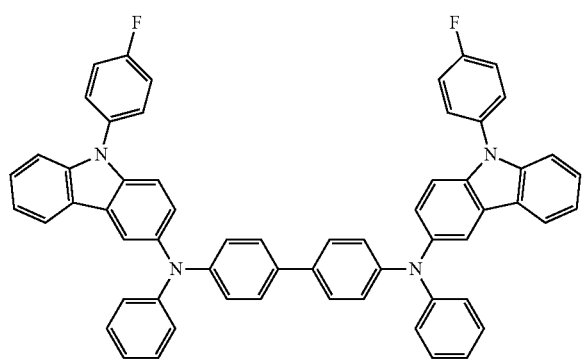
309
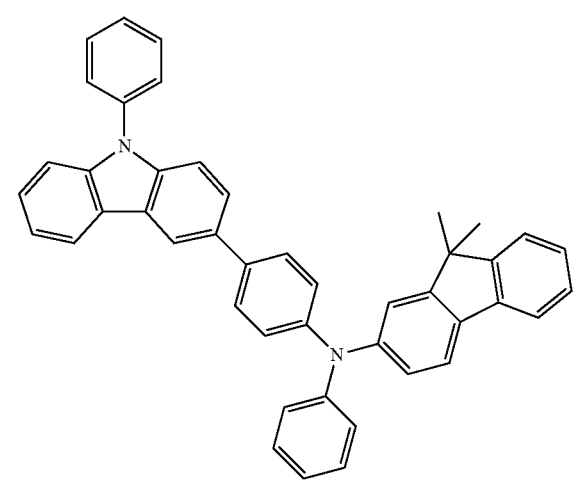
310
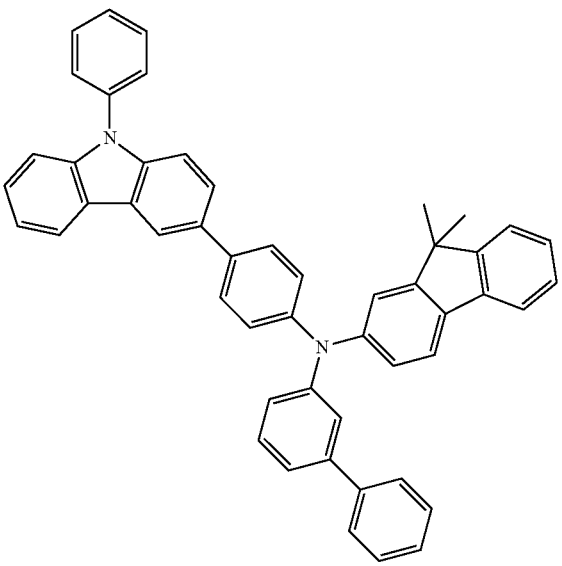
311
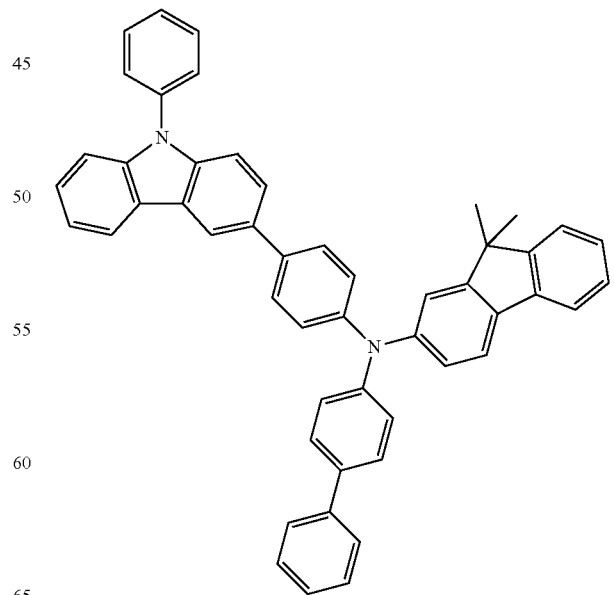

312
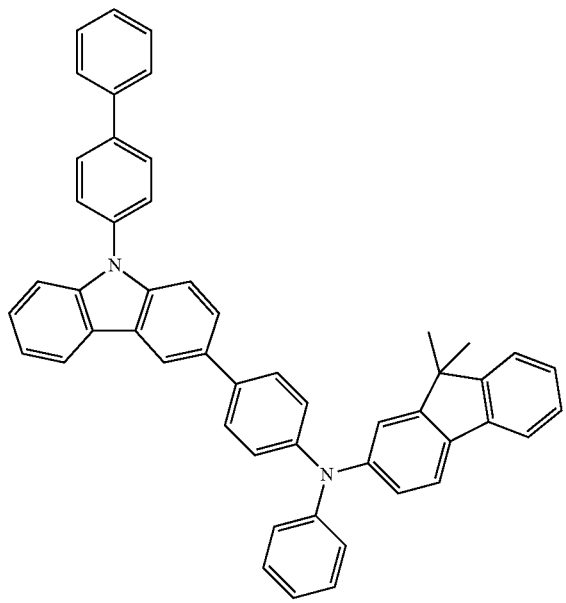
313
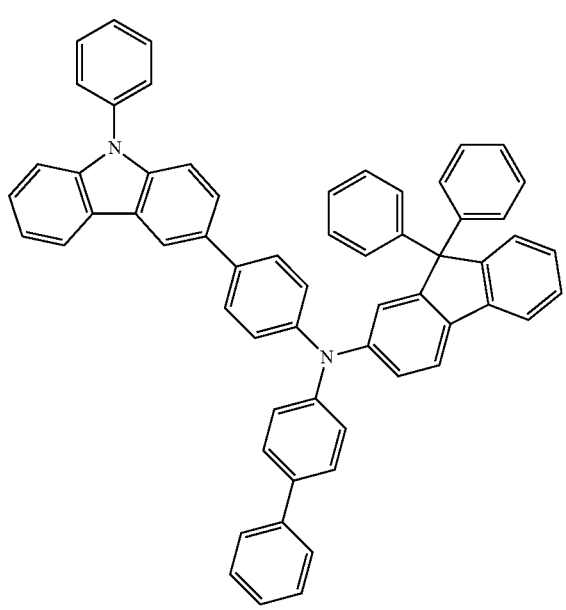
314
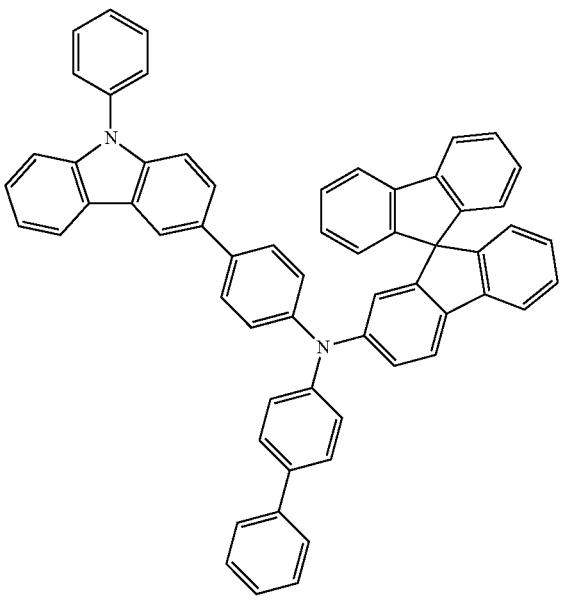
315
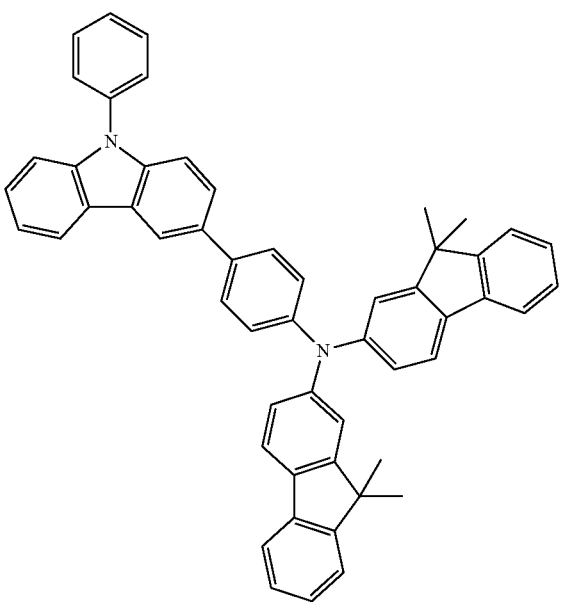

316

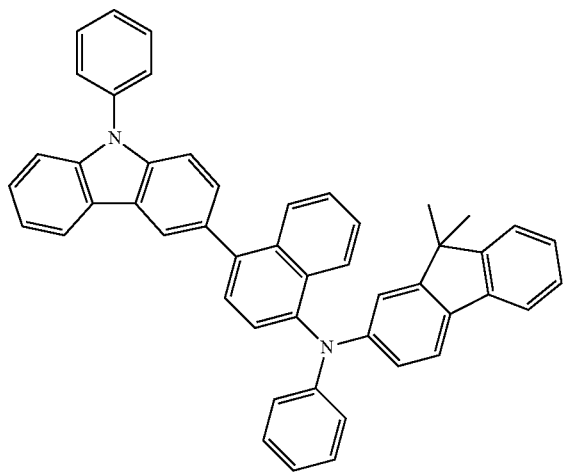

317

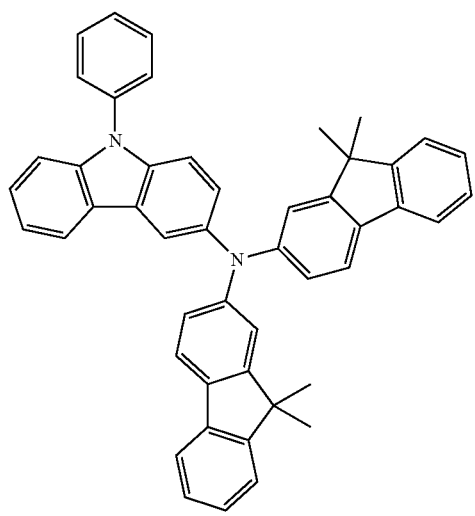

318

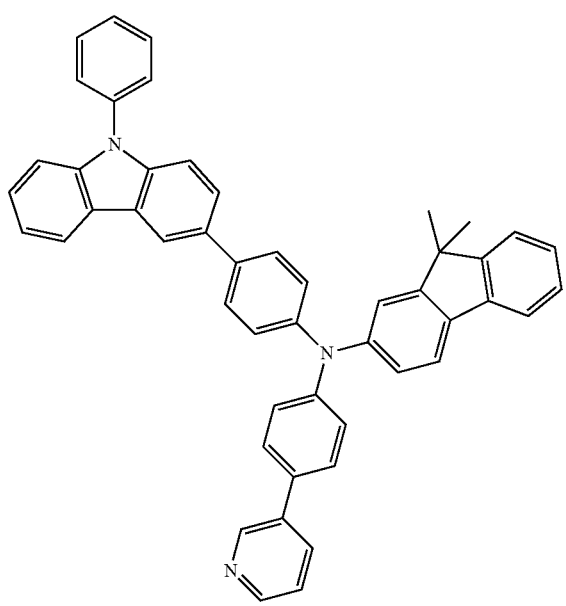

319

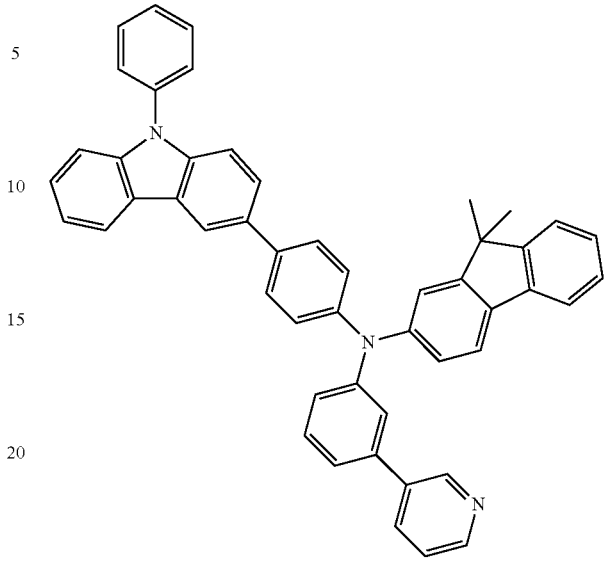

320

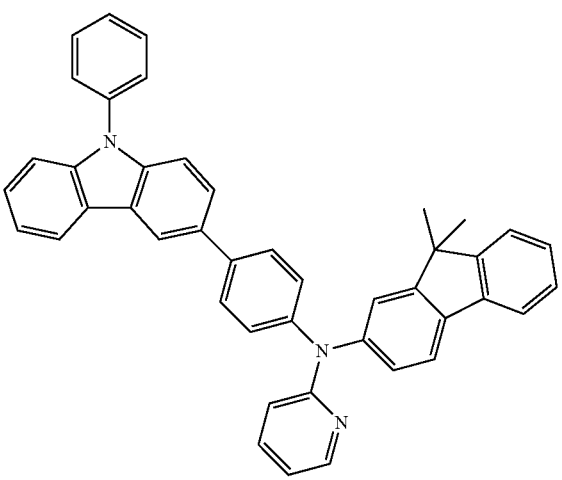

At least one of the HIL, HTL, and H-functional layer may further a p-dopant to help improve the conductivity of a layer, in addition to a suitable hole injecting material, hole transport material, and/or material having both hole injection and hole transport capabilities as described above.

The HIL 131 may further include a p-dopant, in addition to such a HIL material as described above, to have improved conductivity. Examples of the p-dopant may include quinone derivatives such as tetracyanoquinonedimethane (TCNQ), 2,3,5,6-tetrafluoro-tetracyano-1,4-benzoquinonedimethane (F4TCNQ), and the like; metal oxides such as tungsten oxide, molybdenum oxide, and the like; and cyano-containing compounds such as Compound 100 below.

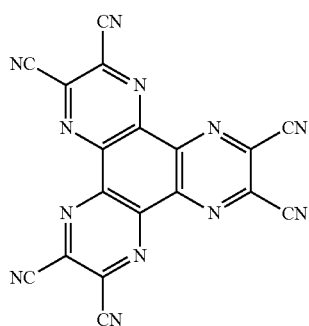

<Compound 100>

When the HIL 131 further includes such a p-dopant as described above, the p-dopant may be homogeneously dispersed or heterogeneously distributed in the HIL.

Then, the HTL 132 may be formed on the HIL 131 by using vacuum deposition, spin coating, casting, Langmuir-Blodgett (LB) deposition, or the like. When the HTL 132 is formed using vacuum deposition or spin coating, the conditions for deposition and coating may be similar to those for the formation of the HIL, though the conditions for the deposition and coating may vary depending on the material that is used to form the HTL.

Examples of suitable known hole transport materials may include carbazole derivatives, such as N-phenylcarbazole or polyvinylcarbazole, N,N'-bis(3-methylphenyl)-N,N'-diphenyl-[1,1-biphenyl]-4,4'-diamine, 4,4',4''-tris(N-carbazolyl)triphenylamine (TCTA), and N,N'-di(1-naphthyl)-N,N'-diphenylbenzidine) (NPB).

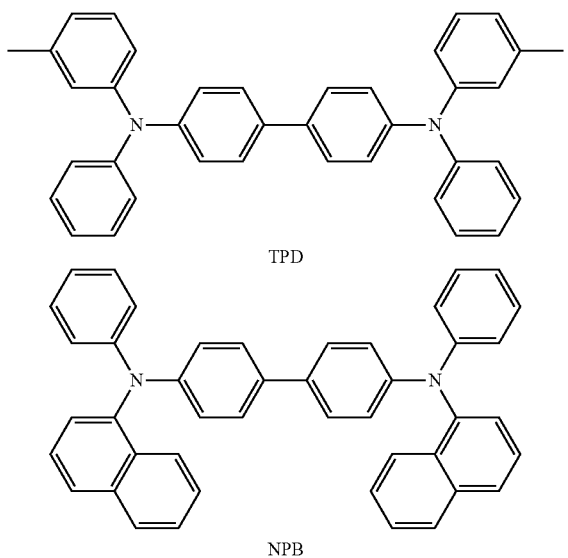

TPD

NPB

The thickness of the HTL 132 may be from about 50 Å to about 2,000 Å, e.g., about 100 Å to about 1500 Å. When the thickness of the HTL 132 is within these ranges, the HTL 132 may have good hole transporting ability without a substantial increase in driving voltage.

The H-functional layer (having both hole injection and hole transport capabilities) may contain at least one material from each group of the hole injection layer materials and hole transport layer materials. The thickness of the H-functional layer may be from about 500 Å to about 10,000 Å, e.g., about 100 Å to about 1,000 Å. When the thickness of the H-functional layer is within these ranges, the H-functional layer may have good hole injection and transport capabilities without a substantial increase in driving voltage.

At least one of the HIL, HTL, and H-functional layer may further include a p-dopant to have improved conductivity, in addition to another suitable hole injecting material, a suitable hole transport material, and/or a suitable material having both hole inject and hole transport capabilities as described above.

For example, the p-dopant may be one of quinone compounds derivatives, metal oxides, and compounds with a cyano group. Examples of the p-dopant may include quinone derivatives such as tetracyanoquinonedimethane (TCNQ), 2,3,5,6-tetrafluoro-tetracyano-1,4-benzoquinonedimethane (F4-TCNQ), and the like; metal oxides such as tungsten oxide, molybdenum oxide, and the like; and cyano-containing compounds such as Compound 200 below.

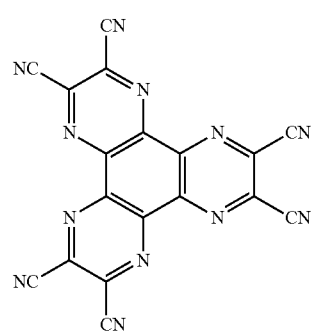

<Compound 200>

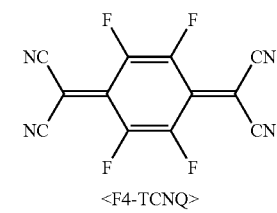

<F4-TCNQ>

When the HIL, HTL, or H-functional layer further includes a p-dopant, the p-dopant may be homogeneously dispersed or heterogeneously distributed in the layer.

A buffer layer may be disposed between at least one of the HIL, HTL, and H-functional layer, and the EML. The buffer layer may help compensate for an optical resonance distance of light according to a wavelength of the light emitted from the EML, and thus may help increase efficiency. The butter layer may include a suitable hole injecting material or hole transporting material. In an implementation, the buffer layer may include the same material as one of the materials included in the HIL, HTL, and H-functional layer that underlie the buffer layer.

Then, the EML 133 may be formed on the HTL, H-functional layer, or buffer layer by vacuum deposition, spin coating, casting, Langmuir-Blodgett (LB) deposition, or the like. When the EML 133 is formed using vacuum deposition or spin coating, the deposition and coating conditions may be similar to those for the formation of the HIL, though the conditions for deposition and coating may vary depending on the material that is used to form the EML.

The EML 133 may include a suitable light-emitting material. For example, the EML 133 may include the heterocyclic compound of Formula 1 above. In an implementation, the EML 133 layer may include a suitable host and a suitable dopant.

Examples of the suitable host may include Alq₃ (tris(8-quinolinolato)aluminum), CBP (4,4'-N,N'-dicarbazole-biphenyl), PVK (poly(n-vinylcarbazole)), ADN (9,10-di(naphthalene-2-yl)anthracene), TCTA (4,4',4''-tris(carbazole-9-yl)triphenylamine), TPBI (1,3,5-tris(N-phenylbenzimidazole-2-yl)benzene), TBADN (3-tert-butyl-9,10-di(naphth-2-yl)anthracene), mCP (9,9'-(1,3-phenylene) bis-9H-carbazole), and OXD-7 (1,3-bis[2-(4-tert-butylphenyl)-1,3,4-oxadiazo-5-yl]).

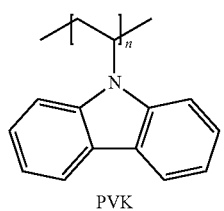

PVK

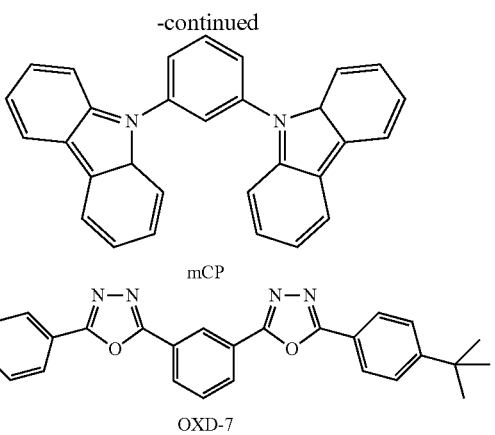

mCP

OXD-7

For example, the dopant may be at least one of a fluorescent dopant and a phosphorescent dopant. For example, the phosphorescent dopant may be an organometallic complex including at least one selected from among iridium (Ir), platinum (Pt), osmium (Os), rhenium (Re), titanium (Ti), zirconium (Zr), hafnium (Hf), and a combination of at least two thereof.

Examples of suitable blue dopants may include F₂Irpic, (F₂ppy)₂Ir(tmd), Ir(dfppz)₃, ter-fluorene, DPAVBi (4,4'-bis(4-diphenylaminostyryl)biphenyl), TBPe (2,5,8,11-tetra-tert-butyl pherylene), and DPVBi (4,4'-bis(2,2,-biphenylvinyl)-1,1'-biphenyl).

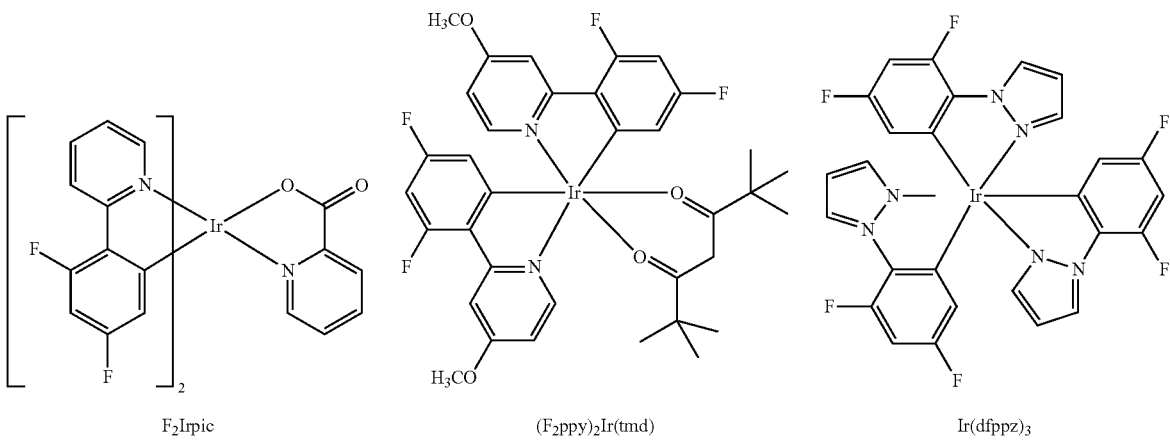

F₂Irpic     (F₂ppy)₂Ir(tmd)     Ir(dfppz)₃

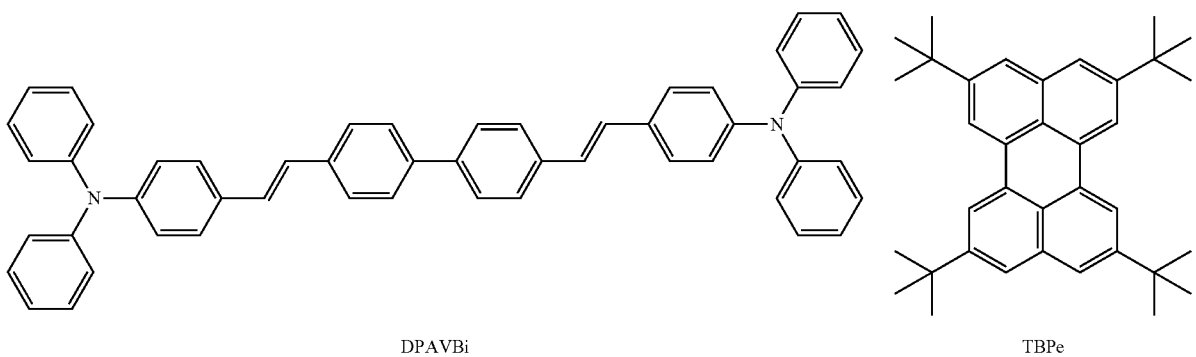

DPAVBi     TBPe

-continued

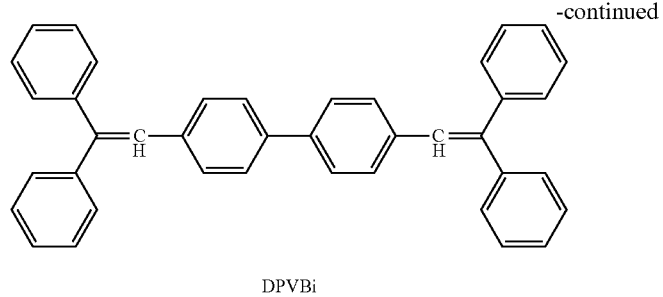

DPVBi

Examples of suitable red dopants may include PtOEP, Ir(piq)$_3$, and BtpIr.

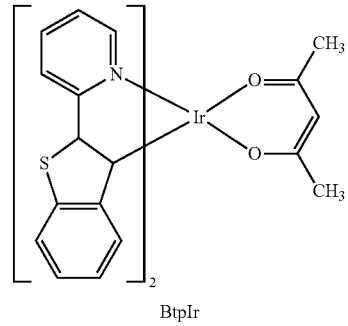

BtpIr

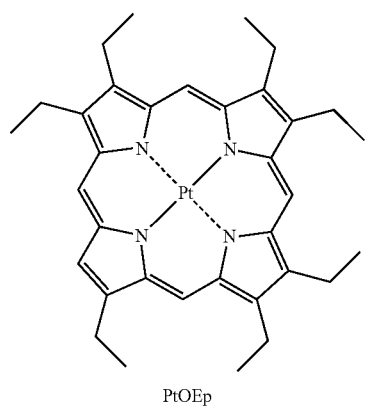

PtOEp

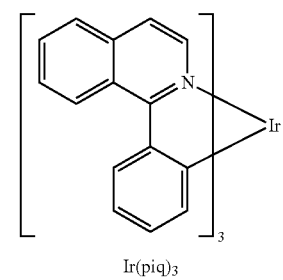

Ir(piq)$_3$

Examples of suitable green dopants may include Ir(ppy)$_3$ (ppy=phenylpyridine), Ir(ppy)$_2$(acac), and Ir(mpyp)$_3$.

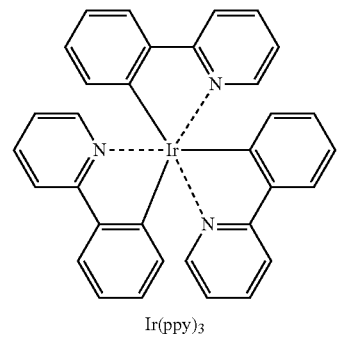

Ir(ppy)$_3$

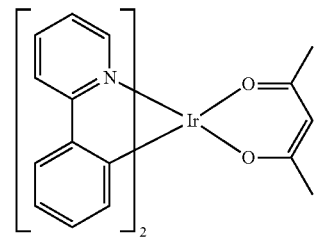

Ir(ppy)$_2$(acac)

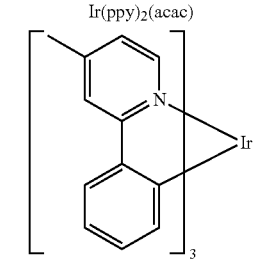

Ir(mpyp)$_3$

When the EML includes both a host and a dopant, an amount of the dopant may be from about 0.01 wt % to about 15 wt %, based on 100 wt % of the EML.

A thickness of the EML may be about 200 Å to about 700 Å. When the thickness of the EML is within these ranges, the EML may have good light emitting ability without a substantial increase in driving voltage.

Then, the ETL 134 may be formed on the EML by any of a variety of methods, e.g., vacuum deposition, spin coating, casting, or the like. When the ETL is formed using vacuum deposition or spin coating, the deposition and coating conditions may be similar to those for the formation of the HIL, though the deposition and coating conditions may vary depending on the compound that is used to form the ETL. A material for forming the ETL may be a suitable material that may stably transport electrons injected from an electron injecting electrode (cathode). Examples of suitable electron transport materials may include a quinoline compound such as tris(8-quinolinorate)aluminum (Alq$_3$), 3-(biphenyl-4-yl)-5-(4-tert-butylphenyl)-4-phenyl-4H-1,2,4-triazole (TAZ), bis(2-methyl-8-quinolinolato-N1,O8)-(1,1'-biphenyl) (Balq), beryllium bis(benzoquinolin-10-olate (Bebq$_2$), 9,10-di(naphthalene-2-yl)anthracene (ADN), Compound 101, Compound 102, and Bphen.

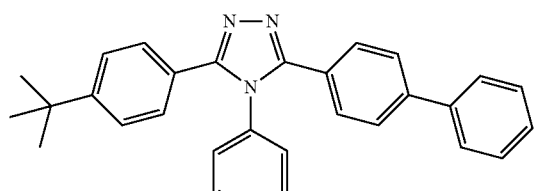

TAZ

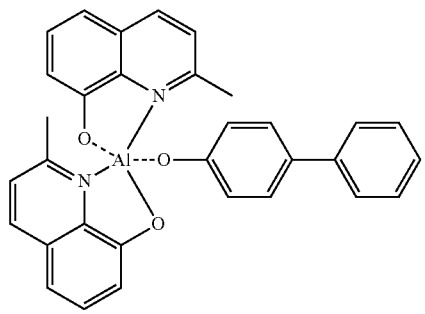

BAlq

<Compound 101>

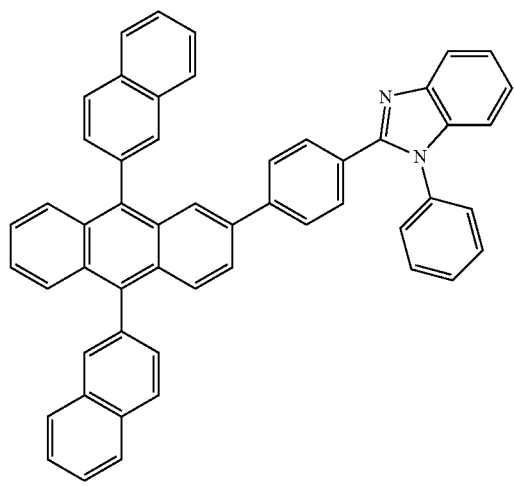

<Compound 102>

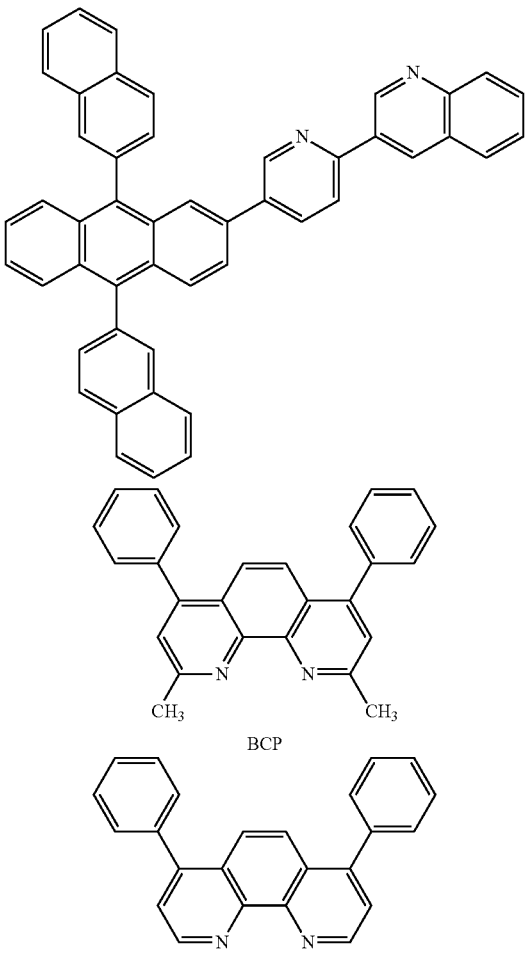

BCP

Bphen

The thickness of the ETL may be from about 100 Å to about 1,000 Å, e.g., about 150 Å to about 500 Å. When the thickness of the ETL is within these ranges, the ETL may have satisfactory electron transporting ability without a substantial increase in driving voltage.

In an implementation, the ETL may further include a metal-containing material, in addition to a suitable electron-transporting organic compound. The metal-containing material may include a lithium (Li) complex. Examples of the Li complex may include lithium quinolate (Liq) and Compound 203 below:

<Compound 203>

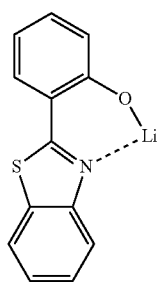

Next, the EIL 135, which facilitates injection of electrons from the cathode, may be formed on the ETL. A suitable electron-injecting material may be used to form the EIL 135.

Examples of materials for forming the EIL may include LiF, NaCl, CsF, $Li_2O$, and BaO. The deposition and coating conditions for forming the EIL 18 may be similar to those for the formation of the HIL, though the deposition and coating conditions may vary depending on the material that is used to form the EIL 18.

The thickness of the EIL may be from about 1 Å to about 100 Å, e.g., about 3 Å to about 90 Å. When the thickness of the EIL is within these ranges, the EIL may have satisfactory electron injection ability without a substantial increase in driving voltage.

The second electrode 140 may be disposed on the organic layer 130. The second electrode 140 may be a cathode that is an electron injection electrode. A material for forming the second electrode 140 may be a metal, an alloy, an electroconductive compound, which have a low work function, or a mixture thereof. In this regard, the second electrode 140 may be formed of lithium (Li), magnesium (Mg), aluminum (Al), aluminum (Al)-lithium (Li), calcium (Ca), magnesium (Mg)-indium (In), magnesium (Mg)-silver (Ag), or the like, and may be formed as a thin film type transmission electrode. In an implementation, to manufacture a top-emission light-emitting device, the transmission electrode may be formed of indium tin oxide (ITO) or indium zinc oxide (IZO).

When a phosphorescent dopant is used in the EML, a HBL may be formed between the HTL and the EML or between the H-functional layer and the EML by using vacuum deposition, spin coating, casting, Langmuir-Blodgett (LB) deposition, or the like, in order to help prevent diffusion of triplet excitons or holes into the ETL. When the HBL is formed using vacuum deposition or spin coating, the conditions for deposition and coating may be similar to those for the formation of the HIL, although the conditions for deposition and coating may vary depending on the material that is used to form the HBL. A suitable hole-blocking material may be used. Examples of hole-blocking materials may include oxadiazole derivatives, triazole derivatives, and phenanthroline derivatives. For example, bathocuproine (BCP) represented by the following formula may be used as a material for forming the HBL.

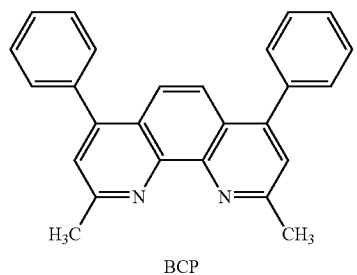

BCP

The thickness of the HBL may be from about 20 Å to about 1,000 Å, e.g., about 30 Å to about 300 Å. When the thickness of the HBL is within these ranges, the HBL may have improved hole blocking ability without a substantial increase in driving voltage.

As used herein, the unsubstituted $C_1$-$C_{60}$ alkyl group (or a $C_1$-$C_{60}$ alkyl group) may be a linear or branched C1-C60 alkyl group, such as a methyl group, an ethyl group, a propyl group, an isobutyl group, a sec-butyl group, a pentyl group, an iso-amyl groups, and a hexyl group. The substituted $C_1$-$C_{60}$ alkyl group may be a $C_1$-$C_{60}$ alkyl group of which at least one hydrogen atom is substituted with one selected from:

a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

a $C_3$-$C_{10}$ cycloalkyl group, a $C_2$-$C_{10}$ heterocycloalkyl group, a C3-C10 cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, dimethylfluorenyl group, a diphenylfluorenyl group, a carbazolyl group, a phenylcarbazolyl group, a pyridyl group, a pyrimidyl group, a pyrazinyl group, a pyridazinyl group, a triazinyl group, a quinolyl group, and an isoquinolyl group; and —N$(Q_{11})(Q_{12})$, and —Si$(Q_{13})(Q_{14})(Q_{15})$ (where $Q_{11}$ and $Q_{12}$ may be each independently a $C_6$-$C_{60}$ aryl group or a $C_2$-$C_{60}$ heteroaryl group, and $Q_{13}$ to $Q_{15}$ may be each independently a $C_1$-$C_{60}$ alkyl group, a $C_1$-$C_{60}$ alkoxy group, a $C_6$-$C_{60}$ aryl group, or a $C_2$-$C_{60}$ heteroaryl group).

As used herein, the unsubstituted $C_1$-$C_{60}$ alkoxy group (or a $C_1$-$C_{60}$ alkoxy group) may be a group represented by —OA, wherein A is an unsubstituted $C_1$-$C_{60}$ alkyl group described above. Examples of the unsubstituted $C_1$-$C_{60}$ alkoxy group are a methoxy group, an ethoxy group, and an isopropyloxy group. At least one of the hydrogen atoms in the alkoxy group may be substituted with the substituents described above in conjunction with the substituted $C_1$-$C_{60}$ alkyl group.

As used herein, the unsubstituted $C_2$-$C_{60}$ alkenyl group (or a $C_2$-$C_{60}$ alkenyl group) is a $C_2$-$C_{60}$ alkyl group having at least one carbon-carbon triple bond in the center or at a terminal thereof. Examples of the alkenyl group are an ethenyl group, a propenyl group, a butenyl group, and the like. At least one hydrogen atom in the unsubstituted $C_2$-$C_{60}$ alkenyl group may be substituted with those substituents described above in conjunction with the substituted $C_1$-$C_{60}$ alkyl group.

As used herein, the unsubstituted $C_2$-$C_{60}$ alkynyl group (or a $C_2$-$C_{60}$ alkynyl group) is a $C_2$-$C_{60}$ alkyl group having at least one carbon-carbon triple bond in the center or at a terminal thereof. Examples of the unsubstituted $C_2$-$C_{60}$ alkynyl group (or a $C_2$-$C_{60}$ alkynyl group) are an ethenyl group, a propynyl group, and the like. At least one hydrogen atom in the alkynyl group may be substituted with those substituents described above in conjunction with the substituted $C_1$-$C_{60}$ alkyl group.

As used herein, the unsubstituted $C_3$-$C_{30}$ cycloalkyl group indicates a cyclic, monovalent C3-C30 saturated hydrocarbon group. Non-limiting examples of the unsubstituted $C_3$-$C_{30}$ cycloalkyl group are a cyclopropyl group, a cyclobutyl group, a cyclopentyl group, a cyclohexyl group, and a cyclooctyl group. At least one hydrogen atom in the cycloalkyl group may be substituted with those substituents described above in conjunction with the substituted $C_1$-$C_{60}$ alkyl group.

As used herein, the unsubstituted $C_3$-$C_{30}$ cycloalkenyl group indicates a nonaromatic, cyclic unsaturated hydrocarbon group with at least one carbon-carbon double bond. Examples of the unsubstituted C3-C60 cycloalkenyl group are a cyclopropenyl group, a cyclobutenyl group, a cyclopentenyl group, a cyclohexcenyl group, a cycloheptenyl group, a 1,3-cyclohexadienyl group, a 1,4-cyclohexadienyl group, a 2,4-cycloheptadienyl group, and a 1,5-cyclooctadienyl group. At least one hydrogen atom in the cycloalkenyl group may be substituted with those substituents described above in conjunction with the substituted $C_1$-$C_{60}$ alkyl group.

As used herein, the unsubstituted $C_6$-$C_{60}$ aryl group is a monovalent group having a carbocyclic aromatic system having 6 to 60 carbon atoms including at least one aromatic ring. The unsubstituted $C_6$-$C_{60}$ arylene group is a divalent group having a carbocyclic aromatic system having 6 to 60 carbon atoms including at least one aromatic ring. When the aryl group and the arylene group have at least two rings, they may be fused to each other via a single bond. At least one hydrogen atom in the aryl group and the arylene group may be substituted with those substituents described above in conjunction with the $C_1$-$C_{60}$ alkyl group.

Examples of the substituted or unsubstituted $C_6$-$C_{60}$ aryl group are a phenyl group, a $C_1$-$C_{10}$ alkylphenyl group (e.g., an ethylphenyl group), a $C_1$-$C_{10}$ alkylbiphenyl group (e.g., an ethylbiphenyl group), a halophenyl group (e.g., an o-, m- or p-fluorophenyl group and a dichlorophenyl group), a dicyanophenyl group, a trifluoromethoxyphenyl group, an o-, m- or p-tolyl group, an o-, m- or p-cumenyl group, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, a halonaphthyl group (e.g., a fluoronaphthyl group), a $C_1$-$C_{10}$ alkylnaphthyl group (e.g., a methylnaphthyl group), a $C_1$-$C_{10}$ alkoxynaphthyl group (e.g., a methoxynaphthyl group), an anthracenyl group, an azulenyl group, an acenaphthylenyl group, a phenalenyl group, a fluorenyl group, an anthraquinolinyl group, a methylanthracenyl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, hexacenyl group, a rubicenyl group, a coronenyl group, a trinaphthylenyl group, a heptaphenyl group, a heptacenyl group, a pyranthrenyl group, and an ovalenyl group. Examples of the substituted $C_6$-$C_{60}$ aryl group may be inferred based on those of the unsubstituted $C_6$-$C_{60}$ aryl group and the substituted $C_1$-$C_{30}$ alkyl group described above. Examples of the substituted or unsubstituted $C_6$-$C_{60}$ arylene group may be inferred based on those examples of the substituted or unsubstituted $C_6$-$C_{60}$ aryl group described above.

As used herein, the unsubstituted $C_2$-$C_{60}$ heteroaryl group is a monovalent carbocyclic aromatic system having at least one aromatic ring and at least one of the heteroatoms selected from the group consisting of N, O, P, and S as a ring-forming atom. The unsubstituted $C_2$-$C_{60}$ heteroarylene group is a divalent carbocyclic aromatic system having at least one aromatic ring and at least one aromatic ring and at least one of the heteroatoms selected from the group consisting of N, O, P, and S. In this regard, when the heteroaryl group and the heteroarylene group have at least two rings, they may be fused to each other via a single bond. At least one hydrogen atom in the heteroaryl group and the heteroarylene group may be substituted with those substituents described with reference to the $C_1$-$C_{60}$ alkyl group.

Examples of the unsubstituted $C_2$-$C_{60}$ heteroaryl group are a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group and an imidazopyrimidinyl group. Examples of the substituted or unsubstituted $C_2$-$C_{60}$ heteroarylene group may be inferred based on those examples of the substituted or unsubstituted $C_2$-$C_{60}$ arylene group described above.

As used herein, the substituted or unsubstituted $C_6$-$C_{60}$ aryloxy group indicates —$OA_2$ (where $A_2$ is a substituted or unsubstituted $C_6$-$C_{60}$ aryl group described above). The substituted or unsubstituted $C_6$-$C_{60}$ arylthiol group indicates —$SA_3$ (where $A_3$ is a substituted or unsubstituted $C_6$-$C_{60}$ aryl group described above).

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

SYNTHESIS EXAMPLE 1

Synthesis of Compound 1

Synthesis of Intermediate C

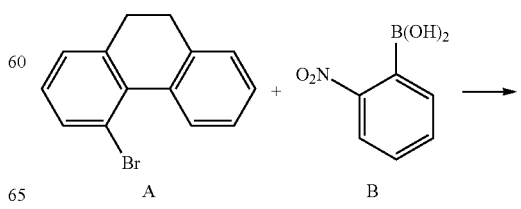

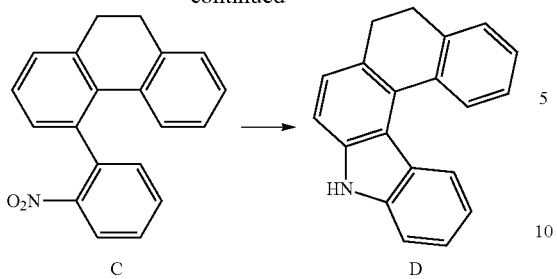

10 g (0.0229 mol) of Compound A and 4.2 g (0.0252 mol) of Compound B were put in a flask, and dissolved with 600 ml of toluene to obtain a solution. 0.529 g (0.000458 mmol) of Pd(PPh$_3$)$_4$, and 70 mL of a 2M K$_2$CO$_3$ solution were added into the solution, and stirred while heating for about 12 hours. After completion of the reaction, the resulting reaction solution was filtered through Celite, and a filtered product was purified by column chromatography to obtain 5.67 g of Intermediate C with a yield of about 82.3%. Intermediate C was identified by using elementary analysis and high-resolution mass spectrometry (HR-MS).

Elementary analysis: C, 79.72; H, 5.02; N, 4.65; O, 10.

HRMS (C, 20; H, 15; NO, 2) [M]+: calcd. 301.11, found 300.

Synthesis of Intermediate D 10 g (0.0331 mol) of Intermediate C was dissolved in 20 mL (115.4202 mmol) of triethyl phosphite, and stirred for about 4 hours under reflux. After completion of the reaction, the resulting reaction solution was filtered to obtain a solid. The resulting solid was recrystallized using hexane/dichloromethane to obtain 5.43 g of Intermediate D with a yield of 61%. Intermediate D was identified using HR-MS.

HRMS (C, 20; H, 15; NO, 2) [M]+: calcd. 269.34, found 268.

Synthesis of Compound 1

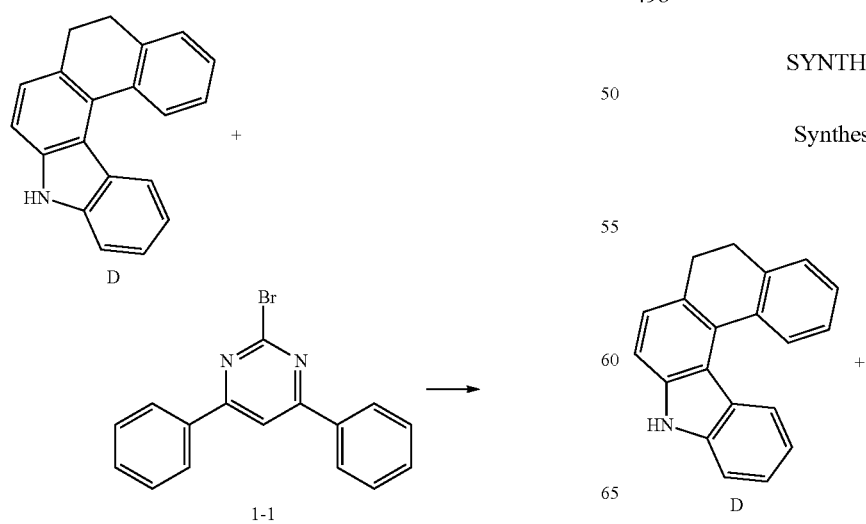

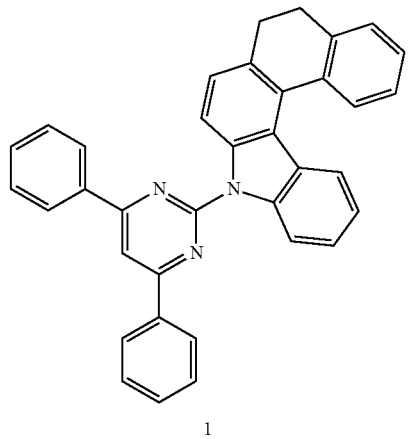

13 g (0.0483 mol) of Intermediate D, 16.5 g (0.0483 mol) of 2-bromo-4,6-diphenylpyrimidine (Formula 1-1 in the reaction scheme), 0.6 g (0.6358 mmol) of Pd$_2$(dba)$_3$, 6.1 g (63.5862 mmol) of NaO(t-Bu), and 0.43 g (2.1195 mmol) of P(t-Bu)$_3$ were dissolved in 100 ml of toluene, and stirred for about 12 hours under reflux.

After completion of the reaction, the reaction solution was extracted using dichloromethane. The resultant was concentrated through a silica gel filter, and purified by silica gel column chromatography (hexane:dichloromethane=2:1 (v/v)) to obtain 10 g of Compound 1 (Yield: 77%). Compound 1 was identified using elementary analysis and HR-MS.

Elementary analysis: C, 86.55; H, 5.04; N, 8.41

HRMS (C,20; H, 15; NO, 2) [M]+: calcd. 499.6, found 498

SYNTHESIS EXAMPLE 2

Synthesis of Compound 4

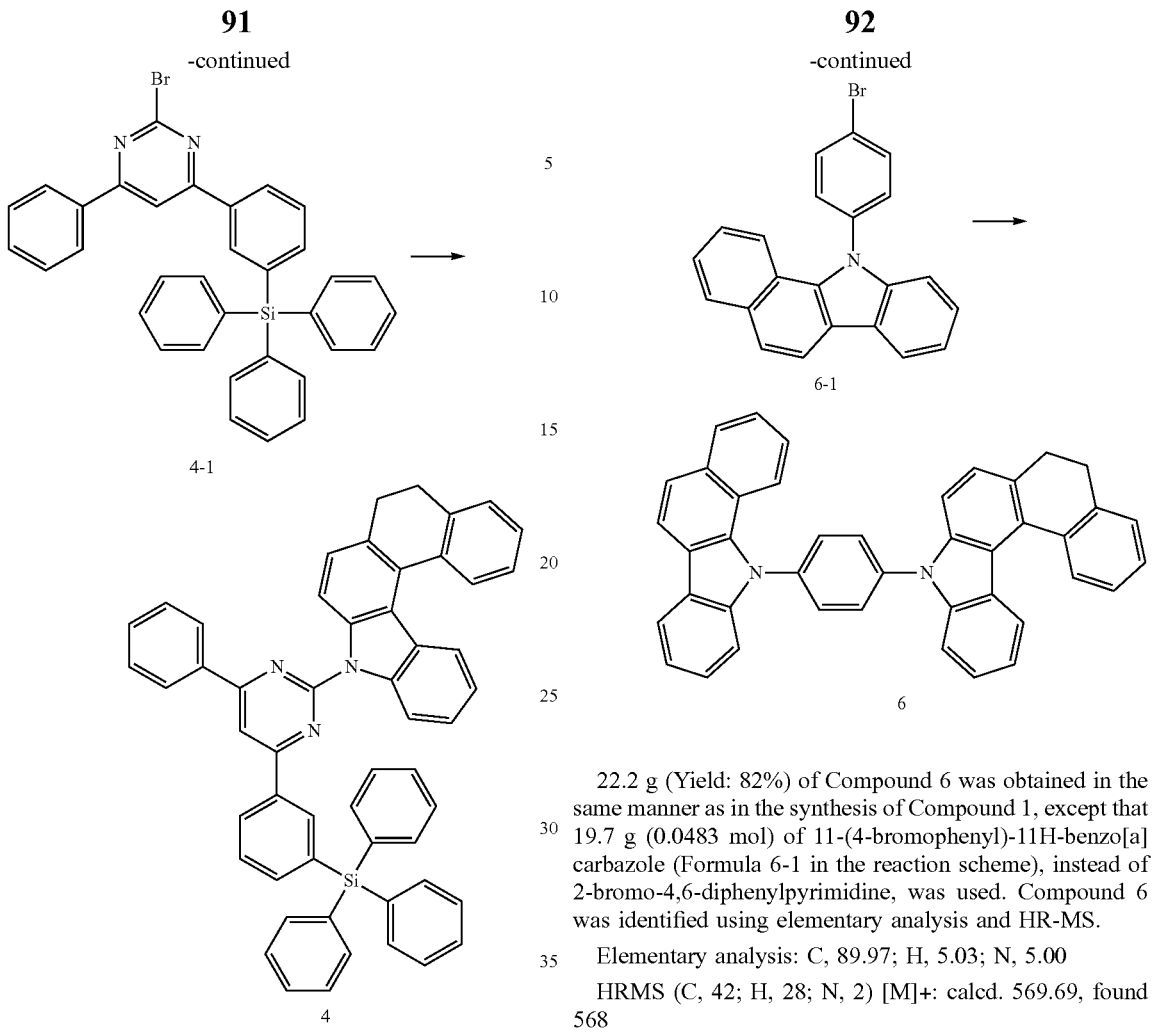

4-1

4

28.9 g (Yield: 79%) of Compound 4 was obtained in the same manner as in the synthesis of Compound 1, except that 30.2 g (0.0483 mol) of 2-bromo-4-phenyl-6-(3-(triphenylsilyl)phenyl)pyrimidine (Formula 4-1 in the reaction scheme), instead of 2-bromo-4,6-diphenylpyrimidine, was used. Compound 4 was identified using elementary analysis and HR-MS.

Elementary analysis: C, 85.57; H, 5.19; N, 5.54; Si, 3.71

HRMS (C, 20; H, 15; NO, 2) [M]+: calcd. 757.99, found 756

SYNTHESIS EXAMPLE 3

Synthesis of Compound 6

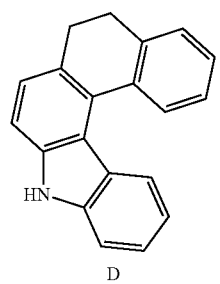

D 6-1

6

22.2 g (Yield: 82%) of Compound 6 was obtained in the same manner as in the synthesis of Compound 1, except that 19.7 g (0.0483 mol) of 11-(4-bromophenyl)-11H-benzo[a]carbazole (Formula 6-1 in the reaction scheme), instead of 2-bromo-4,6-diphenylpyrimidine, was used. Compound 6 was identified using elementary analysis and HR-MS.

Elementary analysis: C, 89.97; H, 5.03; N, 5.00

HRMS (C, 42; H, 28; N, 2) [M]+: calcd. 569.69, found 568

SYNTHESIS EXAMPLE 4

Synthesis of Compound 9

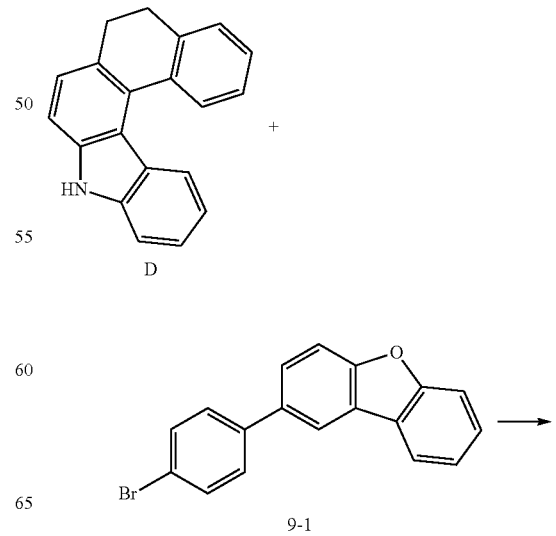

D 9-1

-continued

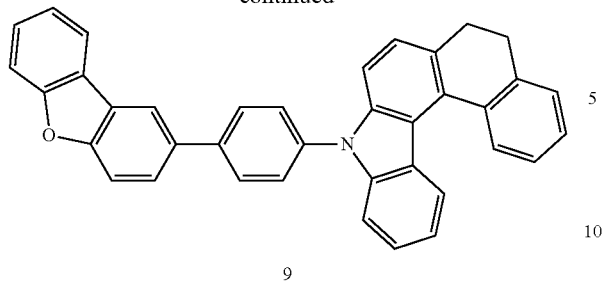

9

22.2 g (Yield: 82%) of Compound 9 was obtained in the same manner as in the synthesis of Compound 1, except that 15.5 g (0.0483 mol) of 2-(4-bromophenyl)dibenzo[b,d]furan (Formula 9-1 in the reaction scheme), instead of 2-bromo-4,6-diphenylpyrimidine, was used. Compound 9 was identified using elementary analysis and HR-MS.
Elementary analysis: C, 89.21; H, 4.93; N, 2.74; O, 3.13
HRMS (C, 38; H, 25; NO) [M]+: calcd. 511.61, found 510

SYNTHESIS EXAMPLE 5

Synthesis of Compound 10

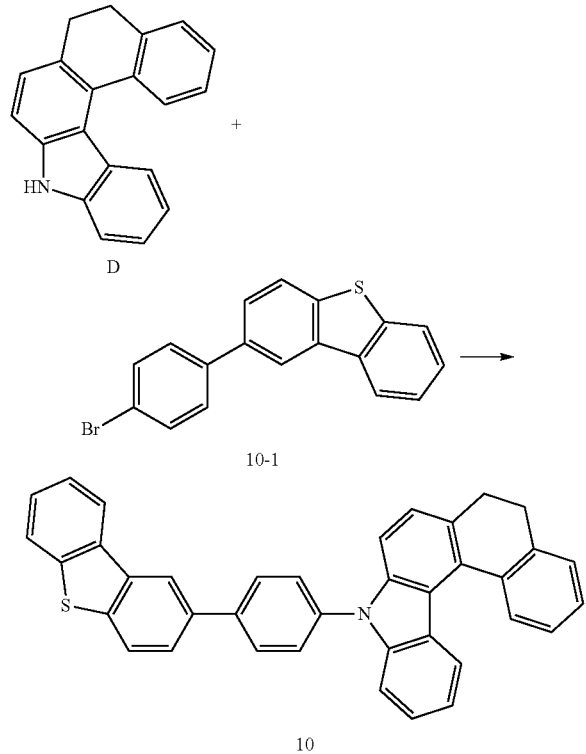

18.8 g (Yield 74%) of Compound 10 was obtained in the same manner as in the synthesis of Compound 1, except that 16.3 g (0.0483 mol) of 2-(4-bromophenyl)dibenzo[b,d]thiophene (Formula 10-1 in the reaction scheme), instead of 2-bromo-4,6-diphenylpyrimidine, was used. Compound 10 was identified using elementary analysis and HR-MS.
Elementary analysis: C, 86.49; H, 4.78; N, 2.65; S, 6.08
HRMS (C, 38; H, 25; NS) [M]+: calcd. 527.68, found 526

SYNTHESIS EXAMPLE 6

Synthesis of Compound 16

Synthesis of Intermediate H

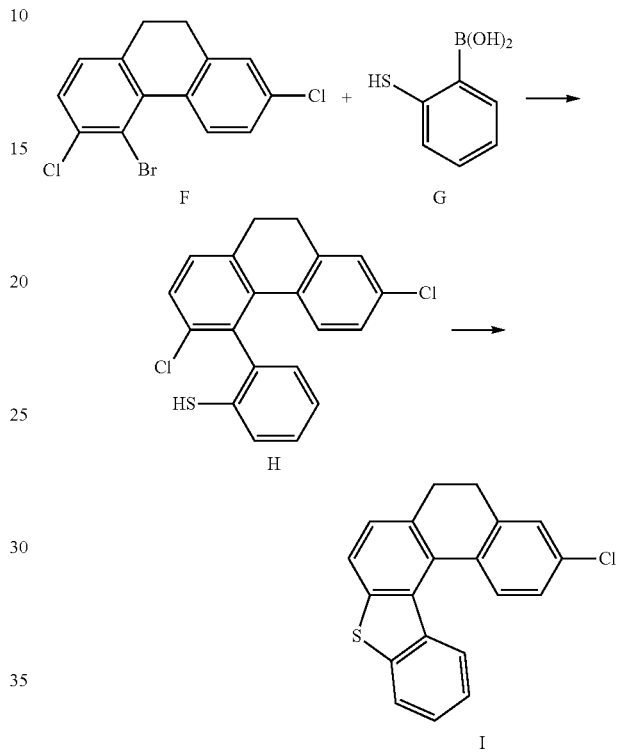

9.56 g (Yield: 87.1%) of Intermediate H was obtained in the same manner as in the synthesis of Intermediate C, except that 10 g (0.034 mol) of Compound F and 5.7 g (0.037 mol) of Compound G, instead of Compound A and Compound B, were used, respectively. Intermediate H was identified using HR-MS.
HRMS (C, 20; H, 14; Cl, 2; S) [M]+: calcd. 357.3, found 356

Synthesis of Intermediate I 5 g (0.0139 mol) of Compound H, 15 g of $Cs_2CO_3$, and 100 mL of $CH_3CN$ were mixed together, and heated to about 130° C. until Compound H and $Cs_2CO_3$ were completely dissolved. The resulting solution was reacted using microwaves for about 8 minutes to about 10 minutes. After completion of the reaction, the reaction product was sufficiently washed with distilled water, and filtered to obtain a solid. The resulting solid was recrystallized using hexane to obtain 4.05 g of Intermediate H with a yield of 91%. Intermediate H was identified using elementary analysis and HR-MS.
Elementary analysis: C, 74.87; H, 4.08; Cl, 11.05; S, 9.99
HRMS (C, 20; H, 13; ClS) [M]+: calcd. 320.84, found 319

Synthesis of Compound 16

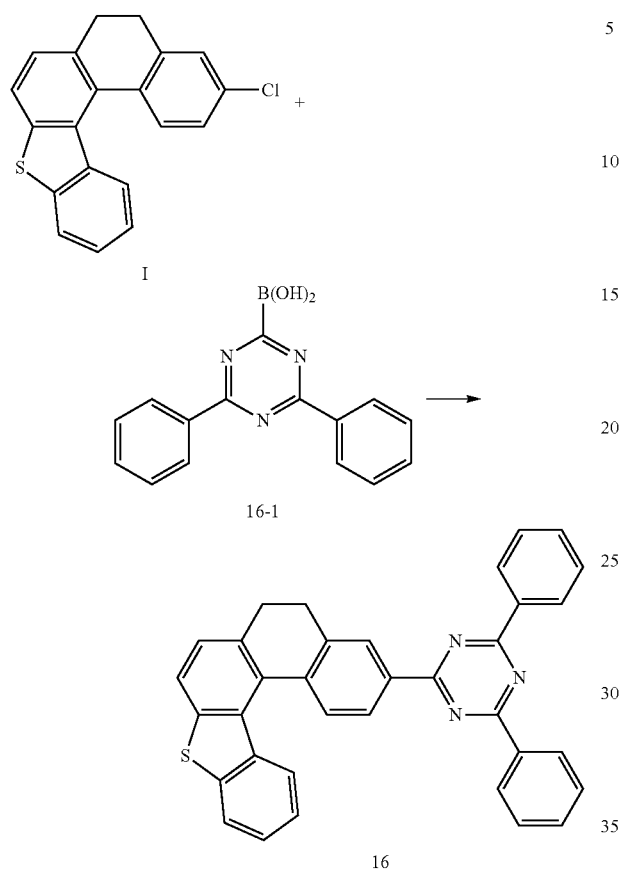

13.1 g (Yield: 81.9%) of Compound 16 was obtained in the same manner as in the synthesis of Compound 1, except that 10 g (0.031 mol) of Intermediate 1 and 9.5 g (0.034 mol) of Compound 16-1, instead of Intermediate D and 2-bromo-4,6-diphenylpyrimidine, respectively, were used. Compound 16 was identified using elementary analysis and HR-MS.

Elementary analysis: C, 81.21; H, 4.48; N, 8.12; S, 6.19

HRMS (C, 35; H, 23; N3; S) [M]+: calcd. 517.64, found 516

SYNTHESIS EXAMPLE 7

Synthesis of Compound 17

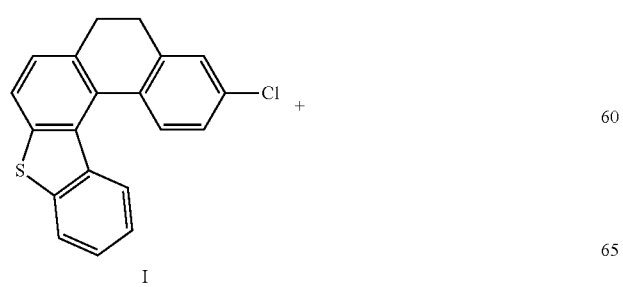

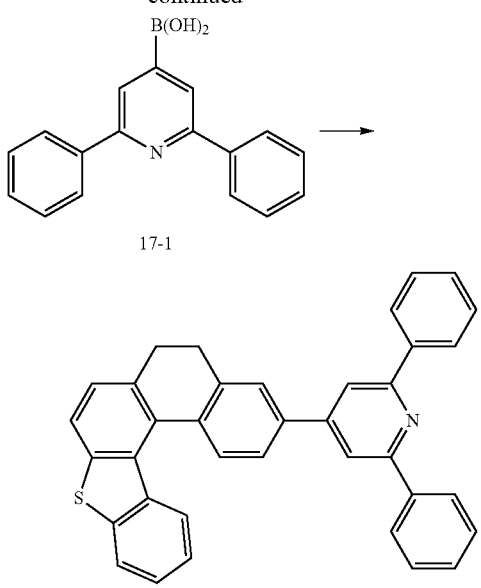

14.2 g (Yield: 89.3%) of Compound 17 was obtained in the same manner as in the synthesis of Compound 1, except that Intermediate I and Compound 17-1, instead of Intermediate D and 2-bromo-4,6-diphenylpyrimidine, respectively, were used. Compound 17 was identified using elementary analysis and HR-MS.

Elementary analysis: C, 86.18; H, 4.89; N, 2.72; S, 6.22

HRMS (C, 37; H, 25; NS) [M]+: calcd. 515.67, found 514

SYNTHESIS EXAMPLE 8

Synthesis of Compound 18

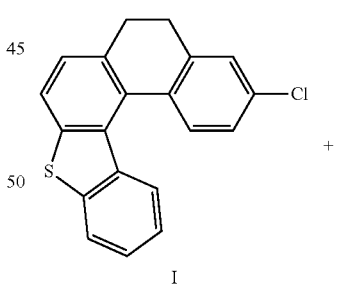

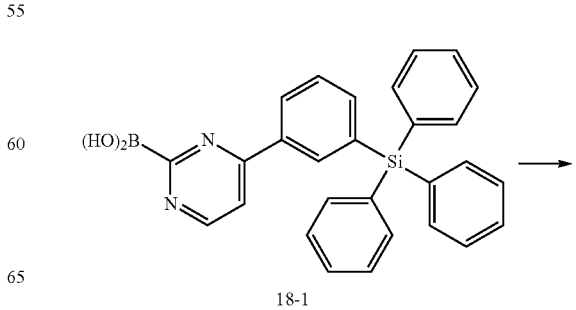

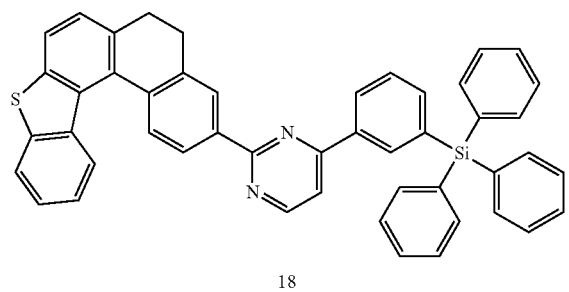

18

15.4 g (Yield: 71.4%) of Compound 18 was obtained in the same manner as in the synthesis of Compound 1, except that Intermediate I and Compound 18-1, instead of Intermediate D and 2-bromo-4,6-diphenylpyrimidine, respectively, were used. Compound 18 was identified using elementary analysis and HR-MS.

Elementary analysis: C, 82.48; H, 4.90; N, 4.01; S, 4.59; Si, 4.02

HRMS (C, 48; H, 34; N, 2; SSi) [M]+: calcd. 698.95, found 697

SYNTHESIS EXAMPLE 9

Synthesis of Compound 19

Synthesis of Intermediate J

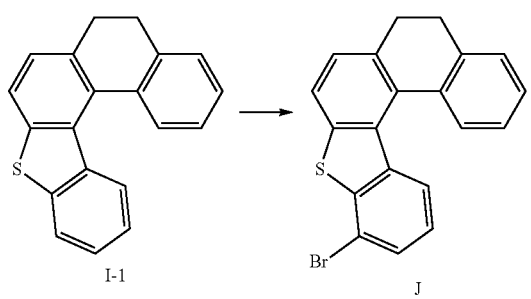

I-1 → J 100 mL of CBr$_4$ and 5.3 g (0.037 mol) of NBS were mixed with 10 g (0.031 mol) of Compound I-1, and reacted at about 0° C. for about 24 hours. After completion of the reaction, distilled water was added into the resulting reaction product and filtered to obtain a solid. The solid was recrystallized using hexane and dichlorobenzene to obtain 6.1 g of Intermediate J with a yield of 54%. Intermediate J was identified using HR-MS.

HRMS (C, 20; H, 13; BrS) [M]+: calcd. 665.29, found 664

Synthesis of Compound 19

14.3 g (Yield: 75.9%) of Compound 19 was obtained in the same manner as in the synthesis of Compound 1, except that 10 g (0.027 mol) of Intermediate J and Compound 18-1, instead of Intermediate D and 2-bromo-4,6-diphenylpyrimidine, respectively, were used. Compound 19 was identified using elementary analysis and HR-MS.

Elementary analysis: C, 82.48; H, 4.90; N, 4.01; S, 4.59; Si, 4.02

HRMS (C, 48; H, 34; N, 2; SSi) [M]+: calcd. 698.95, found 697

SYNTHESIS EXAMPLE 10

Synthesis of Compound 25

-continued

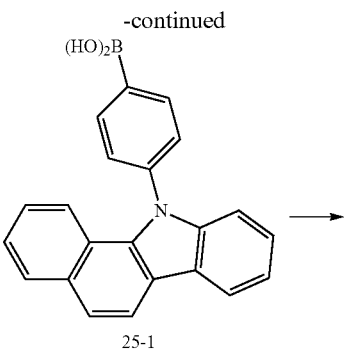

25-1

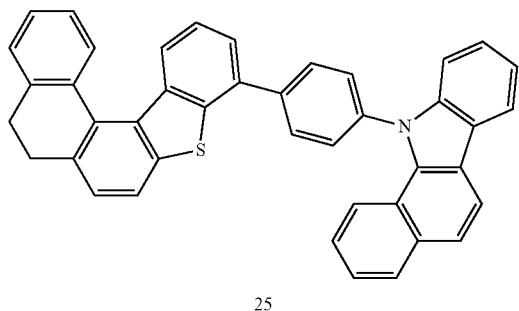

25

13.1 g (Yield: 84.3%) of Compound 25 was obtained in the same manner as in the synthesis of Compound 1, except that 10 g (0.027 mol) of Intermediate J and 10.9 g (0.0324 mol) of Compound 25-1, instead of Intermediate D and 2-bromo-4,6-diphenylpyrimidine, respectively, were used. Compound 25 was identified using elementary analysis and HR-MS.

Elementary analysis: C, 87.31; H, 4.71; N, 2.42; S, 5.55

HRMS (C, 42; H, 27; NS) [M]+: calcd. 577.74, found 576

SYNTHESIS EXAMPLE 11

Synthesis of Compound 29

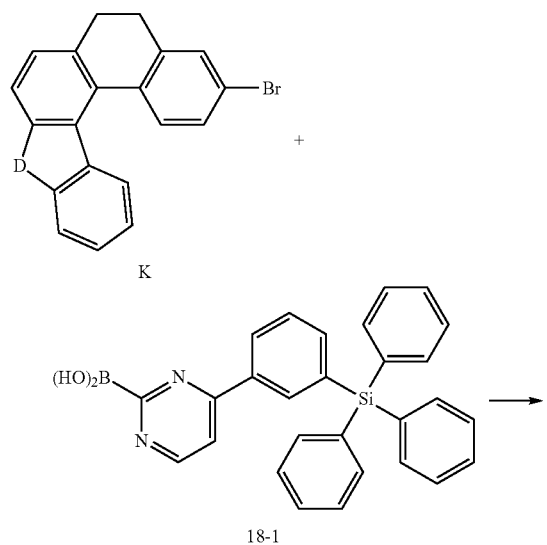

-continued

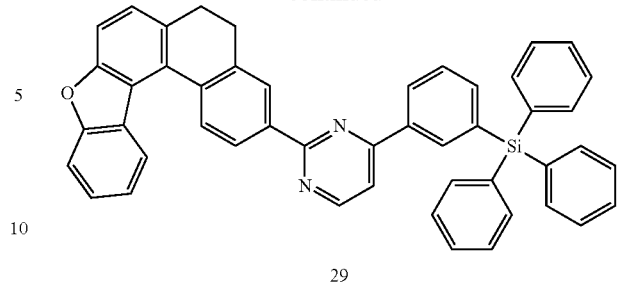

29

12.5 g (Yield: 65.4%) of Compound 29 was obtained in the same manner as in the synthesis of Compound 1, except that 10 g (0.028 mol) of Intermediate K and 15.75 g (0.034 mol) of Compound 18-1, instead of Intermediate D and 2-bromo-4,6-diphenylpyrimidine, respectively, were used. Compound 29 was identified using elementary analysis and HR-MS.

Elementary analysis: C, 84.42; H, 5.02; N, 4.10; 0, 2.34; Si, 4.11

HRMS (C, 48; H, 34; N, 20; Si) [M]+: calcd. 682.88, found 681

EXAMPLE 1

To manufacture an anode, a corning 15 Ω/cm$^2$ (500 Å) ITO glass substrate was cut to a size of 50 mm×50 mm×0.7 mm and then sonicated in isopropyl alcohol and pure water each for five minutes, and then cleaned by irradiation of ultraviolet rays for 30 minutes and exposure to ozone for about 10 minutes. The resulting glass substrate was loaded into a vacuum deposition device.

Compound 301, below, was vacuum-deposited on the ITO layer to form a HIL having a thickness of about 600 Å. Compound 100, below, was then deposited on the HIL to form a first HTL having a thickness of about 50 Å, and NPB (N,N'-bis(naphthalene-1-yl)-N,N'-bis(phenyl)-benzidine) was then vacuum-deposited on the first HTL to form a second HTL having a thickness of about 1,800 Å.

Compound 1 (host) and Ir(ppy)$_3$ (dopant) were co-deposited on the HTL in a weight ratio of about 85:15 to form an EML having a thickness of about 300 Å.

Then, Compound 101, below, was vacuum-deposited on the EML to form an ETL having a thickness of about 360 Å, and then 8-hydroxyquinolinolato-lithium (LiQ) was vacuum-deposited on the ETL to form an EIL having a thickness of about 5 Å. Then, Al was vacuum-deposited on the EIL to form a cathode having a thickness of about 1,200 Å, thereby completing the manufacture of an organic light-emitting device.

<Compound 301>

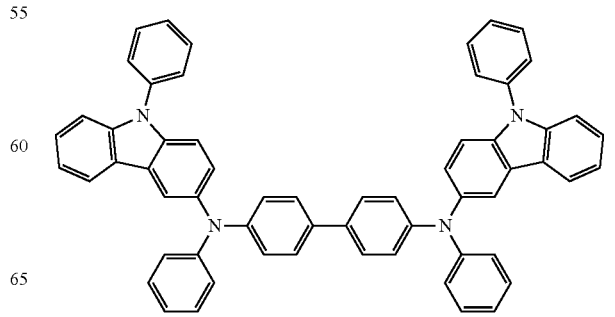

-continued

<Compound 100>

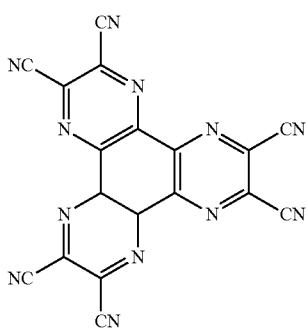

<Compound 101>

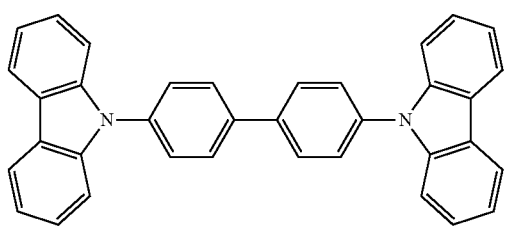

EXAMPLE 2

An organic light-emitting device was manufactured in the same manner as in Example 1, except that Compound 4, instead of Compound 1, was used to form the EML.

EXAMPLE 3

An organic light-emitting device was manufactured in the same manner as in Example 1, except that Compound 6, instead of Compound 1, was used to form the EML.

EXAMPLE 4

An organic light-emitting device was manufactured in the same manner as in Example 1, except that Compound 9, instead of Compound 1, was used to form the EML.

EXAMPLE 5

An organic light-emitting device was manufactured in the same manner as in Example 1, except that Compound 10, instead of Compound 1, was used to form the EML.

EXAMPLE 6

An organic light-emitting device was manufactured in the same manner as in Example 1, except that Compound 16, instead of Compound 1, was used to form the EML.

EXAMPLE 7

An organic light-emitting device was manufactured in the same manner as in Example 1, except that Compound 17, instead of Compound 1, was used to form the EML.

EXAMPLE 8

An organic light-emitting device was manufactured in the same manner as in Example 1, except that Compound 18, instead of Compound 1, was used to form the EML.

EXAMPLE 9

An organic light-emitting device was manufactured in the same manner as in Example 1, except that Compound 19, instead of Compound 1, was used to form the EML.

EXAMPLE 10

An organic light-emitting device was manufactured in the same manner as in Example 1, except that Compound 25, instead of Compound 1, was used to form the EML.

EXAMPLE 11

An organic light-emitting device was manufactured in the same manner as in Example 1, except that Compound 29, instead of Compound 1, was used to form the EML.

COMPARATIVE EXAMPLE 1

An organic light-emitting device was manufactured in the same manner as in Example 1, except that CBP, instead of Compound 1, was used to form the EML.

CBP

COMPARATIVE EXAMPLE 2

An organic light-emitting device was manufactured in the same manner as in Example 1, except that Compound X below, instead of Compound 1, was used to form the EML.

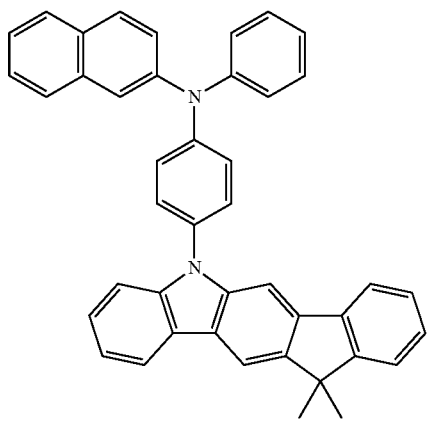

<Compound X>

EVALUATION EXAMPLE

Driving voltages, current densities, luminance, emission colors, and efficiencies of the organic light-emitting devices of Examples 1 to 11 and Comparative Examples 1 and 2 were measured using a SR Spectroscan Source Measurement Unit. (available from Topcon Photo Research, Inc.). (T97 lifetime indicates the time taken until an initial luminocity (assumed as 100%) measured at a current density of 0.5 mA is reduced to 97%.) The results are shown in Table 1 below.

TABLE 1

| Example | EML material | Driving voltage (V) | Current density (mA/cm$^2$) | Efficiency (cd/A) | Emission color | T97 lifetime (hr) |
|---|---|---|---|---|---|---|
| Comparative Example 1 | CBP | 6.1 | 10 | 37.4 | Green | 56 |
| Comparative Example 2 | Compound X | 5.7 | 10 | 49.1 | Green | 104 |
| Example 1 | Compound 1 | 4.8 | 10 | 55.4 | Green | 161 |
| Example 2 | Compound 4 | 4.2 | 10 | 53.2 | Green | 154 |
| Example 3 | Compound 6 | 5.1 | 10 | 55.9 | Green | 178 |
| Example 4 | Compound 9 | 4.9 | 10 | 57 | Green | 155 |
| Example 5 | Compound 10 | 4.3 | 10 | 55.1 | Green | 129 |
| Example 6 | Compound 16 | 4.8 | 10 | 49.9 | Green | 134 |
| Example 7 | Compound 17 | 5.0 | 10 | 58 | Green | 164 |
| Example 8 | Compound 18 | 5.2 | 10 | 60 | Green | 115 |
| Example 9 | Compound 19 | 5.1 | 10 | 62 | Green | 134 |
| Example 10 | Compound 25 | 4.9 | 10 | 59.2 | Green | 150 |
| Example 11 | Compound 29 | 4.7 | 10 | 55.1 | Green | 138 |

Referring to Table 1, the organic light-emitting devices of Examples 1 to 11 were found to have improved driving voltages, improved luminances, and improved efficiency characteristics, compared to the organic light-emitting devices of Comparative Examples 1 and 2.

For example, the organic light-emitting devices of Examples 1 to 10 were found to have a driving voltage that was about at least 15% to 20% lower than those of the organic light emitting devices of Comparative Examples 1 and 2, and had better I-V-L characteristics with remarkably improved efficiencies, and lifetimes that were improved by about 40% or greater.

As described above, according to an embodiment, a heterocyclic compound of Formula 1, above, may have improved thermal stability and improved optical and chemical characteristics. An optical light-emitting device including the heterocyclic compound of Formula 1 may have improved efficiency and improved lifetime.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A heterocyclic compound represented by Formula 1 below:

<Formula 1>

$$\underset{R_7}{\overset{R_8}{\underset{R_9\ R_{10}}{}}} \text{—}(L_1)_{n1}\text{—}(R_1)_{m1}]_{o1}$$

wherein, in Formula 1, a moiety represented by

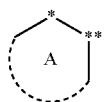

is one selected from moieties represented by Formulae a to f below;

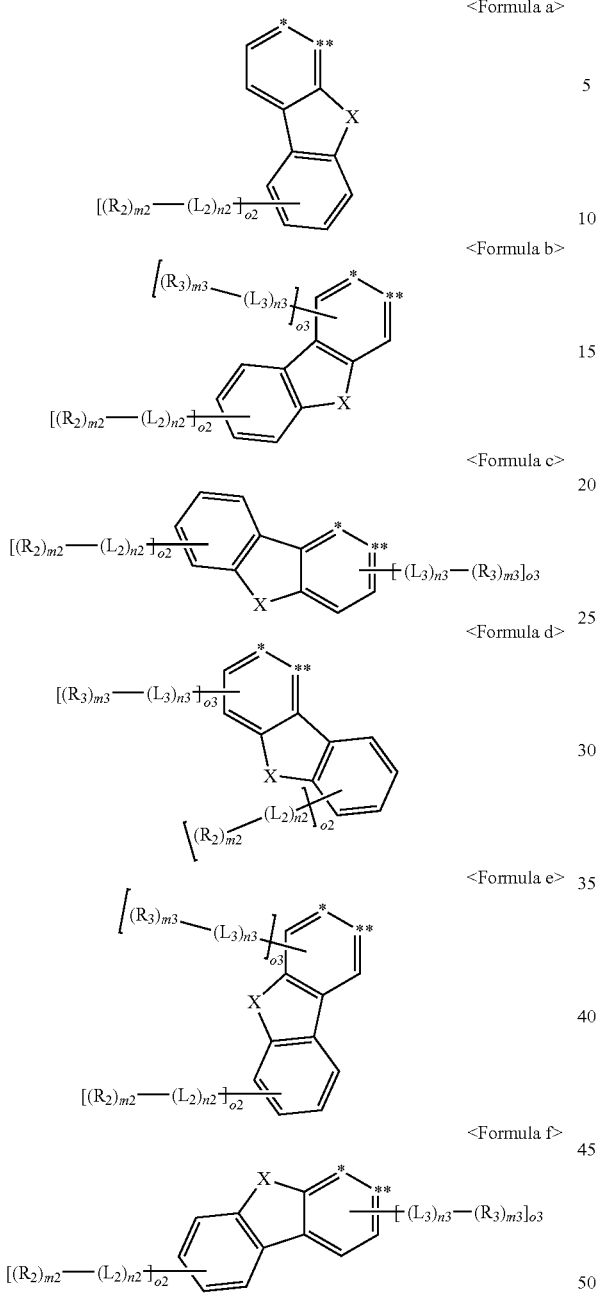

wherein, in Formulae a to f,
X is —O—, —S—,

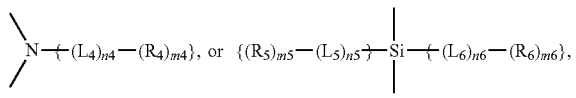

and
in Formula 1 and Formulae a to f,
L₁ to L₆ are each independently selected from a substituted or unsubstituted $C_3$-$C_{10}$ cycloalkylene group, a substituted or unsubstituted $C_3$-$C_{10}$ cycloalkenylene group, a substituted or unsubstituted $C_6$-$C_{60}$ arylene group, a substituted or unsubstituted $C_2$-$C_{10}$ heterocycloalkylene group, a substituted or unsubstituted $C_2$-$C_{10}$ heterocycloalkenylene group, and a substituted or unsubstituted $C_2$-$C_{60}$ heteroarylene group;

n1 to n6 are each independently an integer of 0 to 3;

$R_1$ to $R_{10}$ are each independently selected from a hydrogen atom, a deuterium atom, a halogen atom, a hydroxyl group, a cyano group, a nitro group, an amino group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_2$-$C_{30}$ heteroaryl group, —N($Q_1$)($Q_2$), and —Si($Q_3$)($Q_4$)($Q_5$), where $Q_1$ to $Q_5$ are each independently selected from a hydrogen atom, a deuterium atom, a halogen atom, a hydroxyl group, a cyano group, an amino group, a nitro group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, and a substituted or unsubstituted $C_2$-$C_{30}$ heteroaryl group;

m1 to m4 are each independently an integer of 0 to 5; and
o1 to o3 are each independently an integer of 0 to 2,
provided that at least one of o1 to o3 is 1 or 2 or provided that X is

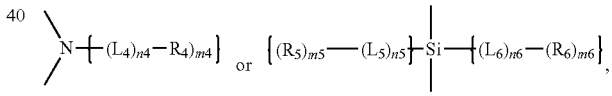

and
provided that at least one of n1 to n6 is 1, 2, or 3 such that at least one of $L_1$ to $L_6$ is present in the compound represented by Formula 1.

2. The heterocyclic compound as claimed in claim 1, wherein $L_1$ to $L_6$ are each independently selected from:
a phenylene group, a naphthylene group, an anthracenyl group, a pyrimidinylene group, a triazinylene group, and a pyridyl group; and
a phenylene group, a naphthylene group, an anthracenyl group, a pyrimidinylene group, a triazinylene group, and a pyridyl group, each substituted with at least one selected from:
a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, and a $C_1$-$C_{10}$ alkyl group;
a $C_1$-$C_{10}$ alkyl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a $C_6$-$C_{16}$ aryl group, and a $C_2$-$C_{16}$ heteroaryl group; and a $C_6$-$C_{16}$ aryl group, and a $C_2$-$C_{16}$ heteroaryl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_6$-$C_{16}$ aryl group, and a $C_2$-$C_{16}$ heteroaryl group.

3. The heterocyclic compound as claimed in claim 1, wherein $L_1$ to $L_6$ are each independently selected from:

a phenylene group, a pyrimidinylene group, a triazinylene group, and a pyridyl group; and a phenylene group, a pyrimidinylene group, a triazinylene group, and a pyridyl group, each substituted with at least one selected from a deuterium atom, a halogen atom, a hydroxyl group, a cyano group, a nitro group, a methyl group, an ethyl group, an n-propyl group, an iso-propyl group, an n-butyl group, a sec-butyl group, an iso-butyl group, and a tert-butyl group;

a methyl group, an ethyl group, an n-propyl group, an iso-propyl group, an n-butyl group, a sec-butyl group, an iso-butyl group, and a tert-butyl group, each substituted with at least one of a deuterium atom, a halogen atom, a hydroxyl group, a cyano group, and a nitro group;

a phenyl group, a naphthyl group, and an anthracenyl group; and a phenyl group, a naphthyl group, and an anthracenyl group, each substituted with at least one of a deuterium atom, a halogen atom, a hydroxyl group, a cyano group, and a nitro group.

4. The heterocyclic compound as claimed in claim 1, wherein $L_1$ to $L_6$ are each independently selected from:

a phenylene group, a pyrimidinylene group, a triazinylene group, and a pyridyl group; and a phenylene group, a pyrimidinylene group, a triazinylene group, and a pyridyl group, each substituted with at least one selected from a deuterium atom, a halogen atom, a hydroxyl group, a cyano group, a nitro group, a methyl group, an ethyl group, a phenyl group, a naphthyl group, and an anthracenyl group.

5. The heterocyclic compound as claimed in claim 1, wherein n1 to n6 in Formula 1 and Formulae a to f are each independently an integer of 1 or 2.

6. The heterocyclic compound as claimed in claim 1, wherein at least one of n1 to n6 is 1, 2, or 3, and moieties represented by $(L_1)_{n1}$, $(L_2)_{n2}$, $(L_3)_{n3}$, $(L_4)_{n4}$, $(L_5)_{n5}$, and $(L_6)_{n6}$ in Formula 1 and Formulae a to f are each independently selected from moieties represented by Formulae 4-1 to 4-14 below:

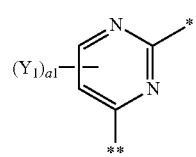

4-1

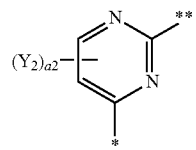

4-2

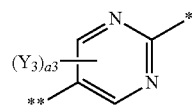

4-3

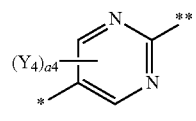

4-4

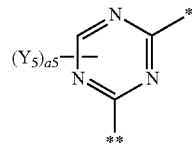

4-5

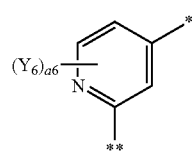

4-6

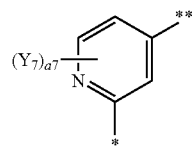

4-7

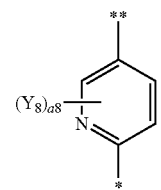

4-8

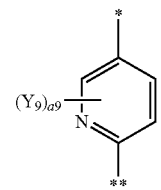

4-9

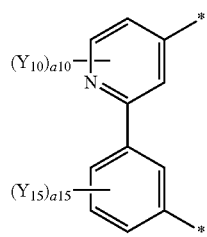

4-10

4-11

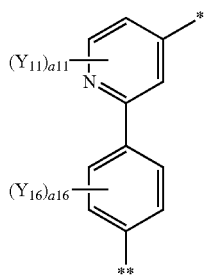

4-12

4-13

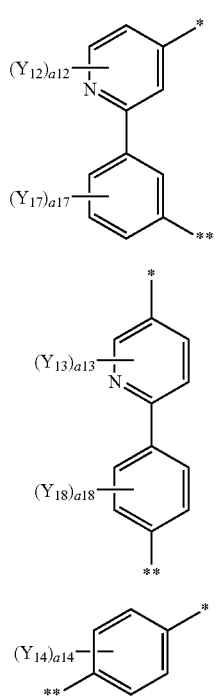

4-14 wherein, in Formulae 4-1 to 4-14,
$Y_1$ to $Y_{18}$ are each independently selected from:
a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, and a $C_1$-$C_{10}$ alkyl group;
a $C_1$-$C_{10}$ alkyl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;
a $C_6$-$C_{16}$ aryl group and a $C_2$-$C_{16}$ heteroaryl group; and
a $C_6$-$C_{16}$ aryl group and a $C_2$-$C_{16}$ heteroaryl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_6$-$C_{16}$ aryl group, and a $C_2$-$C_{16}$ heteroaryl group, a1 to a18 are each independently an integer of 0 to 2,
* indicates a binding site to a ring, and
** indicates a binding site to one of $R_1$ to $R_6$.

7. The heterocyclic compound as claimed in claim 1, wherein at least one of n1 to n6 is 1, 2, or 3, and moieties represented by $(L_1)_{n1}$, $(L_2)_{n2}$, $(L_3)_{n3}$, $(L_4)_{n4}$, $(L_5)_{n5}$, and $(L_6)_{n6}$ in Formula 1 and Formulae a to f are each independently selected from moieties represented by Formulae 5-1 to 5-14 below:

5-1

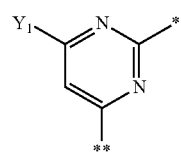

5-2

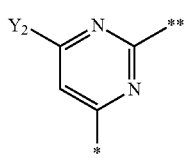

5-3

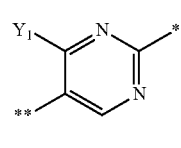

5-4

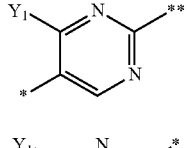

5-5

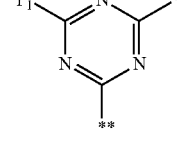

5-6

5-7

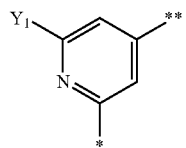

5-8

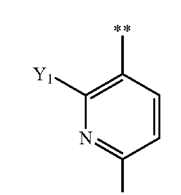

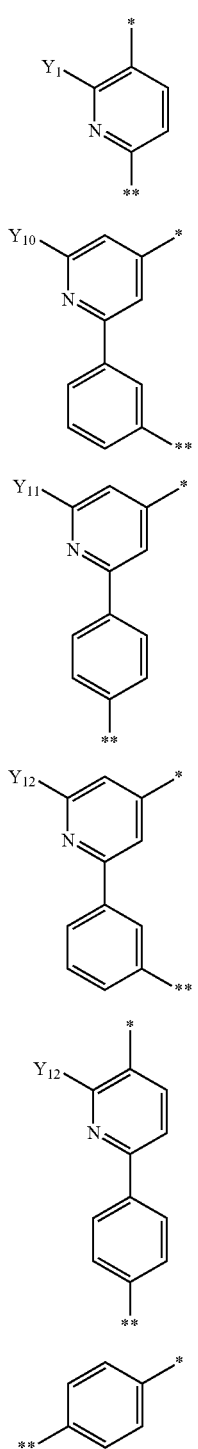

to $R_6$ in Formula 1 and Formulae a to f are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{10}$ alkyl group, a substituted or unsubstituted $C_1$-$C_{10}$ alkoxy group, and groups represented by Formulae 6-1 to 6-13 below:

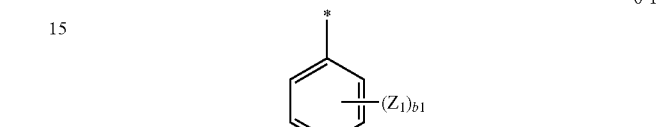

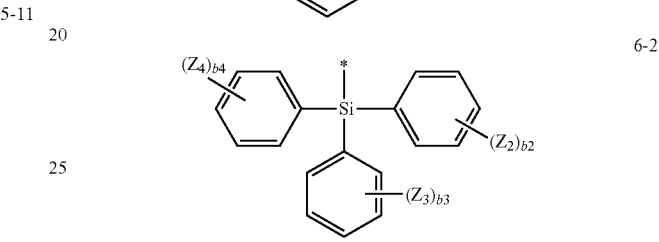

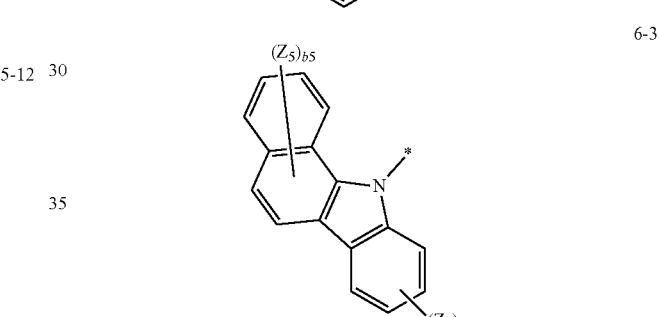

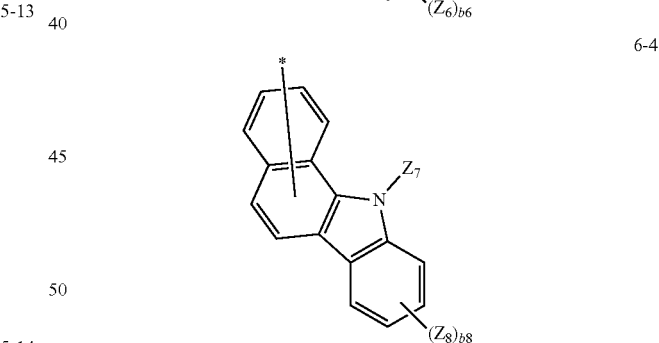

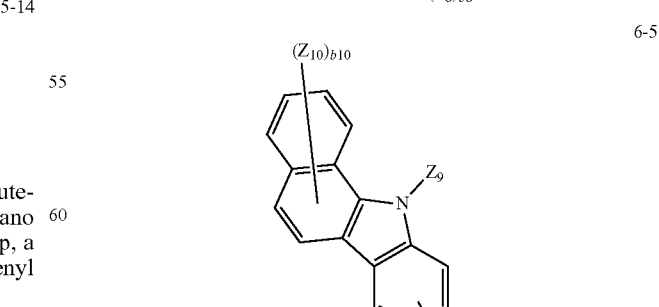

wherein, in Formulae 5-1 to 5-14,
$Y_1$ to $Y_{13}$ are each independently selected from a deuterium atom, a halogen atom, a hydroxyl group, a cyano group, a nitro group, a methyl group, an ethyl group, a phenyl group, a naphthyl group, and an anthracenyl group:
* indicates a binding site to a ring, and
** indicates a binding site to one of $R_1$ to $R_6$.

8. The heterocyclic compound as claimed in claim 1, wherein at least one of m1 to m6 is 1, 2, 3, 4, or 5, and $R_1$

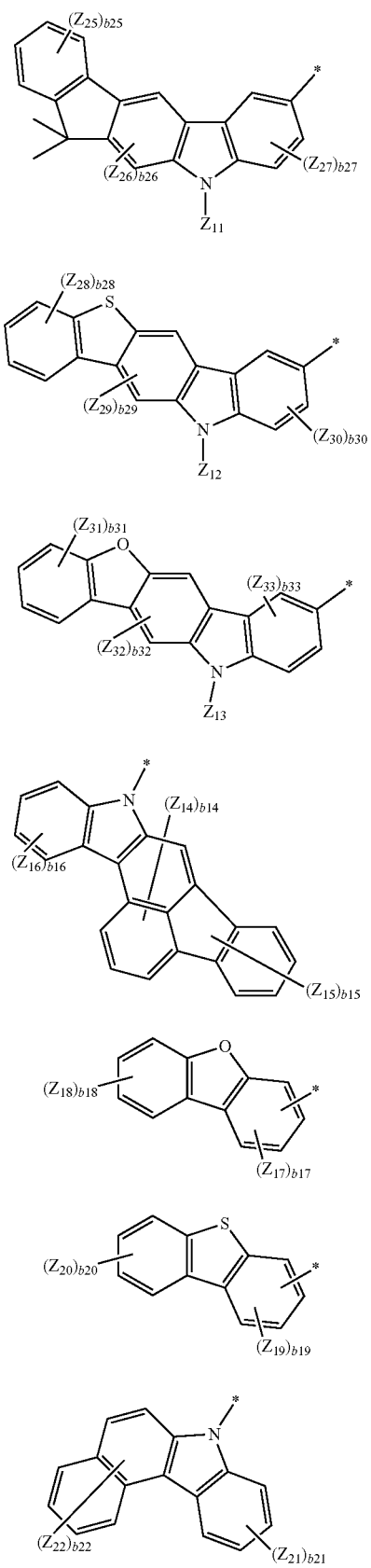

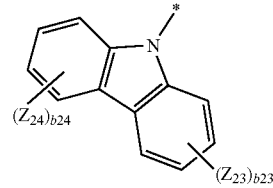

wherein, in Formulae 6-1 to 6-13, $Z_1$ to $Z_{33}$ are each independently selected from:

a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, and a $C_1$-$C_{10}$ alkyl group;

a $C_1$-$C_{10}$ alkyl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a $C_6$-$C_{16}$ aryl group, and a $C_2$-$C_{16}$ heteroaryl group; and a $C_6$-$C_{16}$ aryl group and a $C_2$-$C_{16}$ heteroaryl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_6$-$C_{16}$ aryl group, and a $C_2$-$C_{16}$ heteroaryl group, b1 to b6, b8, b10, and b14 to b33 are each independently an integer of 0 to 2, and

* indicates a binding site to one of $L_1$ to $L_6$.

9. The heterocyclic compound as claimed in claim 1, wherein at least one of m1 to m6 is 1, 2, 3, 4, or 5, and $R_1$ to $R_6$ in Formula 1 and Formulae a to f are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a methyl group, an ethyl group, an n-propyl group, an iso-propyl group, an n-butyl group, a sec-butyl group, an iso-butyl group, a tert-butyl group, and groups represented by Formulae 7-1 to 7-15 below:

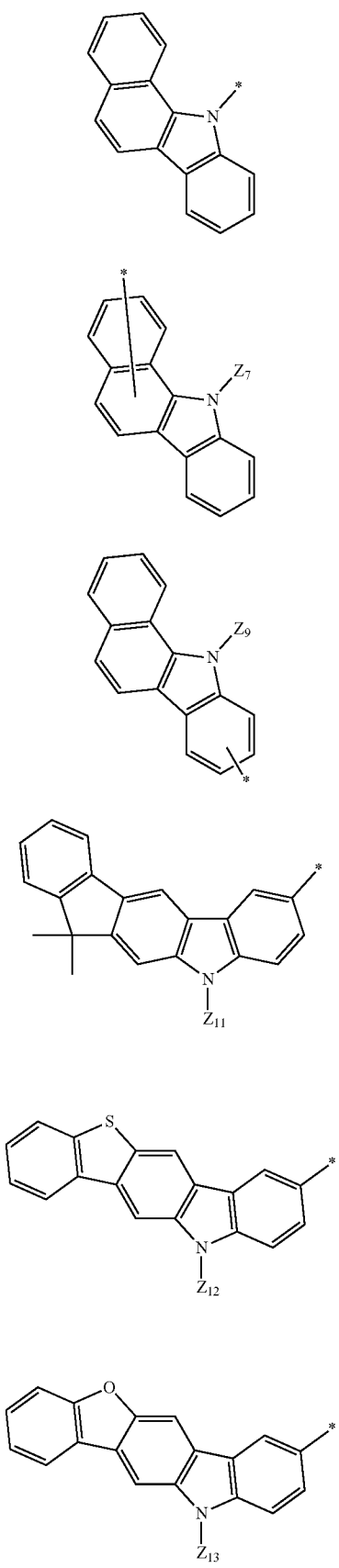

wherein, in Formulae 7-1 to 7-15,
Z₇, Z₉, and Z₁₁ to Z₁₃ are each independently selected from a deuterium atom, a halogen atom, a hydroxyl group, a cyano group, a nitro group, a methyl group, an ethyl group, a phenyl group, a naphthyl group, and an anthracenyl group, and
* indicates a binding site to one of L₁ to L₆.

10. The heterocyclic compound as claimed in claim 1, wherein R₇ to R₁₀ in Formula 1 and Formulae a to f are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a methyl group, an ethyl group, an n-propyl group, an iso-propyl group, an n-butyl group, a sec-butyl group, an iso-butyl group, and a tert-butyl group.

11. The heterocyclic compound as claimed in claim 1, wherein $R_7$ to $R_{10}$ in Formula 1 and Formulae a to f are hydrogen atoms.

12. The heterocyclic compound as claimed in claim 1, wherein o1 to o3 in Formula 1 and Formulae a to f are each independently an integer of 0 or 1 provided that at least one of o1 to o3 is 1 or provided that X is

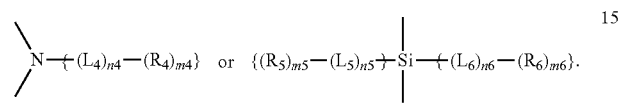

13. The heterocyclic compound as claimed in claim 1, wherein the heterocyclic compound of Formula 1 is one selected from compounds represented by Formulae A to C:

<Formula A>

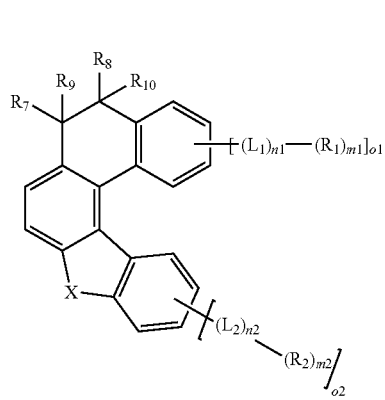

<Formula B>

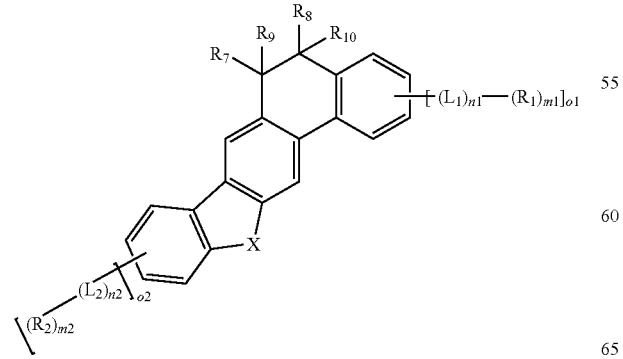

<Formula C>

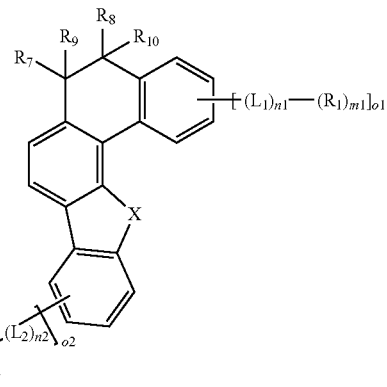

wherein, in Formulae A to C,

X is —O—, —S—,

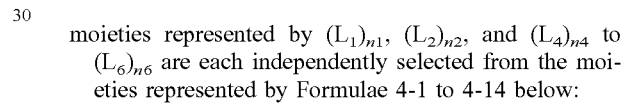

moieties represented by $(L_1)_{n1}$, $(L_2)_{n2}$, and $(L_4)_{n4}$ to $(L_6)_{n6}$ are each independently selected from the moieties represented by Formulae 4-1 to 4-14 below:

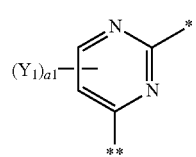

4-1

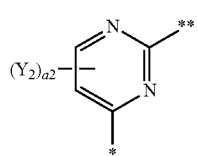

4-2

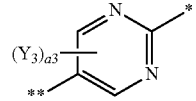

4-3

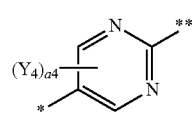

4-4

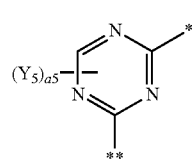

4-5

4-6
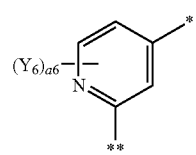

4-7
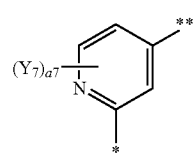

4-8
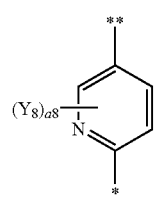

4-9
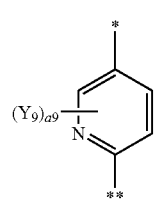

4-10
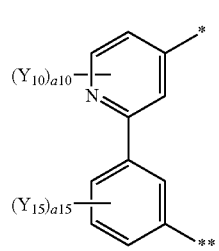

4-11
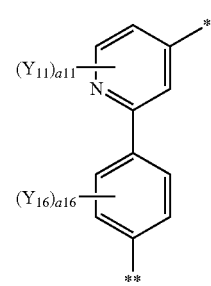

4-12
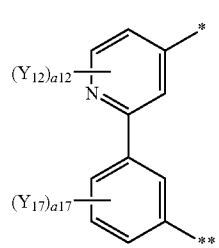
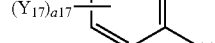

4-13
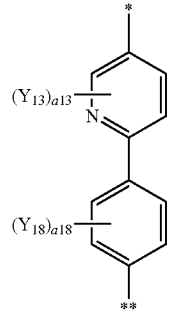

4-14
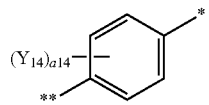

wherein, in Formulae 4-1 to 4-14, $Y_1$ to $Y_{18}$ are each independently selected from:

a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, and a $C_1$-$C_{10}$ alkyl group;

a $C_1$-$C_{10}$ alkyl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a $C_6$-$C_{16}$ aryl group and a $C_2$-$C_{16}$ heteroaryl group; and a $C_6$-$C_{16}$ aryl group and a $C_2$-$C_{16}$ heteroaryl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_6$-$C_{16}$ aryl group, and a $C_2$-$C_{16}$ heteroaryl group, a1 to a18 are each independently an integer of 0 to 2,

* indicates a binding site to a ring, and

** indicates a binding site to one of $R_1$, $R_2$, and $R_4$ to $R_6$;

$R_1$, $R_2$, and $R_4$ to $R_6$ in Formulae A to C are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{10}$ alkyl group, a substituted or unsubstituted $C_1$-$C_{10}$ alkoxy group, and groups represented by Formulae 6-1 to 6-13 below:

6-1
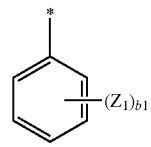

-continued

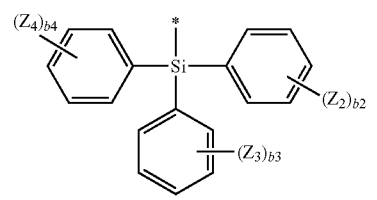
6-2

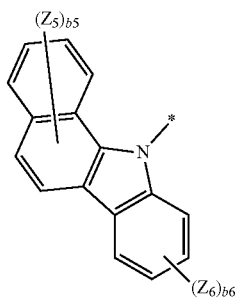
6-3

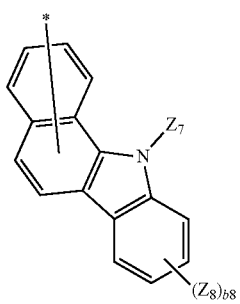
6-4

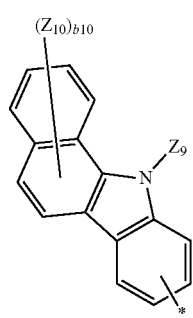
6-5

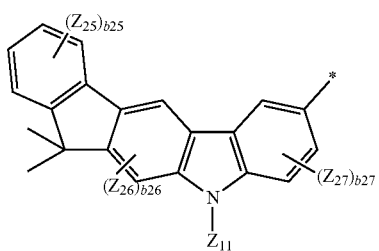
6-6

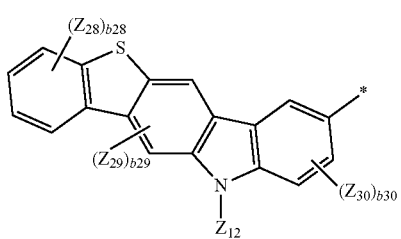
6-7

-continued

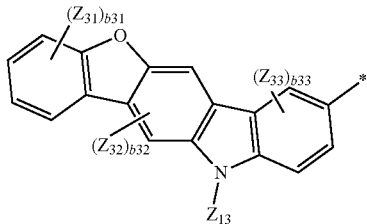
6-8

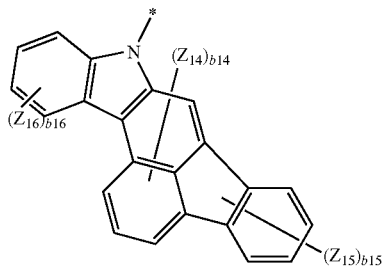
6-9

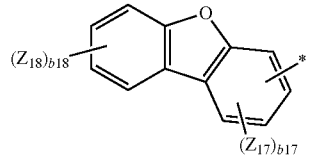
6-10

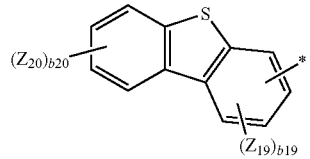
6-11

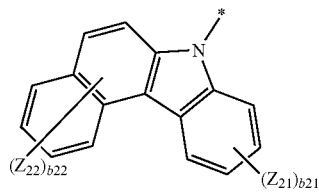
6-12

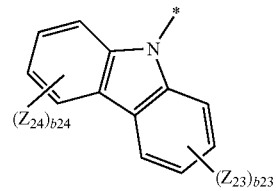
6-13 wherein, in Formulae 6-1 to 6-13,
$Z_1$ to $Z_{33}$ are each independently selected from:
a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, and a $C_1$-$C_{10}$ alkyl group;
a $C_1$-$C_{10}$ alkyl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a $C_6$-$C_{16}$ aryl group and a $C_2$-$C_{16}$ heteroaryl group; and a $C_6$-$C_{16}$ aryl group and a $C_2$-$C_{16}$ heteroaryl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_6$-$C_{16}$ aryl group, and a $C_2$-$C_{16}$ heteroaryl group, b1 to b6, b8, b10, and b14 to b33 are each independently an integer of 0 to 2,

* indicates a binding site to one of $L_1$, $L_2$, and $L_4$ to $L_6$, and m1, m2, and m4 to m6 are each 1;

$R_7$ to $R_{10}$ in Formulae A to C are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a methyl group, an ethyl group, an n-propyl group, an iso-propyl group, an n-butyl group, a sec-butyl group, an iso-butyl group, and a tert-butyl group; and o1 and o2 in Formulae A to C are each independently an integer of 0 or 1 provided that at least one of o1 or o2 is 1 or provided that X is

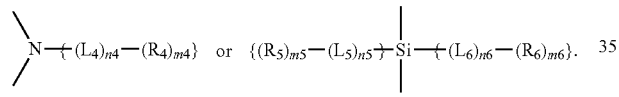

14. The heterocyclic compound as claimed in claim 1, wherein the heterocyclic compound of Formula 1 is selected from compounds represented by Formulae 1a to 1c, 2a to 2c, and 3a to 3c:

<Formula 1a>

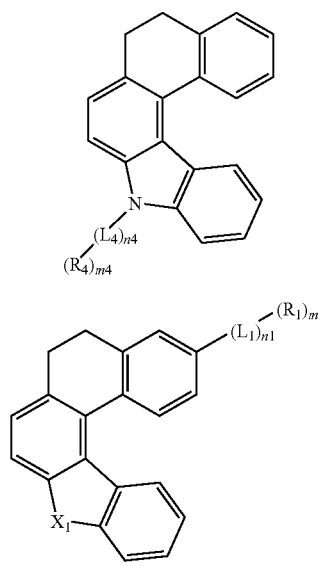

<Formula 1b>

<Formula 1c>

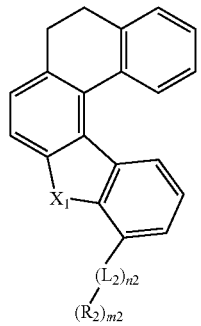

<Formula 2a>

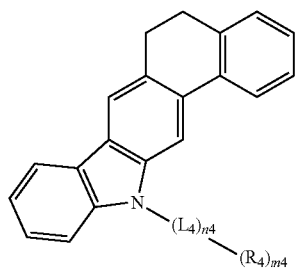

<Formula 2b>

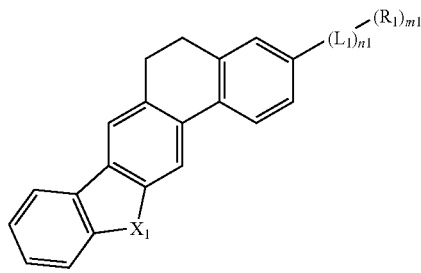

<Formula 2c>

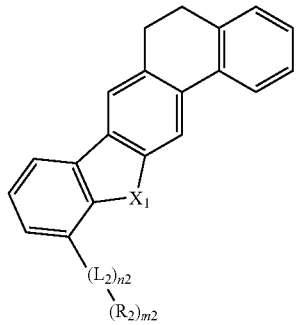

<Formula 3a>

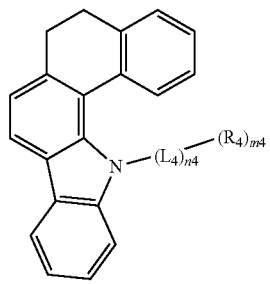

<Formula 3b>
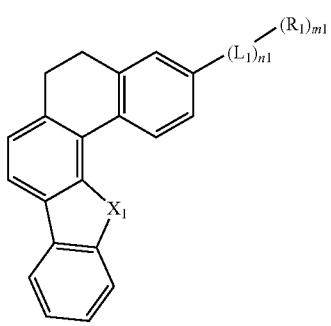
<Formula 3c>
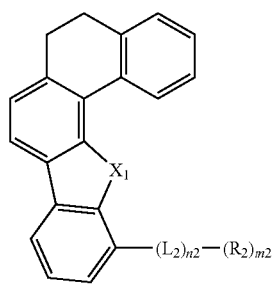
wherein, in Formulae 1a to 1c, 2a to 2c, and 3a to 3c,
$X_1$ and $X_2$ are each independently —O— or —S—;
moieties represented by $(L_1)_{n1}$, $(L_2)_{n2}$, and $(L_4)_{n4}$ are each independently selected from moieties represented by Formulae 4-1 to 4-14 below:
4-1
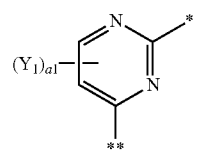
4-2
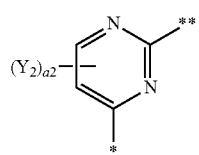
4-3
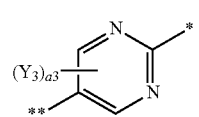
4-4
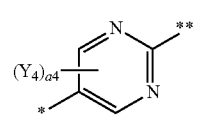
4-5
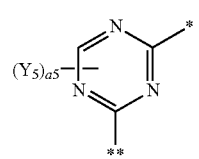
4-6
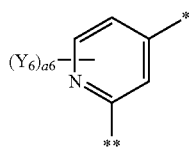
4-7
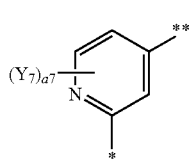
4-8
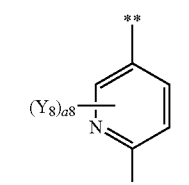
4-9
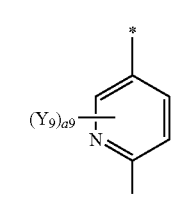
4-10
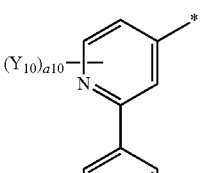
4-11
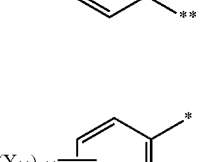
4-12
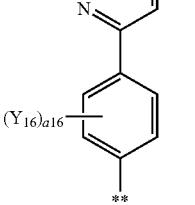
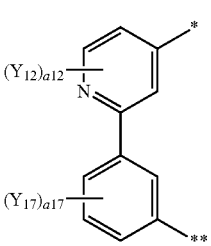

4-13

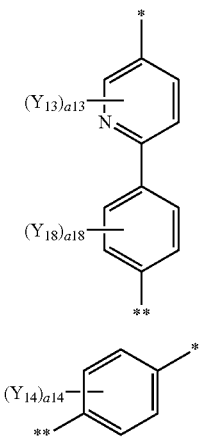

4-14 wherein, in Formulae 4-1 to 4-14,
$Y_1$ to $Y_{18}$ are each independently selected from:
a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, and a $C_1$-$C_{10}$ alkyl group;
a $C_1$-$C_{10}$ alkyl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;
a $C_6$-$C_{16}$ aryl group and a $C_2$-$C_{16}$ heteroaryl group; and
a $C_6$-$C_{16}$ aryl group and a $C_2$-$C_{16}$ heteroaryl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_6$-$C_{16}$ aryl group, and a $C_2$-$C_{16}$ heteroaryl group,
a1 to a18 are each independently an integer of 0 to 2,
* indicates a binding site to a ring, and
** indicates a binding site to one of $R_1$, $R_2$, and $R_4$;
$R_1$, $R_2$, and $R_4$ in Formulae 1a to 1c, 2a to 2c, and 3a to 3c are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{10}$ alkyl group, a substituted or unsubstituted $C_1$-$C_{10}$ alkoxy group, and groups represented by Formulae 6-1 to 6-13 below:

6-1

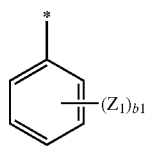

6-2

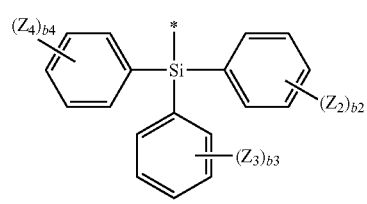

6-3

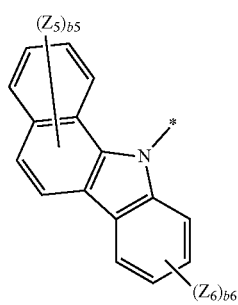

6-4

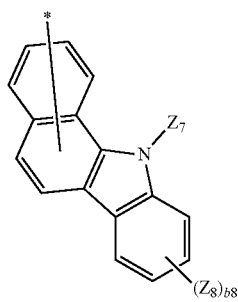

6-5

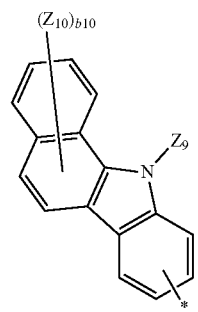

6-6

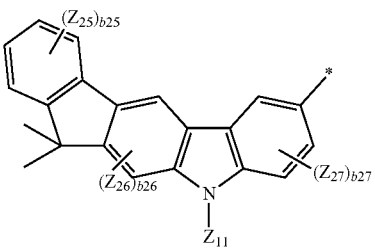

6-7

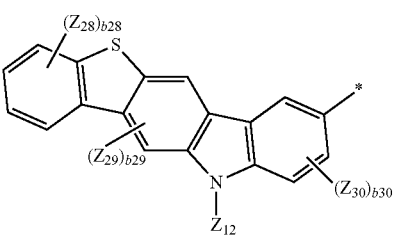

-continued

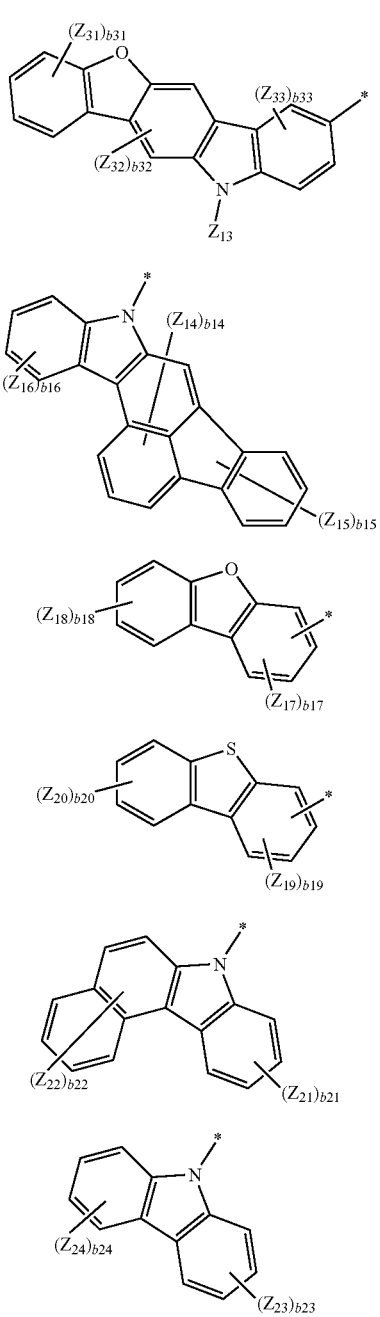

wherein, in Formulae 6-1 to 6-13,
$Z_1$ to $Z_{33}$ are each independently selected from:
a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, and a $C_1$-$C_{10}$ alkyl group;
a $C_1$-$C_{10}$ alkyl group substituted with at least one of a deuterium atom, a halogen atom a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;
a $C_6$-$C_{16}$ aryl group and a $C_2$-$C_{16}$ heteroaryl group; and
a $C_6$-$C_{16}$ aryl group and a $C_2$-$C_{16}$ heteroaryl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_6$-$C_{16}$ aryl group, and a $C_2$-$C_{16}$ heteroaryl group, b1 to b6, b8, b10, and b14 to b33 are each independently an integer of 0 to 2, \* indicates a binding site to one of $L_1$, $L_2$, and $L_4$; and m1, m2, and m4 in Formulae 1a to 1c, 2a to 2c, and 3a to 3c are each 1.

15. The heterocyclic compound as claimed in claim 1, wherein the heterocyclic compound of Formula 1 is selected from compounds represented by Formulae 1a to 1c, 2a to 2c, and 3a to 3c below:

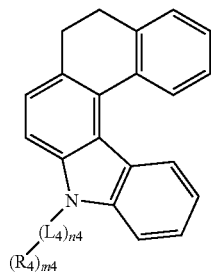
<Formula 1a>

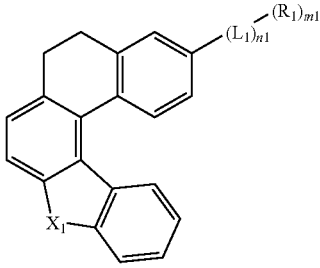
<Formula 1b>

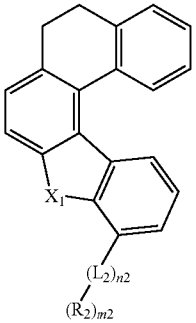
<Formula 1c>

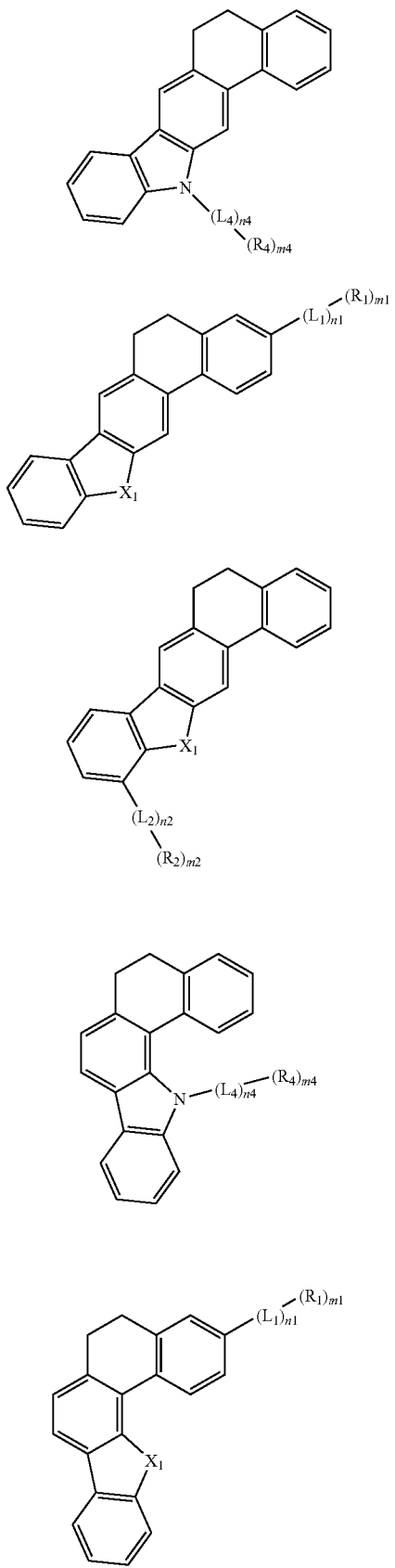
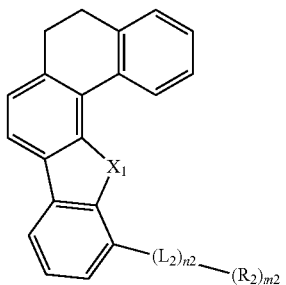
wherein, in Formulae 1a to 1c, 2a to 2c, and 3a to 3c,
$X_1$ and $X_2$ are each independently —O— or —S—;
moieties represented by $(L_1)_{n1}$, $(L_2)_{n2}$, and $(L_4)_{n4}$ are each independently selected from moieties represented by Formulae 5-1 to 5-14:
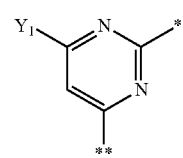
5-1
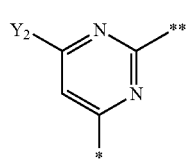
5-2
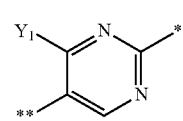
5-3
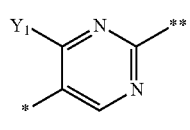
5-4
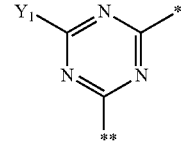
5-5
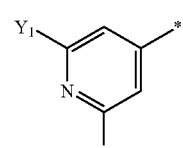
5-6
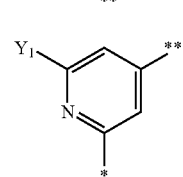
5-7 wherein, in Formulae 5-1 to 5-14, $Y_1$ to $Y_{13}$ are each independently selected from a deuterium atom, a halogen atom, a hydroxyl group, a cyano group, a nitro group, a methyl group, an ethyl group, a phenyl group, a naphthyl group, and an anthracenyl group, \* indicates a binding site to ring, \*\* indicates a binding site to one of $R_1$, $R_2$, and $R_4$; and $R_1$, $R_2$, and $R_4$ in Formulae 1a to 1c, 2a to 2c, and 3a to 3c are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a methyl group, an ethyl group, an n-propyl group, an iso-propyl group, an n-butyl group, a sec-butyl group, an iso-butyl group, a tert-butyl group, and groups represented by Formulae 7-1 to 7-15:

135
-continued 7-6
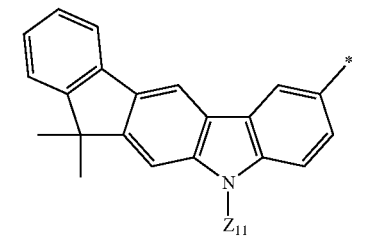

7-7
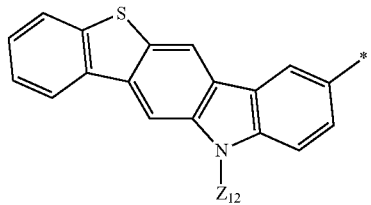

7-8
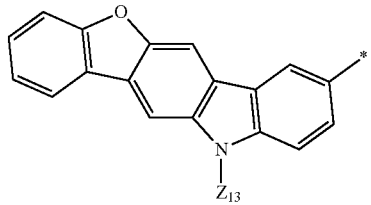

7-9
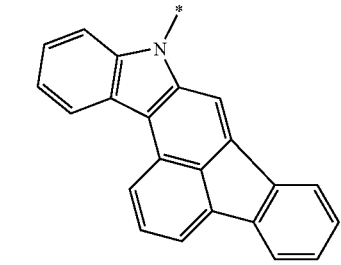

7-10
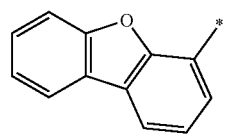

7-11
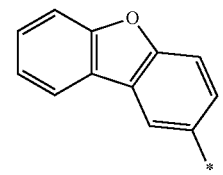

7-12
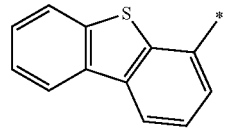

7-13
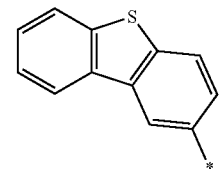

136
-continued 7-14
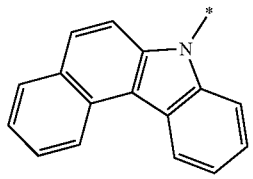

7-15
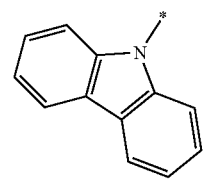

wherein, in Formulae 7-1 to 7-15, $Z_7$, $Z_9$, and $Z_{11}$ to $Z_{13}$ are each independently selected from a deuterium atom, a halogen atom, a hydroxyl group, a cyano group, a nitro group, a methyl group, an ethyl group, a phenyl group, a naphthyl group, and an anthracenyl group, and

* indicates a binding site to one of $L_1$, $L_2$, and $L_4$.

16. The heterocyclic compound as claimed in claim 1, wherein the heterocyclic compound of Formula 1 is one selected from Compounds 1 to 68 below:

1
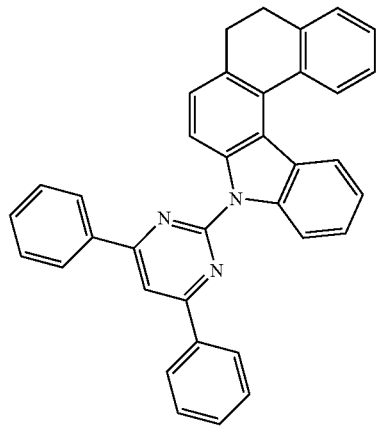

2
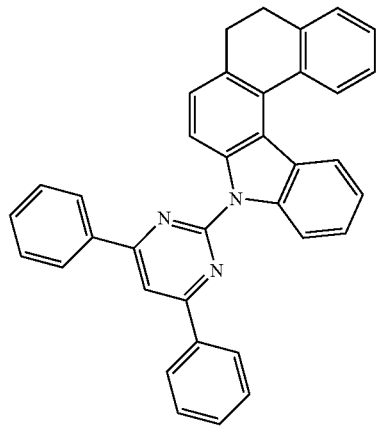

137
-continued
3
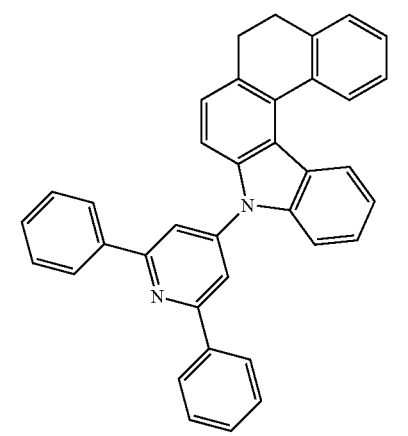
4
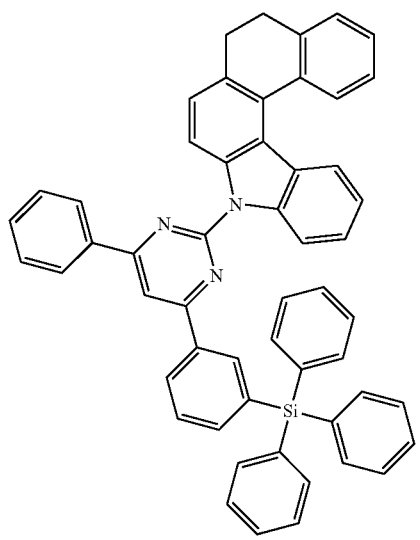
5
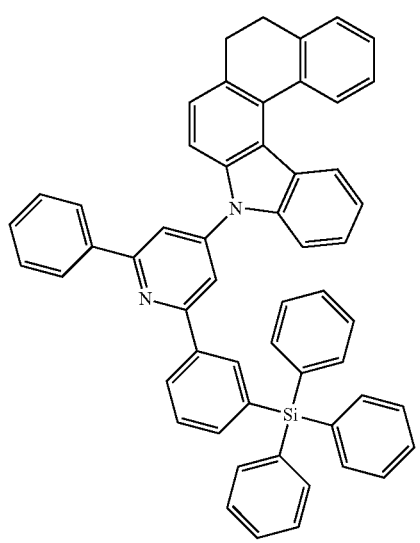
138
-continued
6
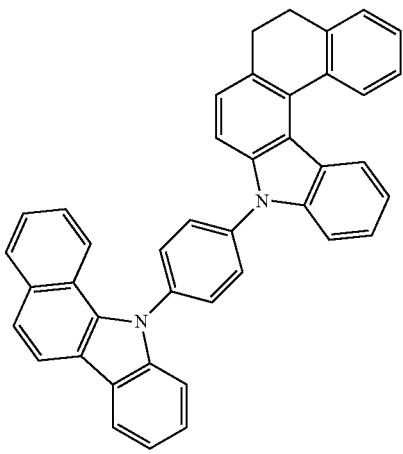
7
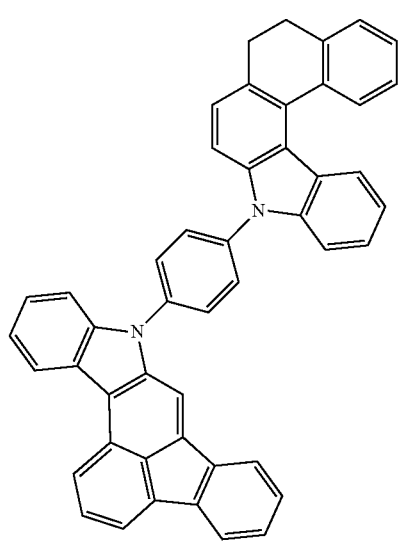
8
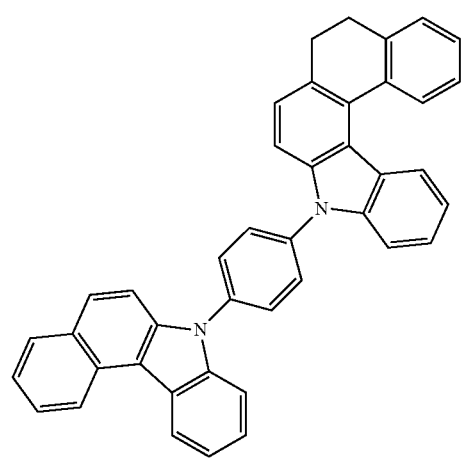

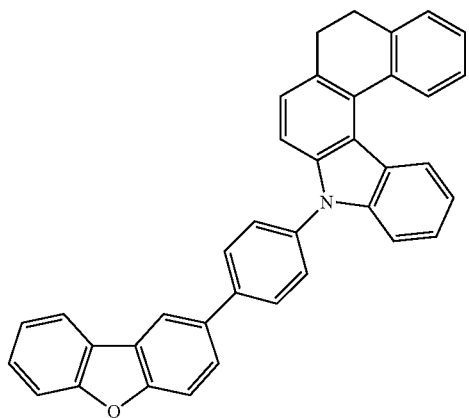
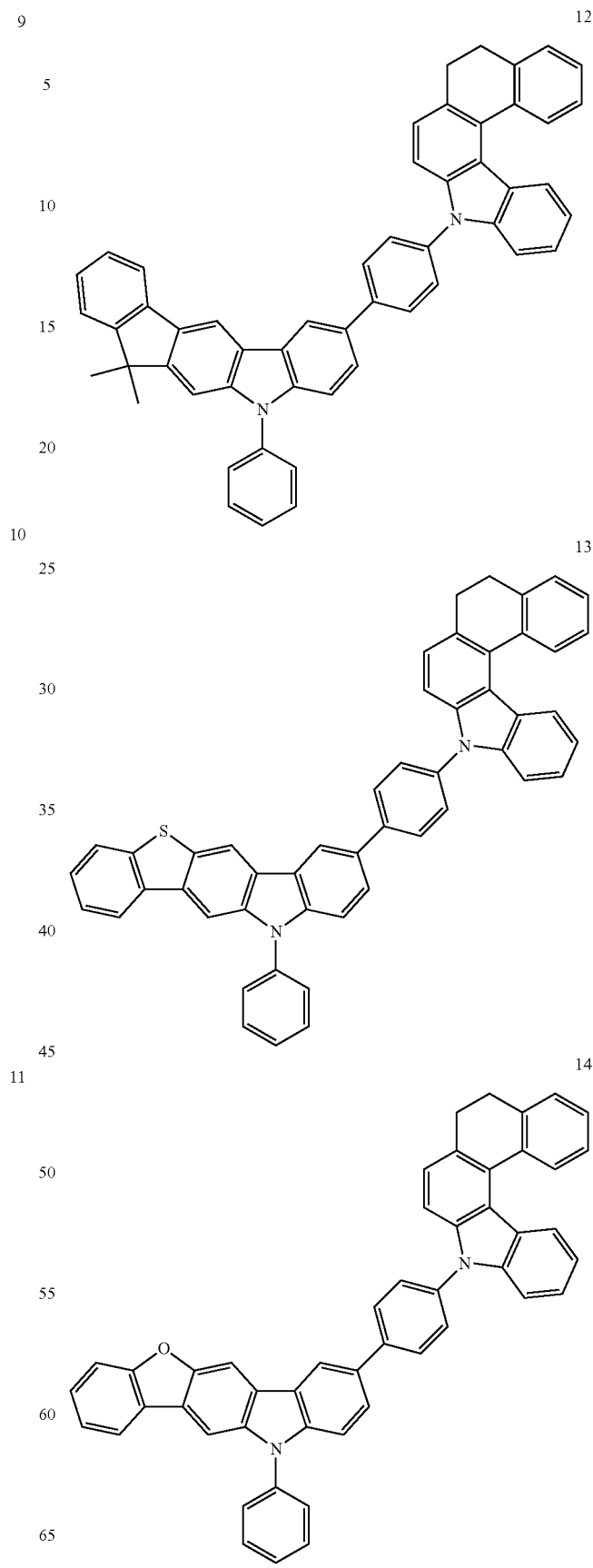

15
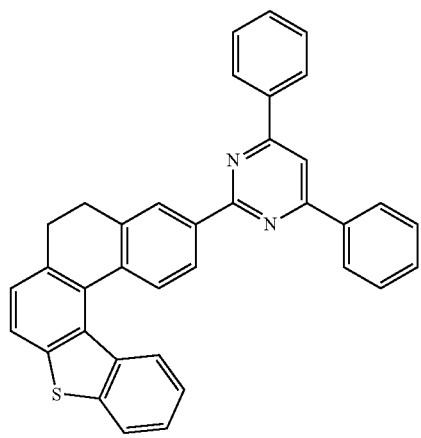
16
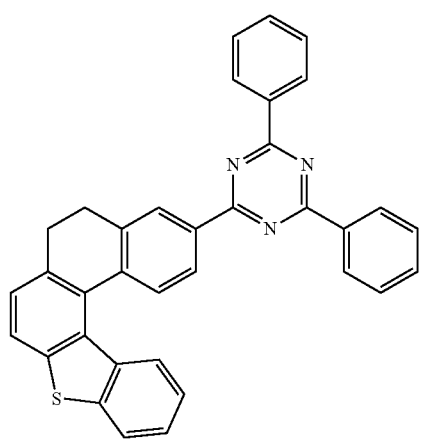
17
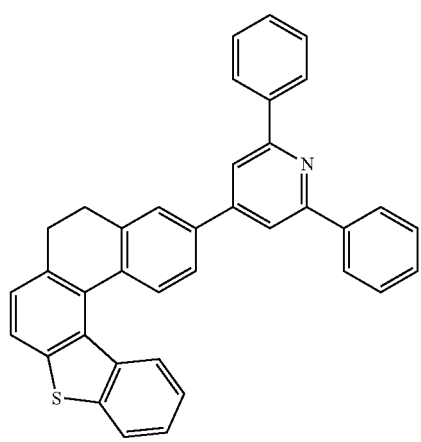
18
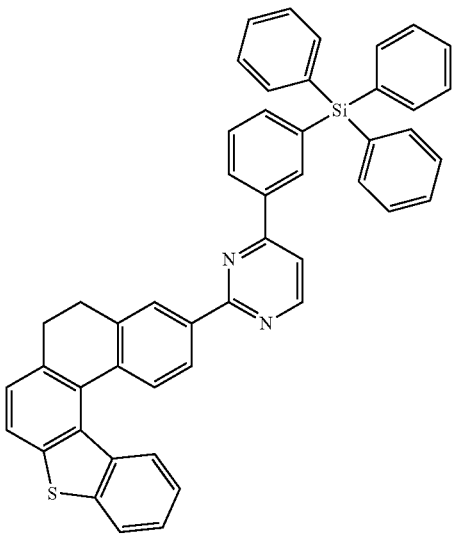
19
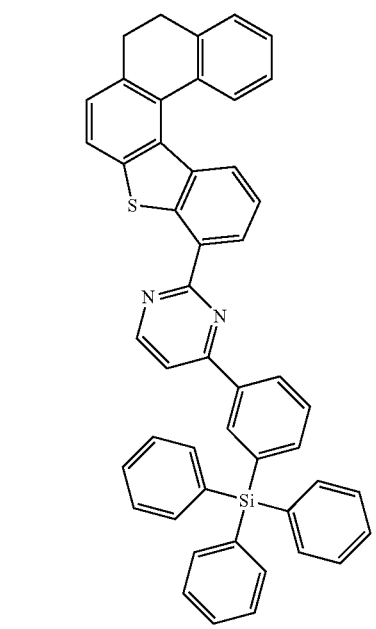
20
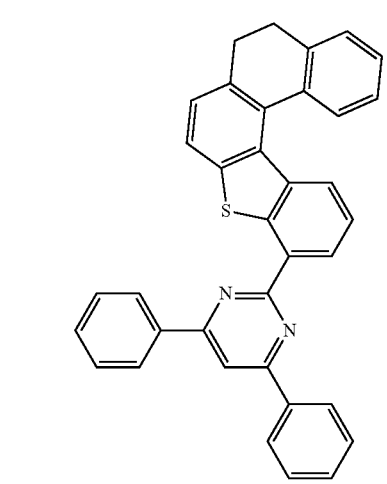

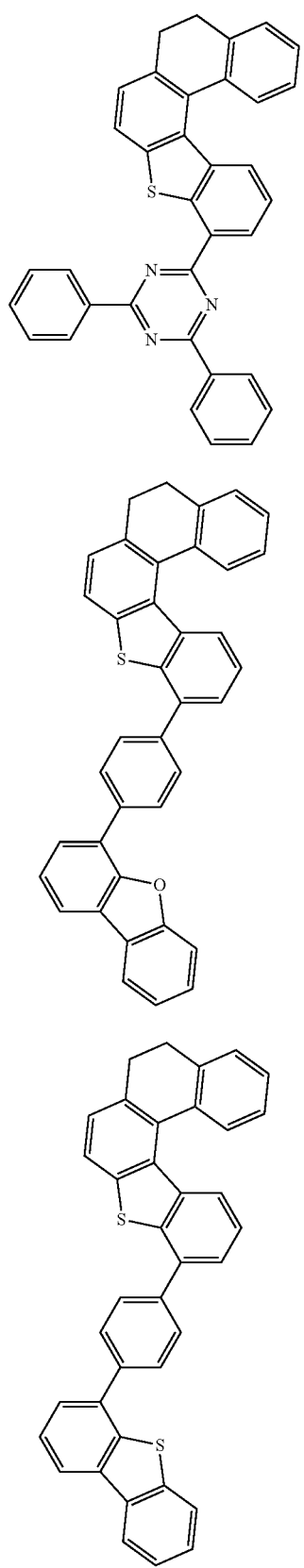
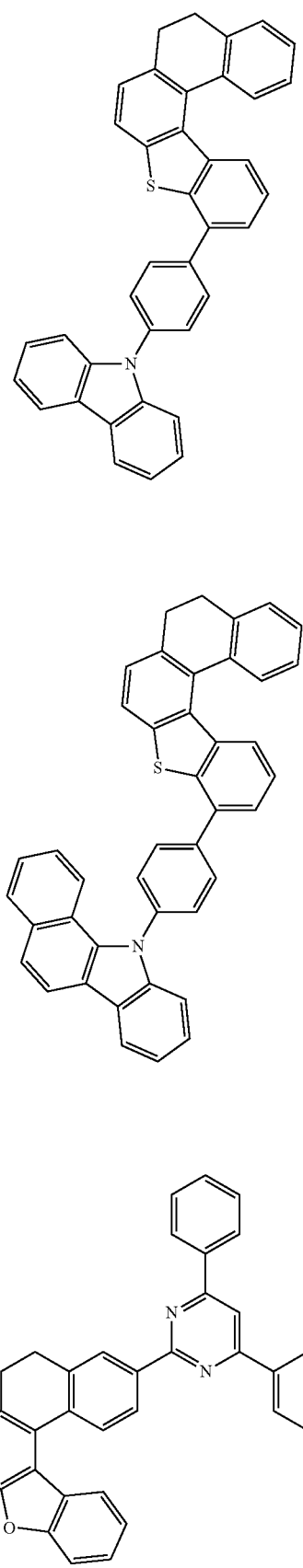

-continued
27
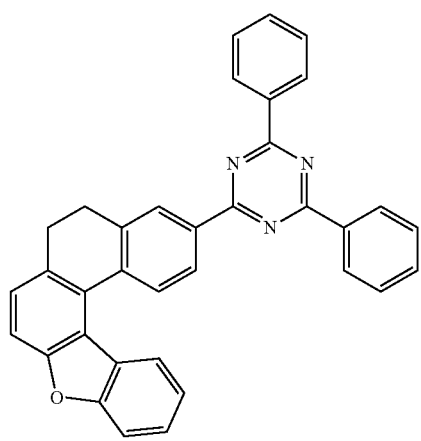
28
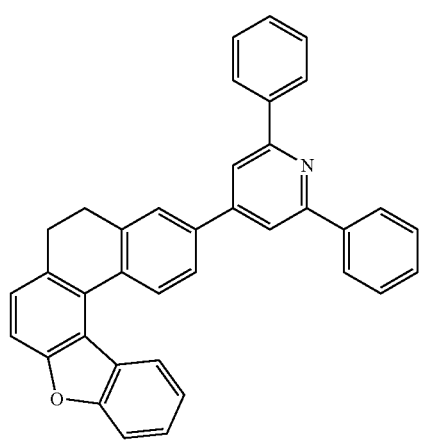
29
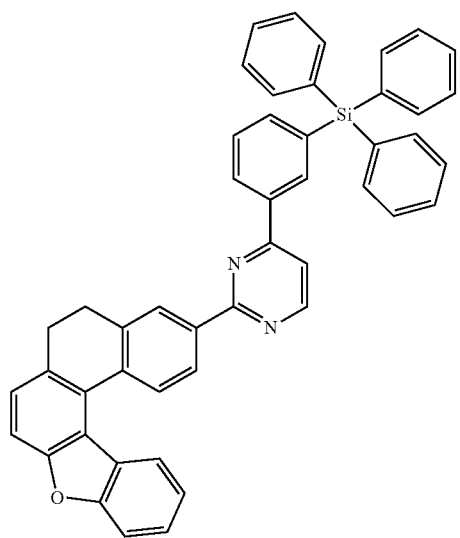
-continued
30
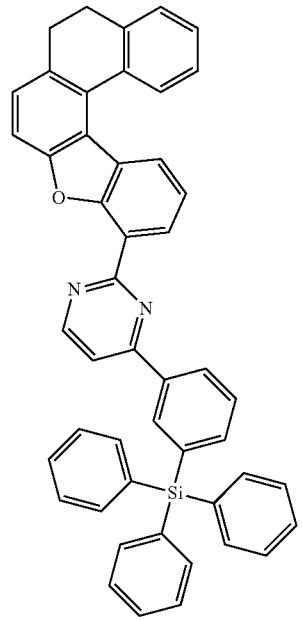
31
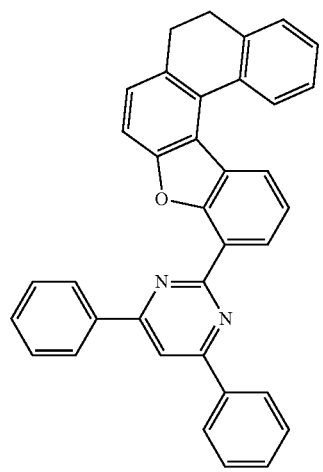
32
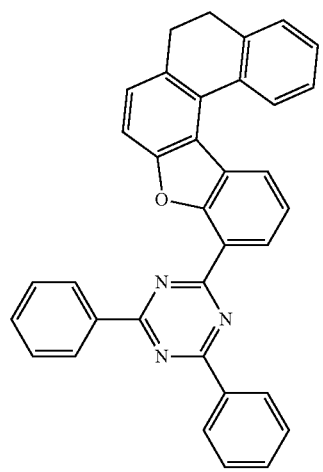

33
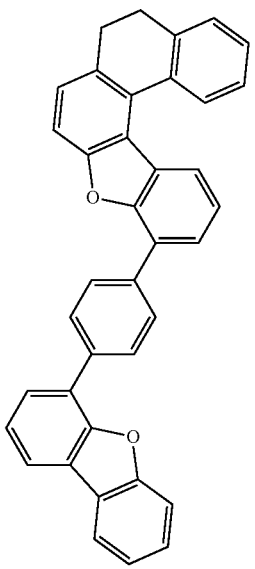
34
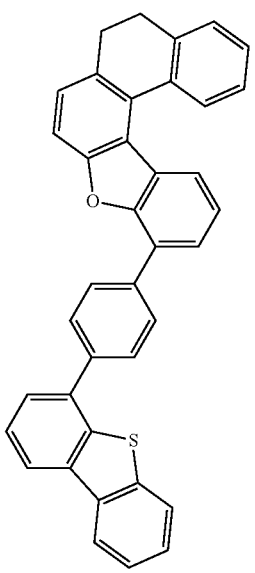
35
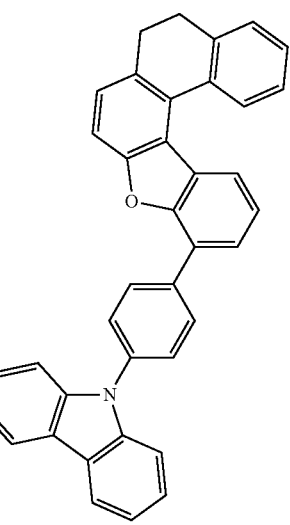
36
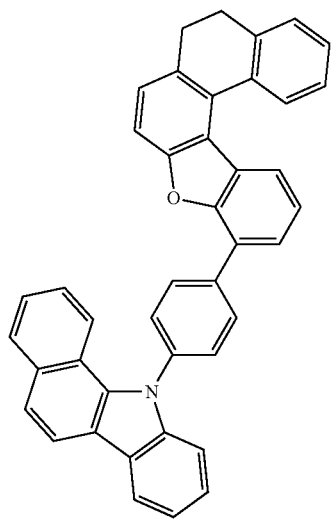
37
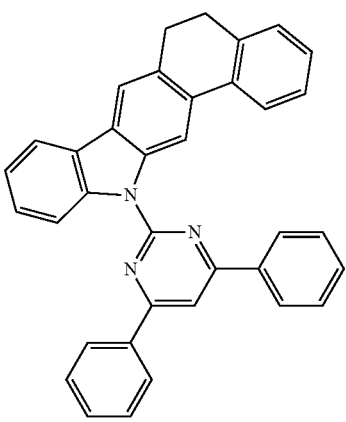
38
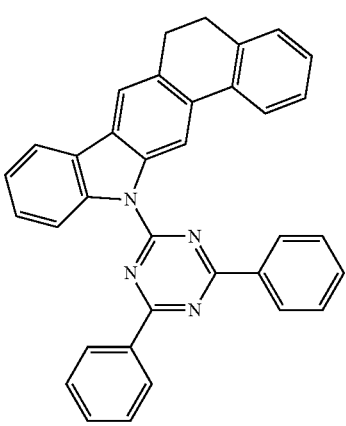

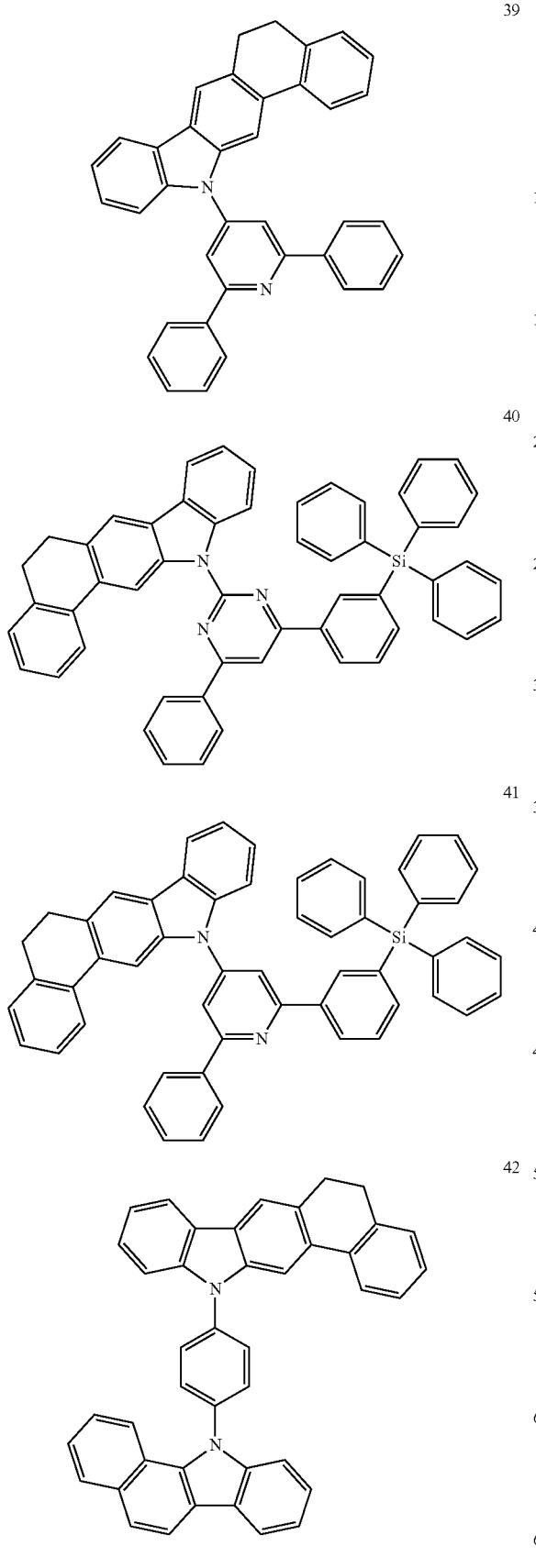

47
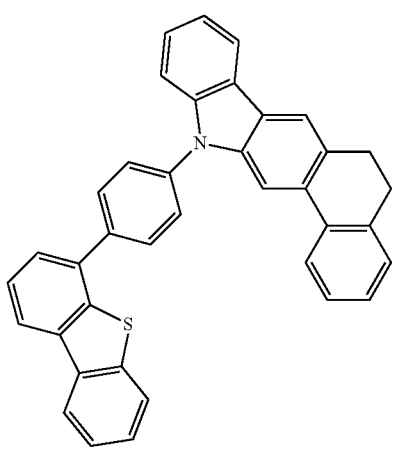
50
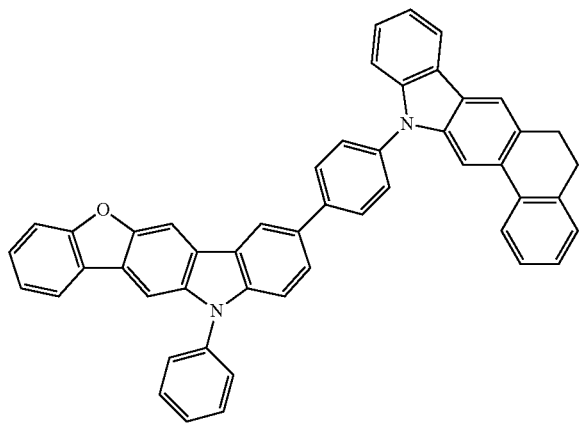
48
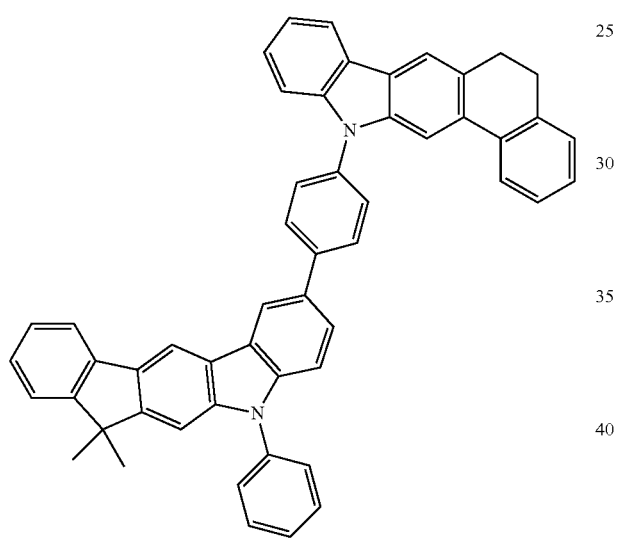
51
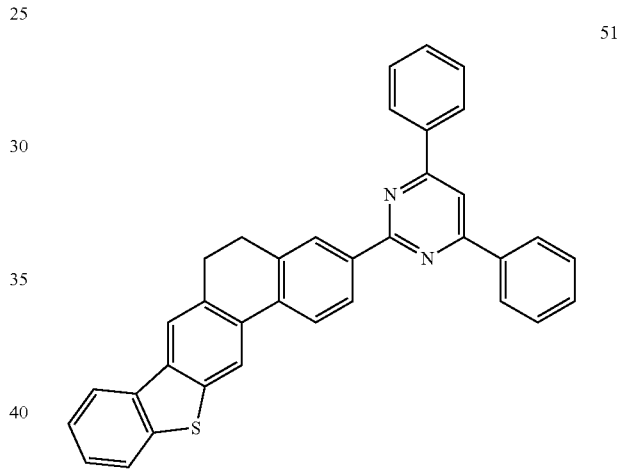
49
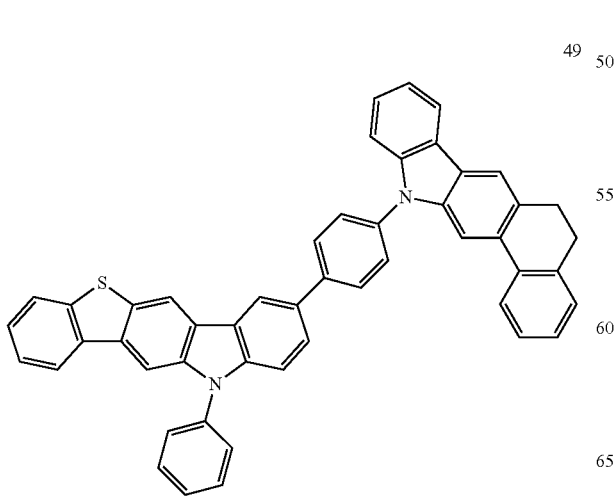
52
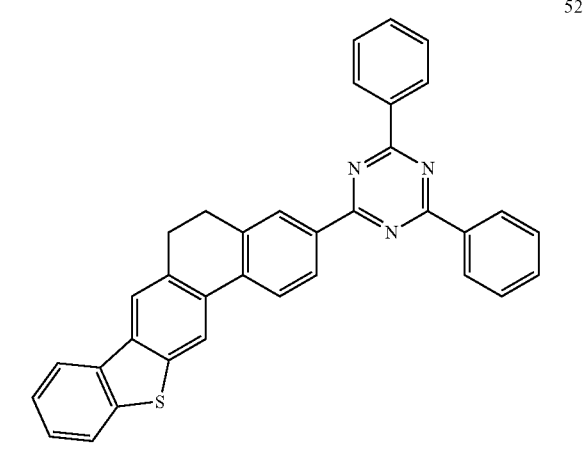

153
-continued
54
53
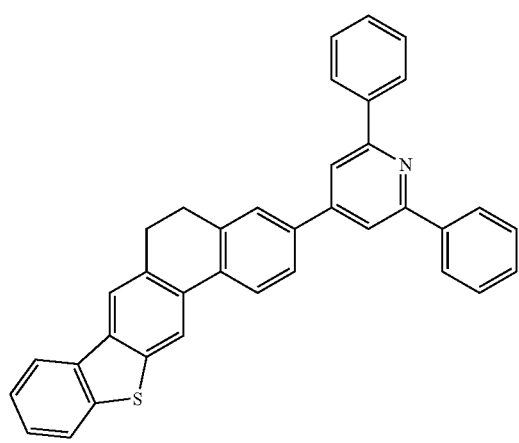
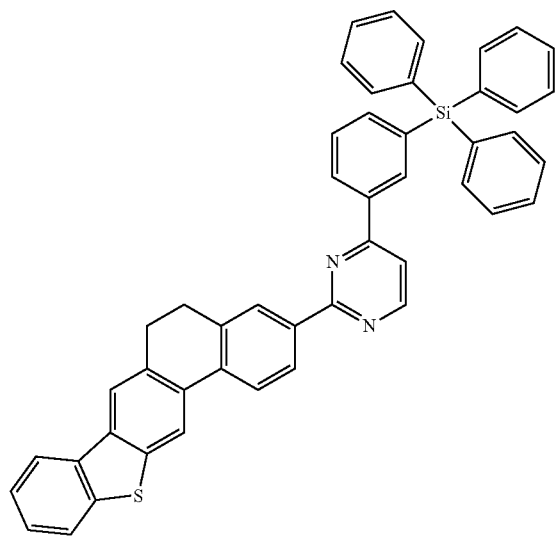
154
-continued
56
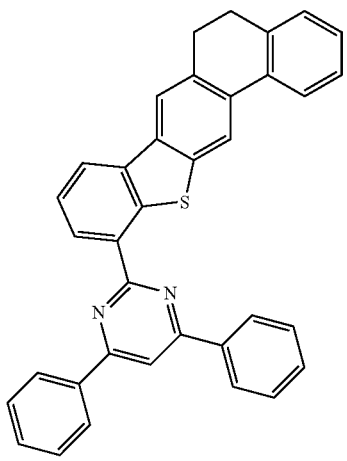
57
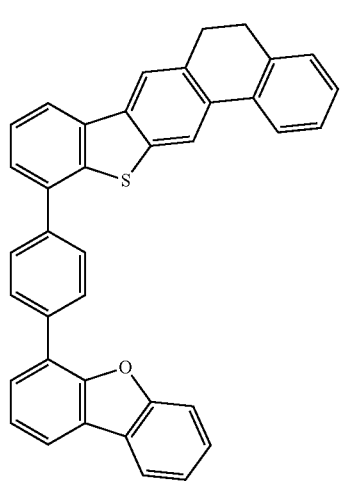
58
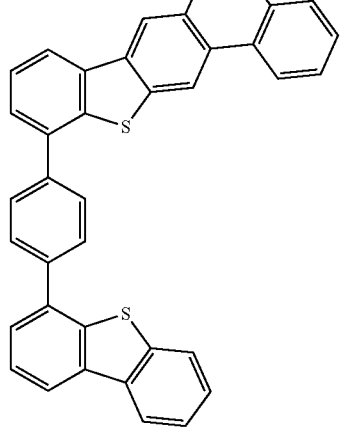

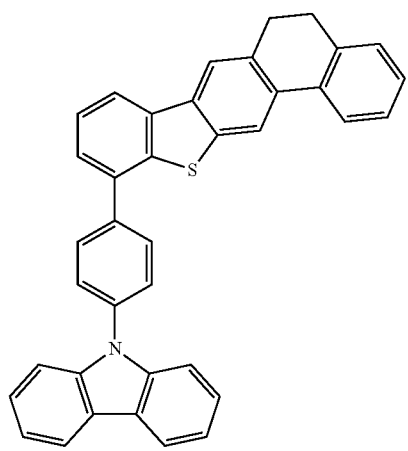
59
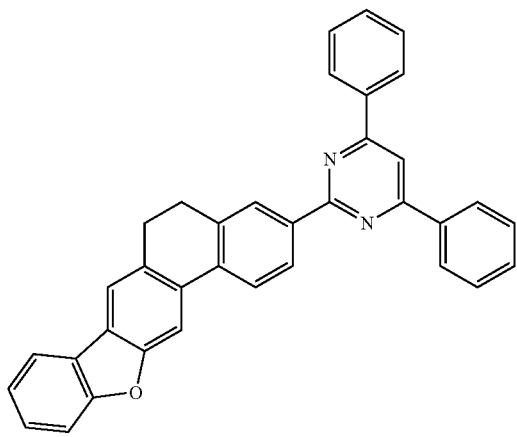
60
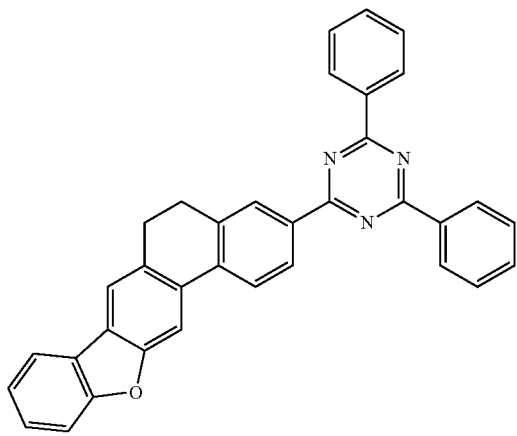
61
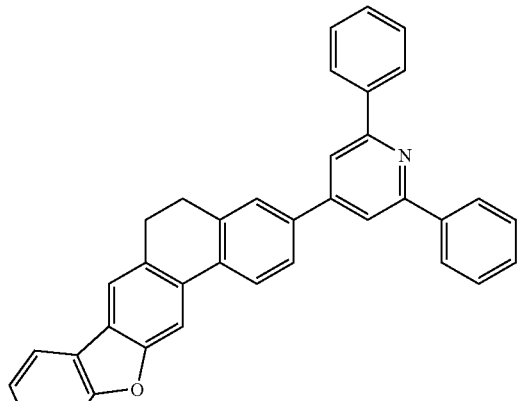
62
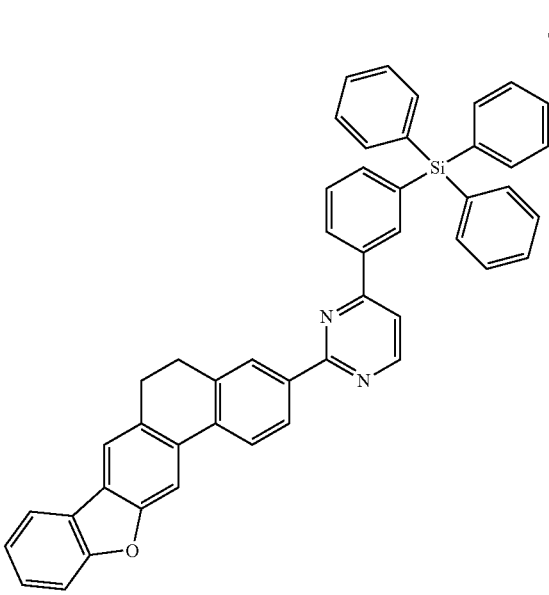
63
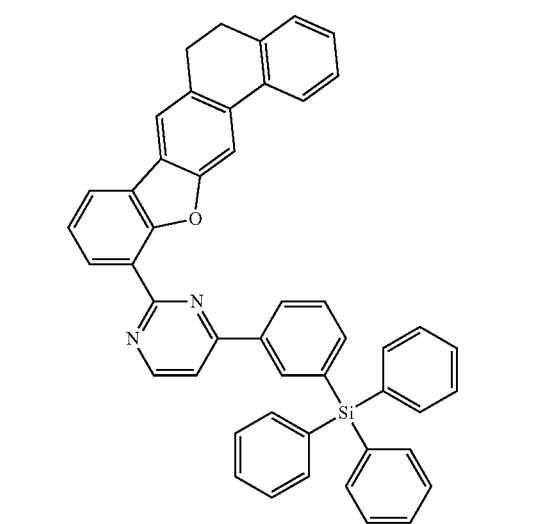
64

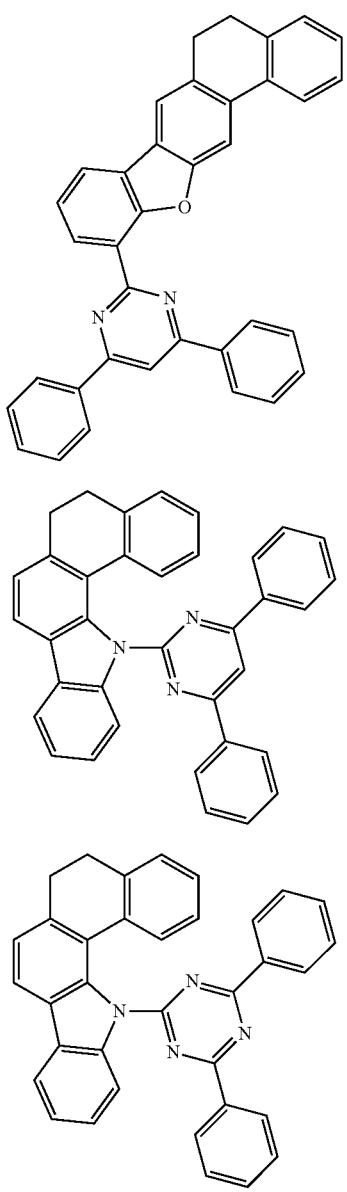

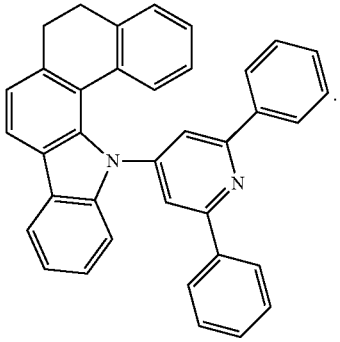

17. An organic light-emitting device comprising:
   a first electrode;
   a second electrode disposed opposite to the first electrode; and
   an organic layer between the first electrode and the second electrode, the organic layer including an emission layer,
   wherein the organic layer includes a heterocyclic compound as claimed in claim 1.

18. The organic light-emitting device as claimed in claim 17, wherein the organic layer includes:
   a hole transport region between the first electrode and the emission layer, the hole transport region including at least one of a hole injection layer, a hole transport layer, a functional layer having both hole injection and hole transport capabilities, a buffer layer, and an electron blocking layer, and
   an electron transport region between the emission layer and the second electrode, the electron transport region including at least one of a hole blocking layer, an electron transport layer, and an electron injection layer.

19. The organic light-emitting device as claimed in claim 17, wherein the heterocyclic compound is present in the emission layer.

20. The organic light-emitting device as claimed in claim 19, wherein the emission layer further includes a dopant, and the heterocyclic compound in the emission layer is a host.

* * * * *